(12) United States Patent
Langhammer et al.

(10) Patent No.: US 7,119,576 B1
(45) Date of Patent: **\*Oct. 10, 2006**

(54) DEVICES AND METHODS WITH PROGRAMMABLE LOGIC AND DIGITAL SIGNAL PROCESSING REGIONS

(75) Inventors: Martin Langhammer, Poole (GB); Gregory Starr, San Jose, CA (US); Chiao Kai Hwang, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/871,868

(22) Filed: Jun. 18, 2004

Related U.S. Application Data

(63) Continuation of application No. 10/354,440, filed on Jan. 28, 2003, now Pat. No. 6,771,094, which is a continuation of application No. 09/955,645, filed on Sep. 18, 2001, now Pat. No. 6,538,470.

(60) Provisional application No. 60/233,387, filed on Sep. 18, 2000, provisional application No. 60/233,389, filed on Sep. 18, 2000.

(51) Int. Cl.
*H03K 19/0177* (2006.01)

(52) U.S. Cl. .......................... 326/41; 326/38; 708/505; 708/625; 708/650

(58) Field of Classification Search ............ 326/38–41; 708/505, 625–632, 650
See application file for complete search history.

(56) References Cited

U.S. PATENT DOCUMENTS

| | | | |
|---|---|---|---|
| 3,473,160 A | 10/1969 | Wahlstrom | .................... 326/41 |
| 4,156,927 A | 5/1979 | McElroy et al. | |
| 4,179,746 A | 12/1979 | Tubbs | |
| 4,212,076 A | 7/1980 | Conners | |
| 4,215,406 A | 7/1980 | Gomola et al. | |
| 4,215,407 A | 7/1980 | Gomola et al. | |
| 4,422,155 A | 12/1983 | Amir et al. | |
| 4,521,907 A | 6/1985 | Amir et al. | |
| 4,597,053 A | 6/1986 | Chamberlin | |
| 4,623,961 A | 11/1986 | Mackiewicz | |
| 4,682,302 A | 7/1987 | Williams | |

(Continued)

FOREIGN PATENT DOCUMENTS

EP 158430 10/1985

(Continued)

OTHER PUBLICATIONS

"Implementing Multipliers in FLEX 10K EABs", *Altera*, Mar. 1996.

(Continued)

*Primary Examiner*—Vibol Tan
(74) *Attorney, Agent, or Firm*—Fish & Neave IP Group of Ropes & Gray LLP; Jeffrey H. Ingerman

(57) ABSTRACT

A programmable logic integrated circuit device ("PLD") includes programmable logic and a dedicated (i.e., at least partly hard-wired) digital signal processing region for performing or at least helping to perform digital signal processing tasks that are unduly inefficient to implement in the more general-purpose programmable logic and/or that, if implemented in the programmable logic, would operate unacceptably or at least undesirably slowly. The digital signal processing region may include multiple digital signal processing stages. The digital signal processing region may include a multiplier stage and one ore more stages that can operate in combination with the multiplier stage. The digital signal processing region has a plurality of modes such as for providing multiply-and-accumulate operation, multiply-and-add operation, etc.

35 Claims, 24 Drawing Sheets

U.S. PATENT DOCUMENTS

| | | | |
|---|---|---|---|
| 4,718,057 A | 1/1988 | Venkitakrishnan et al. | |
| 4,727,508 A | 2/1988 | Williams | |
| 4,791,590 A * | 12/1988 | Ku et al. | 708/404 |
| 4,823,295 A | 4/1989 | Mader | |
| 4,871,930 A | 10/1989 | Wong et al. | 326/39 |
| 5,122,685 A | 6/1992 | Chan et al. | 326/41 |
| 5,128,559 A | 7/1992 | Steele | 326/38 |
| 5,175,702 A | 12/1992 | Beraud et al. | |
| 5,208,491 A | 5/1993 | Ebeling et al. | |
| RE34,363 E | 8/1993 | Freeman | |
| 5,267,187 A | 11/1993 | Hsieh et al. | |
| 5,296,759 A | 3/1994 | Sutherland et al. | |
| 5,338,983 A | 8/1994 | Agarwala | |
| 5,349,250 A | 9/1994 | New | |
| 5,357,152 A | 10/1994 | Jennings, III et al. | |
| 5,371,422 A | 12/1994 | Patel et al. | 326/41 |
| 5,424,589 A | 6/1995 | Dobbelaere et al. | |
| 5,446,651 A | 8/1995 | Moyse et al. | |
| 5,451,948 A | 9/1995 | Jekel | |
| 5,452,231 A | 9/1995 | Butts et al. | |
| 5,452,375 A | 9/1995 | Rousseau et al. | |
| 5,457,644 A | 10/1995 | McCollum | |
| 5,465,226 A | 11/1995 | Goto | |
| 5,465,375 A | 11/1995 | Thepaut et al. | |
| 5,483,178 A | 1/1996 | Costello et al. | 326/41 |
| 5,497,498 A | 3/1996 | Taylor | |
| 5,500,828 A | 3/1996 | Doddington et al. | |
| 5,523,963 A | 6/1996 | Hsieh et al. | |
| 5,528,550 A | 6/1996 | Pawate et al. | |
| 5,537,601 A | 7/1996 | Kimura et al. | |
| 5,546,018 A | 8/1996 | New et al. | |
| 5,550,993 A | 8/1996 | Ehlig et al. | |
| 5,559,450 A | 9/1996 | Ngai et al. | |
| 5,563,526 A | 10/1996 | Hastings et al. | |
| 5,570,039 A | 10/1996 | Oswald et al. | |
| 5,570,040 A | 10/1996 | Lytle et al. | |
| 5,572,148 A | 11/1996 | Lytle et al. | |
| 5,581,501 A | 12/1996 | Sansbury et al. | |
| 5,590,350 A | 12/1996 | Guttag et al. | |
| 5,594,366 A | 1/1997 | Khong et al. | |
| 5,594,912 A | 1/1997 | Brueckmann et al. | |
| 5,596,763 A | 1/1997 | Guttag et al. | |
| 5,606,266 A | 2/1997 | Pedersen | |
| 5,617,058 A | 4/1997 | Adrian et al. | |
| 5,633,601 A | 5/1997 | Nagaraj | |
| 5,636,368 A | 6/1997 | Harrison et al. | |
| 5,640,578 A | 6/1997 | Balmer et al. | |
| 5,644,522 A | 7/1997 | Moyse et al. | |
| 5,652,903 A | 7/1997 | Weng et al. | |
| 5,655,069 A | 8/1997 | Ogawara et al. | |
| 5,664,192 A | 9/1997 | Lloyd et al. | |
| 5,689,195 A | 11/1997 | Cliff et al. | 326/41 |
| 5,729,495 A | 3/1998 | Madurawe | |
| 5,740,404 A | 4/1998 | Baji | |
| 5,744,991 A | 4/1998 | Jefferson et al. | |
| 5,754,459 A | 5/1998 | Telikepalli | 708/627 |
| 5,768,613 A | 6/1998 | Asghar | |
| 5,784,636 A | 7/1998 | Rupp | |
| 5,794,067 A | 8/1998 | Kadowaki | |
| 5,801,546 A | 9/1998 | Pierce et al. | |
| 5,805,477 A | 9/1998 | Perner | |
| 5,805,913 A | 9/1998 | Guttag et al. | |
| 5,812,479 A | 9/1998 | Cliff et al. | |
| 5,815,422 A | 9/1998 | Dockser | |
| 5,821,776 A | 10/1998 | McGowan | |
| 5,825,202 A | 10/1998 | Tavana et al. | 326/39 |
| 5,838,165 A | 11/1998 | Chatter | |
| 5,841,684 A | 11/1998 | Dockser | |
| 5,847,579 A | 12/1998 | Trimberger | |
| 5,859,878 A | 1/1999 | Phillips et al. | |
| 5,869,979 A | 2/1999 | Bocchino | |
| 5,872,380 A | 2/1999 | Rostoker et al. | |
| 5,874,834 A | 2/1999 | New | 326/39 |
| 5,878,250 A | 3/1999 | LeBlanc | |
| 5,894,228 A | 4/1999 | Reddy et al. | |
| 5,942,914 A | 8/1999 | Reddy et al. | |
| 5,944,774 A | 8/1999 | Dent | |
| 5,949,710 A | 9/1999 | Pass et al. | |
| 5,951,673 A | 9/1999 | Miyata | |
| 5,956,265 A | 9/1999 | Lewis | |
| 5,959,871 A | 9/1999 | Pierzchala et al. | |
| 5,960,193 A | 9/1999 | Guttag et al. | |
| 5,961,635 A | 10/1999 | Guttag et al. | |
| 5,963,048 A | 10/1999 | Harrison et al. | |
| 5,963,050 A | 10/1999 | Young et al. | |
| 5,982,195 A | 11/1999 | Cliff et al. | |
| 5,986,465 A | 11/1999 | Mendel | |
| 5,991,788 A | 11/1999 | Mintzer | |
| 5,995,748 A | 11/1999 | Guttag et al. | |
| 5,999,015 A | 12/1999 | Cliff et al. | |
| 5,999,990 A | 12/1999 | Sharrit et al. | |
| 6,005,806 A | 12/1999 | Madurawe et al. | |
| 6,009,451 A | 12/1999 | Burns | |
| 6,020,759 A | 2/2000 | Heile | |
| 6,021,423 A | 2/2000 | Nag et al. | |
| 6,029,187 A | 2/2000 | Verbauwhede | |
| 6,031,763 A | 2/2000 | Sansbury | |
| 6,041,340 A | 3/2000 | Mintzer | |
| 6,052,327 A | 4/2000 | Reddy et al. | |
| 6,052,755 A | 4/2000 | Terrill et al. | |
| 6,065,131 A | 5/2000 | Andrews et al. | |
| 6,066,960 A | 5/2000 | Pedersen | |
| 6,069,487 A | 5/2000 | Lane et al. | 326/37 |
| 6,072,994 A | 6/2000 | Phillips et al. | |
| 6,073,154 A | 6/2000 | Dick | |
| 6,075,381 A | 6/2000 | LaBerge | |
| 6,085,317 A | 7/2000 | Smith | |
| 6,091,765 A | 7/2000 | Pietzold, III et al. | |
| 6,094,726 A | 7/2000 | Gonion et al. | |
| 6,098,163 A | 8/2000 | Guttag et al. | |
| 6,107,820 A | 8/2000 | Jefferson et al. | |
| 6,107,824 A | 8/2000 | Reddy et al. | |
| 6,154,049 A * | 11/2000 | New | 326/39 |
| 6,215,326 B1 | 4/2001 | Jefferson et al. | 326/41 |
| 6,366,944 B1* | 4/2002 | Hossain et al. | 708/628 |
| 6,407,576 B1 | 6/2002 | Ngai et al. | 326/41 |
| 6,483,343 B1 | 11/2002 | Faith et al. | |
| 6,556,044 B1 | 4/2003 | Langhammer et al. | 326/40 |
| 6,628,140 B1 | 9/2003 | Langhammer et al. | 326/40 |
| 2002/0089348 A1 | 7/2002 | Langhammer | 326/38 |

FOREIGN PATENT DOCUMENTS

| | | |
|---|---|---|
| EP | 380456 | 8/1990 |
| EP | 411491 | 2/1991 |
| EP | 0 461 798 A2 | 12/1991 |
| EP | 498066 | 8/1992 |
| EP | 606653 | 7/1994 |
| EP | 657803 | 6/1995 |
| EP | 660227 | 6/1995 |
| EP | 668659 | 8/1995 |
| EP | 1031934 | 8/2000 |
| EP | 1058185 | 12/2000 |
| GB | 2 283 602 A | 5/1995 |
| GB | 2286737 | 8/1995 |
| GB | 2318198 | 4/1998 |
| WO | WO95/27243 | 10/1995 |
| WO | WO96/28774 | 9/1996 |
| WO | WO98/12629 | 3/1998 |
| WO | WO98/32071 | 7/1998 |
| WO | WO99/22292 | 5/1999 |
| WO | WO99/31574 | 6/1999 |

WO    WO00/51239    8/2000

OTHER PUBLICATIONS

"Xilinx Unveils New FPGA Architecture to Enable High-Performance, 10 Million System Gate Designs", Xilinx, Jun. 22, 2000.
"Xilinx Announces DSP Algorithms, Tools and Features for Virtex-II Architecture", *Xilinx*, Nov. 21, 2000.
"Virtex-II 1.5V Field-Programmable Gate Arrays", *Xilinx*, Jan. 25, 2001, module 2 of 4.
"Virtex-II 1.5V Field-Programmable Gate Arrays", *Xilinx*, Apr. 2, 2001, module 1 of 4.
"Virtex-II 1.5V Field-Programmable Gate Arrays", *Xilinx*, Apr. 2, 2001, module 2 of 4.
"Implementing Logic with the Embedded Array in FLEX 10K Devices", *Altera*, May 2001, ver. 2.1.
"The QuickDSP Design Guide", *Quicklogic*, Aug. 2001, revision B.
"QuickDSP™ Family Data Sheet", *Quicklogic*, Aug. 7, 2001, revision B.
Amos, D., "PLD architectures match DSP algorithms," *Electronic Product Design*, vol. 17, No. 7, pp. 30, 32 Jul. 1996.
Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science vol. 1896)*, Aug. 27-30, 2000, pp. 456-61.
Aoki, T., "Signed-weight arithmetic and its application to a field-programmable digital filter architecture," *IEICE Transactions on Electronics*, 1999, vol. E82C, No. 9, Sep. 1999, pp. 1687-98.
Ashour, M.A., et al., "An FPGA implementation guide for some different types of serial-parallel multiplier-structures," *Microelectronics Journal*, vol. 31, No. 3, 2000, pp. 161-68.
Colet, p., "When DSPs and FPGAs meet: Optimizing image processing architectures," *Advanced Imaging*, vol. 12, No. 9, Sep. 1997, pp. 14, 16, 18.
Crookes, D., et al., "Design and implementation of a high level programming environment for FPGA-based image processing," *IEE Proceedings-Vision. Image and Signal Processing*. vol. 147, No. 4, Aug. 2000, pp. 377-84.
Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-86.
Dick, C., et al., "Configurable logic for digital communications: some signal processing perspectives," *IEEE Communications Magazine*, vol. 37, No. 8, Aug. 1999, pp. 107-11.
Do, T.-T., et al., "A flexible implementation of high-performance FIR filters on Xilinx FPGAs," *Field-Programmable Logic and Applications: From FPGAs to Computing Paradigm. 8th International Workshop, FPL'98. Proceedings*, Hartenstein, R.W., et al., eds., Aug. 31-Sep. 3, 1998, pp. 441-45.
Guccione, S.A., "Run-time Reconfiguration at Xilinx," *Parallel and distributed processing: 15 IPDPS 2000 workshops*, Rolim, J., ed., May 1-5, 2000, p. 873.
Hauck, S., "The Future of Reconfigurable Systems," *Keytone Address, 5th Canadian Conference on Field Programmable Devices*, Jun. 1998, http://www.ee.washington.edu/people/faculty/hauck/publications/ReconfigFuture.PDF.
Heysters, P.M., et al., "Mapping of DSP algorithms on field programmable function arrays," *Field-Programmable Logic and Applications. Roadmap to Reconfigurable Computing. 10th International conference. FPL 2000. Proceedings (Lecture Notes in Computer Science vol. 1896)*. Aug. 27-30, 2000, pp. 400-11.
Jinghua, L., "Design a pocket multi-bit multiplier in FPGA," *1996 2nd International Conference on ASIC Proceedings (IEEE Cat. No. 96TH8140)*. Oct. 21-24, 1996, pp. 275-79.

Jones, G., "Field-programmable digital signal conditioning," *Electronic Product Design*, vol. 21, No. 6, Jun. 2000, pp. C36-38.
Kiefer, R., et al., "Performance comparison of software/FPGA hardware partitions for a DSP application," *14th Australian Microelectronics Conference, Microelectronics: Technology Today for the Future. MICRO '97 Proceedings*, Sep. 28-Oct. 1, 1997, pp. 88-93.
Kramberger, I., "DSP acceleration using a reconfigurable FPGA," *ISIE '99. Proceedings of the IEEE International Symposium on Industrial Electronics (Cat. No. 99TH8465)*, vol. 3, Jul. 12-16, 1999, pp. 1522-25.
Langhammer, M., "How to implement DSP in programmable logic," *Elettronica Oggi*, No. 266, Dec. 1998, pp. 113-15.
Langhammer, M., "Implementing a DSP in Programmable Logic," *Online EE Times*, May 1998, http://www.eetimes.com/editorial/1998/coverstory9805.html.
Lazaravich, B.V., "Function block oriented field programmable logic arrays," *Motorola, Inc. Technical Developments*, vol. 18, Mar. 1993, pp. 10-11.
Lund, D., et al., "A new development system for reconfigurable digital signal processing," First International Conference on 3G Mobile Communication Technologies (Conf. Publ. No. 471), Mar. 27-29, 2000, pp. 306-10.
Miller, N.L., et al., "Reconfigurable integrated circuit for high performance computer arithmetic," *Proceedings of the 1998 IEEE Colloquium on Evolvable Hardware Systems (Digest)*, No. 233, 1998, pp. Feb. 1-Feb. 4.
Mintzer, L., "Xilinx FPGA as an FFT processor," *Electronic Engineering*, vol. 69, No. 845, May 1997, pp. 81, 82, 84.
Nozal, L., et al., "A new vision system: programmable logic devices and digital signal processor architecture (PLD+DSP)," *Proceedings IECON '91. 1991 International Conference on Industrial Electronics. Control and Instrumentation (Cat. No. 91CH2976-9)*, vol. 3, Oct. 28-Nov. 1, 1991, pp. 2014-18.
Papenfuss, J.R, et al., "Implementation of a real-time, frequency selective, RF channel simulator using a hybrid DSP-FPGA architecture," *Rawcon 2000: 2000 IEEE Radio and Wireless Conference (Cat. No. 00EX404)*, Sep. 10-13, 2000, pp. 135-38
Parhami, B., "Configurable arithmetic arrays with data-driven control," *34th Asilomar conference on Signals, Systems and Computers*, vol. 1, 2000, pp. 89-93.
Rangasayee, K., "Complex PLDS let you produce efficient arithmetic designs," *EDN (European Edition)*, vol. 41, No. 13, Jun. 20, 1996, pp. 109, 110, 112, 114, 116.
Rosado, A., et al., "A high-speed multiplier coprocessor unit based on FPGA," *Journal of Electrical Engineering*, vol. 48, No. 11-12, 1997, pp. 298-30.
Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications (Cat. No. 99EX303)*, Jul. 26-28, 1999, pp. 147-50.
Tisserand, A., et al., "An on-lline arithmetic based FPGA for low power custom computing," *Field Programmable Logic and Applications, 9th International Workshop, FPL '99, Proceedings (Lecture Notes in Computer Science vol. 1673)*, Lysaght, P., et al., eds., Aug. 30-Sep. 1, 1999, pp. 264-73.
Tralka, C., "Embedded digital signal processor (DSP) modules in programmable logic devices (PLDs)." *Elektronic*, vol. 49, No. 14, Jul. 11, 2000, pp. 84-96.
Wenzel, L., "Field programmable gate arrays (FPGAs) to replace digital signal processor integrated circuits," *Elektronik*, vol. 49, No. 5, Mar. 7, 2000, pp. 78.

* cited by examiner

I/O DSP BLOCK

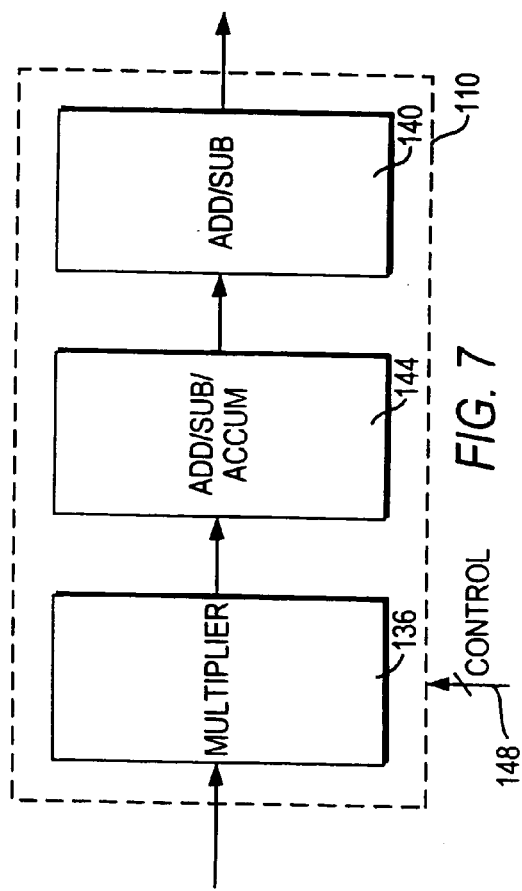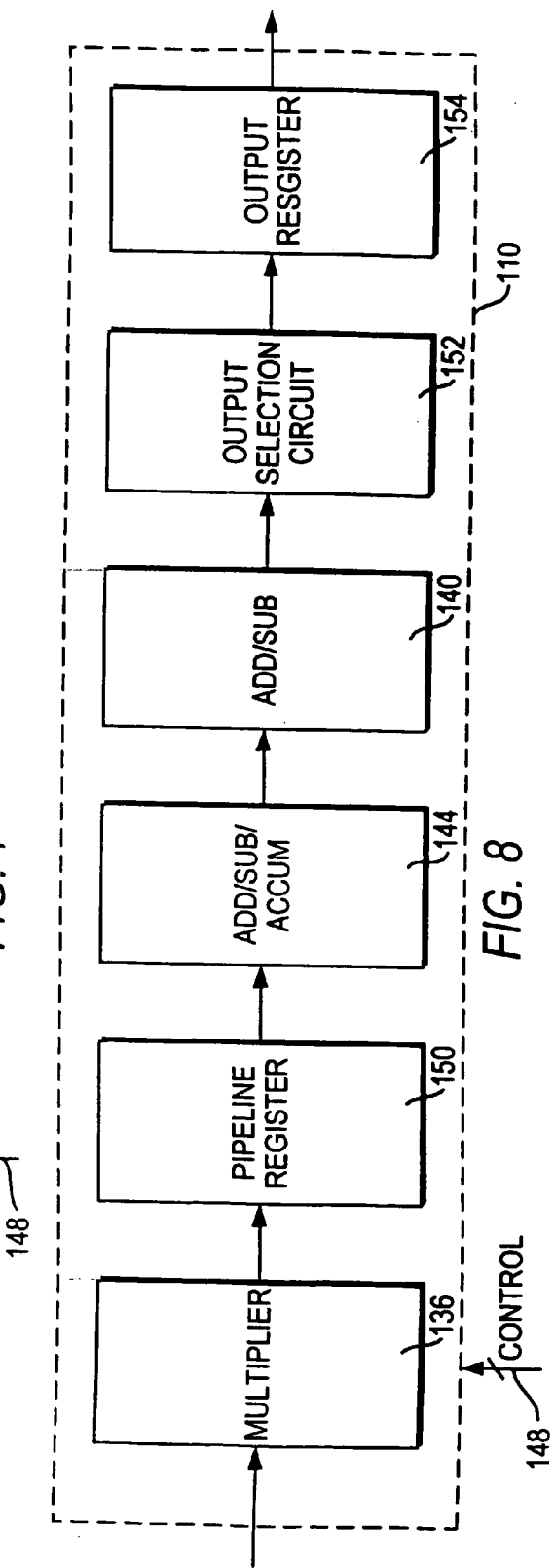

MODE 5

DEVICES AND METHODS WITH PROGRAMMABLE LOGIC AND DIGITAL SIGNAL PROCESSING REGIONS

CROSS-REFERENCE TO RELATED APPLICATIONS

This application is a continuation of U.S. patent application Ser. No. 10/354,440, filed Jan. 28, 2003, now U.S. Pat. No. 6,771,094, which is a continuation of U.S. patent application Ser. No. 09/955,645, filed Sep. 18, 2001, now U.S. Pat. No. 6,538,470, which claims the benefit of U.S. Provisional Patent Application No. 60/233,387, filed Sep. 18, 2000, and U.S. Provisional Patent Application No. 60/233,389, filed Sep. 18, 2000. All of these prior filings are hereby incorporated by reference herein in their entireties.

BACKGROUND OF THE INVENTION

This invention relates to programmable logic integrated circuit devices, and more particularly to programmable logic integrated circuit devices with integrated digital signal processing circuitry.

Programmable logic devices ("PLDs") are well known as is shown, for example, by Jefferson et al. U.S. Pat. No. 6,215,326 and Ngai et al. U.S. Pat. No. 6,407,576. PLDs typically include many regions of programmable logic that are interconnectable in any of many different ways by programmable interconnection resources. Each logic region is programmable to perform any of several logic functions on input signals applied to that region from the interconnection resources. As a result of the logic function(s) it performs, each logic region produces one or more output signals that are applied to the interconnection resources.

The interconnection resources typically include drivers, interconnection conductors, and programmable switches for selectively making connections between various interconnection conductors. The interconnection resources can generally be used to connect any logic region output to any logic region input; although to avoid having to devote a disproportionately large fraction of the device to interconnection resources, it is usually the case that only a subset of all possible interconnections can be made in any given programmed configuration of the PLD.

One of the complexities that is faced in providing programmable logic devices involves the logic capacity of programmable logic devices. The demand for interconnection resources typically increases exponentially with respect to linear increases in logic capacity. Accordingly, interconnection arrangements that are flexible, efficient, and have sufficient signal carrying capacity are needed for programmable logic devices without displacing excessive amounts of other resources such as logic or without occupying a disproportionately larger area in PLDs.

Although only logic regions are mentioned above, it should also be noted that many PLDs also now include regions of memory that can be used as random access memory ("RAM"), read-only memory ("ROM"), content addressable memory ("CAM"), product term ("p-term") logic, etc.

As the capacity and speed of PLDs has increased, interest in using PLDs for signal or data processing tasks (e.g., for digital signal processing tasks) that may involve relatively large amounts of parallel information and may require relatively complex manipulation, combination, and recombination of that information has increased. Large numbers of signals in parallel consume a correspondingly large amount of interconnection resources; and each time that information (or another combination or recombination that includes that information) must be routed within the device, another similar large amount of the interconnection resources is consumed. Some such PLDs may be programmable to perform signal and data processing tasks that involve relatively complex manipulation, combination, and recombination of information. However, such PLDs are often deficient in providing sufficient speed of operation, sufficient logic or interconnection resources to perform additional tasks, sufficient dedicated digital signal processing circuitry and interconnection resources (e.g., multistage digital signal processing circuitry), or in providing adequate implementation of common digital signal processing tasks without impairing the operation of a substantial portion of the PLD or occupying a substantial area in the PLD.

SUMMARY OF THE INVENTION

In accordance with the principles of the present invention, programmable logic integrated circuit devices, methods, and systems may be provided that use or include digital signal processing regions. A programmable logic device may include a plurality of programmable logic regions and one or more digital signal processing regions. The regions may be arranged in different areas in the programmable logic device.

The programmable logic device may include programmable logic super-regions that may include groups of programmable logic elements, a memory region, and a digital signal processing region (e.g., a digital signal processing block). Different resources in a programmable logic device may be arranged in blocks. Each block may have a concentration of circuitry that is arranged to provide memory, programmable logic, or digital signal processing. The programmable logic device may include circuitry such as conductors and connectors for providing interconnect resources.

When a digital signal processing region is positioned in a programmable logic super-region, the digital signal processing region may use some of the local interconnect resources of the programmable logic elements, registers, and/or memory in that programmable logic super-region. Global interconnect resources of the programmable logic super-region may be used to apply input signals to the digital signal processing region and/or to route output signals out of the digital signal processing super-region.

A programmable logic device may include a column of programmable logic regions and may include a digital signal processing region in a row in that column. If desired, a programmable logic device may include a column of programmable logic regions and may include multiple rows in the column that include digital signal processing regions. (e.g., each include a digital signal processing region). If desired, a programmable logic device may include a column of programmable logic regions and may include a digital signal processing region in a cell in a row in that column. The digital signal processing region may use local and global interconnect resources of an adjacent programmable logic region in the column. Such an arrangement may be used, when the digital signal processing region is approximately the same size as a programmable logic region. In some embodiments, a digital signal processing region substantially consumes the interconnect resources of an adjacent programmable logic region when the digital signal processing region is being used.

A digital signal processing region of a programmable logic device may perform multistage digital signal processing operations. A digital signal processing region of a programmable logic device may include a plurality of digital signal processing stages that are configurable to implement commonly used digital signal processing operations (e.g., commonly used filters). Multiplier circuits may be included in the digital signal processing region. Additional stages of the digital signal processing region may include stages that complement the functionality provided by the multiplier circuits. Circuitry in the additional stages may be interconnected with the multiplier circuits to implement commonly used digital signal processing operations. Additional stages may include circuitry that provides a multiply-and-add operation, a multiply-and-accumulate operation, or a multiply-and-subtract operation when used with the multiplier circuits.

The additional stages may include a stage that receives inputs from the multiplier circuits and applies an addition, a subtraction, or an accumulation operation to the received inputs. This stage may include circuits that are arranged (e.g., arranged to be dedicated) to perform addition, subtraction, and/or accumulation operations. The inputs of this stage may be dedicated to receiving outputs from the multiplier circuits. Local interconnect resources may be provided that include circuitry that is dedicated to routing the output signals of the multiplier circuits to the next stage of the digital signal processing region. Input register circuits may be included for feeding input signals to the multiplier circuits.

A next stage of the digital signal processing region may include an adder circuit. The adder circuit may perform an addition operation. The adder circuit may receive inputs from the previous stage, which may be the stage that applies an addition, a subtraction, or an accumulation operation to the outputs of the multiplier circuit stage mentioned above. The inputs of the adder circuits may be dedicated to receiving inputs from that earlier stage. Local interconnect resources may be arranged to interconnect the adder circuit and the earlier stage. Local interconnect resources may include circuitry that is dedicated to providing the output of the earlier stage to the adder circuit. The adder circuit may be used to provide a subtraction operation.

Pipeline register circuits may be arranged in between the multiplier circuits and the following stage of the digital signal processing region to apply pipeline techniques to the operation of the digital signal processing region. If desired, additional pipeline register circuits may be included as part of the multiplier circuits (i.e., inside the multiplier circuits for use in multiplier operations) and/or as part of the subsequent stages (e.g., adder circuits) to further increase the speed of operation, but which may increase latency. In embodiments in which pipeline registers are implemented, the pipeline registers may be selectable so that a user can bypass the pipeline registers if desired. The selectable pipeline registers will allow users to select whether pipeline techniques will be applied to some or all of digital signal processing operations of the digital signal processing region.

Output register circuits may be included in the digital signal processing region that register the output of the digital signal processing region. Output feedback paths may be provided from the output register circuits to an earlier stage for performing an addition operation to produce an accumulator output.

Input register circuits, output register circuits, and pipeline register circuits may include registers and may include bypass circuitry that may be used to bypass the registers. Some embodiments of the digital signal processing region may be without input register circuits, output register circuits, and/or pipeline register circuits.

A digital signal processing region for a programmable logic region may include an output selection circuit. An output selection circuit may receive input signals from a plurality of different sources in the digital signal processing region. The output selection circuits may have a number of inputs that have different bit lengths. The output selection circuit may receive inputs from different stages in the digital signal processing region. The output selection circuit may select the output of the digital signal processing region to be from one of the inputs of the output selection circuit.

A digital signal processing region for a programmable logic region may have a plurality of modes. The different modes may be selectable to provide different digital signal processing operations. Local interconnect resources may be arranged to produce different outputs in different modes. Local interconnect resources may include circuitry that routes signals between adjacent stages and may also route signals from the outputs of each stage to the output selection circuit. The output selection circuit may select the output of the digital signal processing region based on the current mode of the digital signal processing region.

The modes may include modes in which the output of the digital signal processing region is the output of one or more multipliers (e.g., four parallel n×n multipliers), is the output of the addition of multiplier outputs (e.g., the outputs of two adder circuits that each add two multiplier outputs), is the resultant of the addition of two multiplier outputs and the resultant of the subtraction of two multiplier outputs, is the output of a multiply-and-accumulate operation, is the resultant of adding three or more multiplier outputs, etc. The digital signal processing region may include circuitry that is arranged to provide the modes. If desired, the digital signal processing region may only have a single mode or only a sub-combination of the modes illustratively described herein.

A digital signal processing region for a programmable logic region may have an n×n multiplier based organization. The digital signal processing region may be reconfigurable to have an n/2×n/2 multiplier based organization. The digital signal processing region may be reconfigurable to have a 2n×2n multiplier based organization. Multiplier circuits in a digital signal processing block may be configurable to operate as a single 2n×2n multiplier, as multiple n×n multipliers, or as multiple n/2×n/2 multipliers. Multiplier circuits for an n×n multiplier may be structured to have the functionality to operate as multiple smaller size multipliers. For example, multiplier circuits for an n×n multiplier may support the functionality to operate as four separate n/2×n/2 multipliers. However, in implementation, routing resources for supporting all four of the n/2×n/2 multipliers may not be available. The routing resources or local interconnect resources may only support two of the four n/2×n/2 multiplier circuits. For example, in a situation where a single n×n multiplier circuit is supported with 4n bit routing resources (i.e., one n bit input for each of the multiplier inputs and a 2n bit output for the multiplier), functionality of that n×n multiplier circuit that may be available to operate as more than two n/2×n/2 multiplier circuits may not be supported because routing resources that will be needed to support more than two n/2×n/2 multiplier circuits will not available once two n/2×n/2 multiplier circuits consume the available 4n bit routing resources of the n×n multiplier circuit (i.e., four n/2 bit inputs and two n bit outputs). This example is given for a single multiplier, however, the principle is applicable in a greater scale and/or is applicable to other digital signal processing circuitry. For clarity and brevity, the multiplier circuits are primarily discussed in the context of the number of multipliers (e.g., the number of n×n multipliers, the number of n/2×n/2 multipliers, etc.) that the routing of a digital signal processing block is configured to support. The architecture of the multiplier circuits may support the functionality of additional multipliers that are not being used due to routing limitations.

Multiplier circuits in a digital signal processing block may be configured to operate as one or more p×p multipliers (p is the number of bits of each multiplier input or the precision of the input of the multiplier) and each p×p multiplier of the digital signal processing block may be configured to operate as m multipliers that each operate as a p/m×p/m multiplier where p/m equals an integer (e.g., an 18×18 multiplier may operate as two 9×9 multipliers). This formula is based on the number of multipliers that are to be supported by the routing resources and does not reflect that the multiplier circuits may actually support the operation of a larger number of multipliers. Multiplier circuits that are mentioned herein may be configured to have the functionality of a particular number of multipliers wherein some or all of that particular number of multipliers are being specifically identified herein for use in digital signal processing blocks.

In some applications, decoding smaller multiplication results (e.g., n/2×n/2 multiplication results) from larger multipliers (e.g., n×n multipliers) may be inconvenient or inefficient. In those applications, dedicated multipliers (e.g., dedicated n/2×n/2 multipliers) for obtaining the results of smaller multiplication may be implemented for such use.

Each multiplier based organization of a digital signal processing region may be associated with different modes. If desired, the digital signal processing region may only have either an n×n multiplier based organization or an n/2×n/2 multiplier based organization.

One of the stages of the digital signal processing region may be an add-subtract-accumulate circuit. The add-subtract-accumulate circuit may include separate add and accumulate circuits. The add circuit may also provide a subtraction feature. In some embodiments, a feedback path to the adder circuit may be included in the add-subtract-accumulate circuit for providing accumulator operation.

In some embodiments, the add-subtract-accumulate circuit may include an adder circuit that can select a feedback path from an output of the digital signal processing region as an input. In those embodiments, the add-subtract-accumulate circuit may include an adder circuit and may include subtraction-related circuitry that is used to implement a subtraction operation using the adder circuit. The add-subtract-accumulate circuit may include accumulator-related circuitry for sign-extending one of the inputs of the add-subtract-accumulate circuit and may include additional adder circuitry that implements accumulator features. If desired, a zeroing circuit may be provided for the add-subtract-accumulate circuit that sets the feedback input to zero when the accumulator resultant is to be reset.

An output selection circuit may be included in a digital signal processing to balance the speed of operation of the digital signal processing region in different modes.

The detailed description, provided below, includes additional summary statements or descriptions that repeat, restate, append, expand, or clarify this summary.

BRIEF DESCRIPTION OF THE DRAWINGS

FIG. 7 is a functional block diagram of illustrative multistage digital signal processing circuitry of a programmable logic device in accordance with the present invention.

FIG. 8 is a functional block diagram of another illustrative multistage digital signal processing circuitry of a programmable logic device in accordance with the present invention.

DETAILED DESCRIPTION

Figure 1:
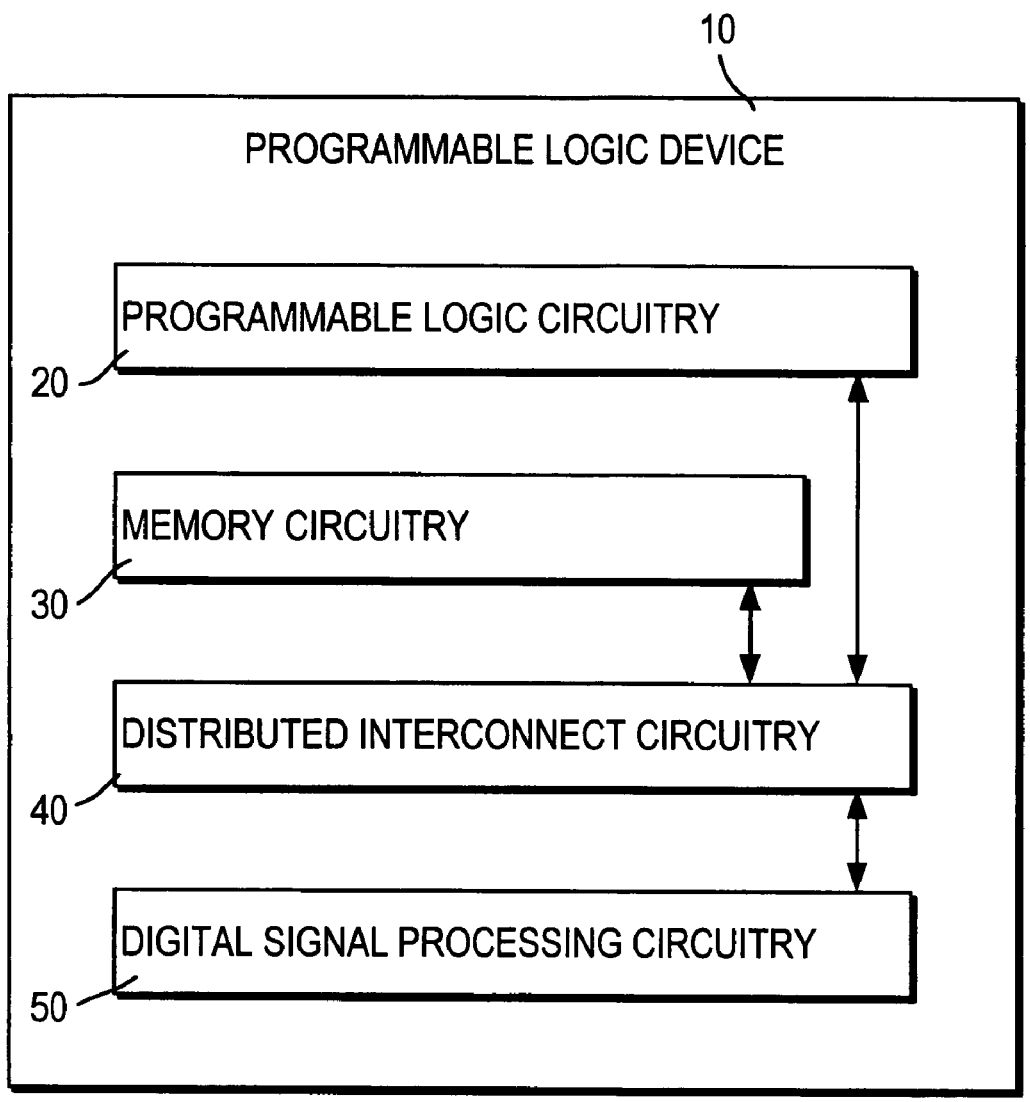
FIG. 1 is a functional block diagram of an illustrative programmable logic device having digital signal processing circuitry in accordance with the present invention.

Regions in a programmable logic device may be dedicated to digital signal processing circuitry. Circuitry for providing digital signal processing operations may be concentrated in a region in a programmable logic device (e.g., concentrated only in that region). A plurality of such regions may be arranged in a programmable logic device. Digital signal processing circuitry may be provided to perform multistage digital signal processing operations. The organization of the digital signal processing circuitry may make that circuitry open for use in many commonly used digital signal processing operations. A desired digital signal processing operation of interest may be selected from a particular set of digital signal processing operations that the digital signal processing region is configured to perform. A programmable logic device with digital signal processing regions may have other resources (e.g., programmable logic regions, memory, etc.) that are integrated with the digital signal processing regions for high speed, low latency, or quick implementation of applications that are currently in high demand, such as video image processing, digital communications signal processing, or other applications that involve a combination of logic operations and digital signal processing operations for suitable operation.

A programmable logic device may have an architecture that is based on concentrating circuitry in different regions based on purpose. For example, with reference now to FIG. 1, programmable logic device 10 may include programmable logic circuitry 20 (e.g., programmable logic circuitry 20 that is concentrated in block-shaped regions in programmable logic device 10), memory circuitry 30 (e.g., memory circuitry 30 that is concentrated in block-shaped regions in programmable logic device 10), digital signal processing circuitry 50 (e.g., digital signal processing circuitry 50 that is concentrated in block-shaped regions in programmable logic device 10), and distributed interconnect circuitry 40.

Distributed interconnect circuitry 40 may be distributed over programmable logic device 10 to provide connectivity between programmable logic circuitry 20, memory circuitry 30, and digital signal processing circuitry 50. Programmable logic circuitry 20, memory circuitry 30, and digital signal processing circuitry 50 may include local interconnect resources for forming interconnections between local resources. Digital signal processing circuitry 50 may be substantially mutually exclusive of circuitry, layout, and/or functionality of programmable logic circuitry 20, memory circuitry 30, and/or distributed interconnect circuitry 40.

Digital signal processing circuitry 50 may be a medium through which programmable logic device 10 processes certain types of digital signals to achieve suitable operating speeds without substantially impairing or using other resources of programmable logic device 10. Digital signal processing circuitry 50 may have capabilities that complement the capabilities of programmable logic circuitry 20. The complementary capabilities may sustain substantially concurrent use of substantially all of programmable logic circuitry 20 and digital signal processing circuitry 50. If desired, digital signal processing circuitry 50 may operate without relying on distributed interconnect circuitry 40 for performing internal digital signal processing operations. Thus, digital signal processing circuitry 50 may operate as a high speed isolated digital signal processing channel.

Figure 2:
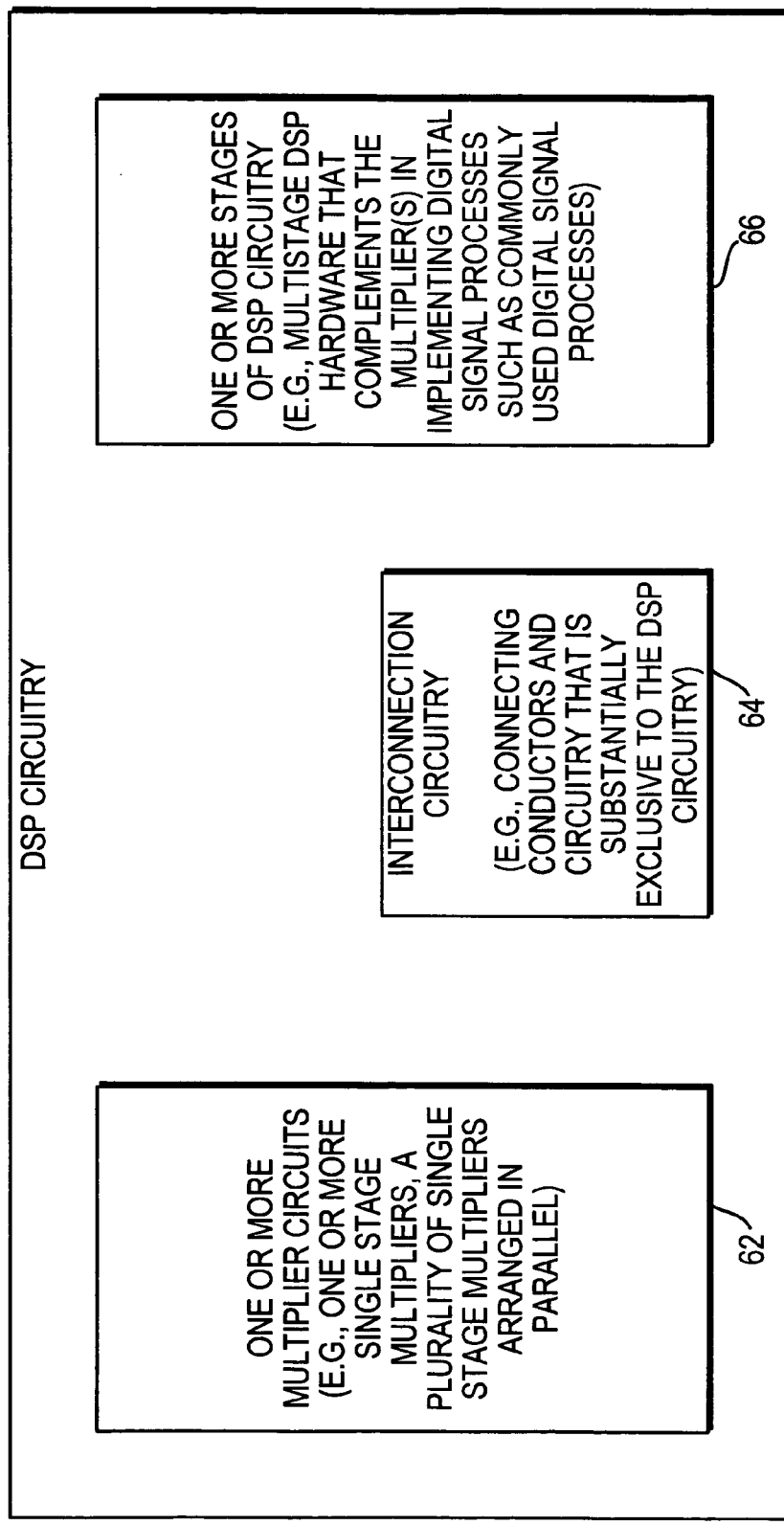
FIG. 2 is a functional block diagram of illustrative digital signal processing circuitry of FIG. 1 in accordance with the present invention.

Digital signal processing circuitry 50 may include multipliers and other digital signal processing circuitry. For example, digital signal processing circuitry 50 may include digital signal processing circuitry 60 of FIG. 2. With reference now to FIG. 2, digital signal processing circuitry 60 may include one or more multiplier circuits 62, interconnection circuitry 64, and one or more digital signal processing stages 66.

Multiplier circuits 62 may include a plurality of individual multiplier circuits, a plurality of multipliers operable in parallel to provide a first digital signal processing stage, four parallel n×n bit multipliers that are each configurable to be m parallel n/m×n/m bit multipliers when n/m is an integer, etc. Digital signal processing stage(s) 66 may include single stage or multistage digital signal processing circuitry. Digital signal processing stage 66 may include adder circuitry, subtracter circuitry, accumulator circuitry, or combinations thereof. Digital signal processing stage 66 and multiplier circuits 62 may include other related circuitry. Interconnection circuitry 64 may include connecting conductors and circuitry that interconnects digital signal processing stage 66 with multiplier circuits 62. The interconnections may be flexible or dedicated. Interconnection circuitry 64 may include conductors and circuitry for connecting digital signal processing circuitry 62 with other resources in a programmable logic device. Interconnection circuitry 64 may be dedicated to supporting operations in digital signal processing circuitry 60.

Digital signal processing circuitry 60 is illustrative of the content and organization of a single digital signal processing circuit block. Together, multiplier circuits 62 and digital signal processing stage 66, may include a combination of processing elements that are common to a number of often used digital signal processing operations such as infinite impulse response ("IIR") filters, direct form I finite impulse response ("FIR") filters, direct form II FIR filters, multiply accumulate operations, etc.

Figure 3:
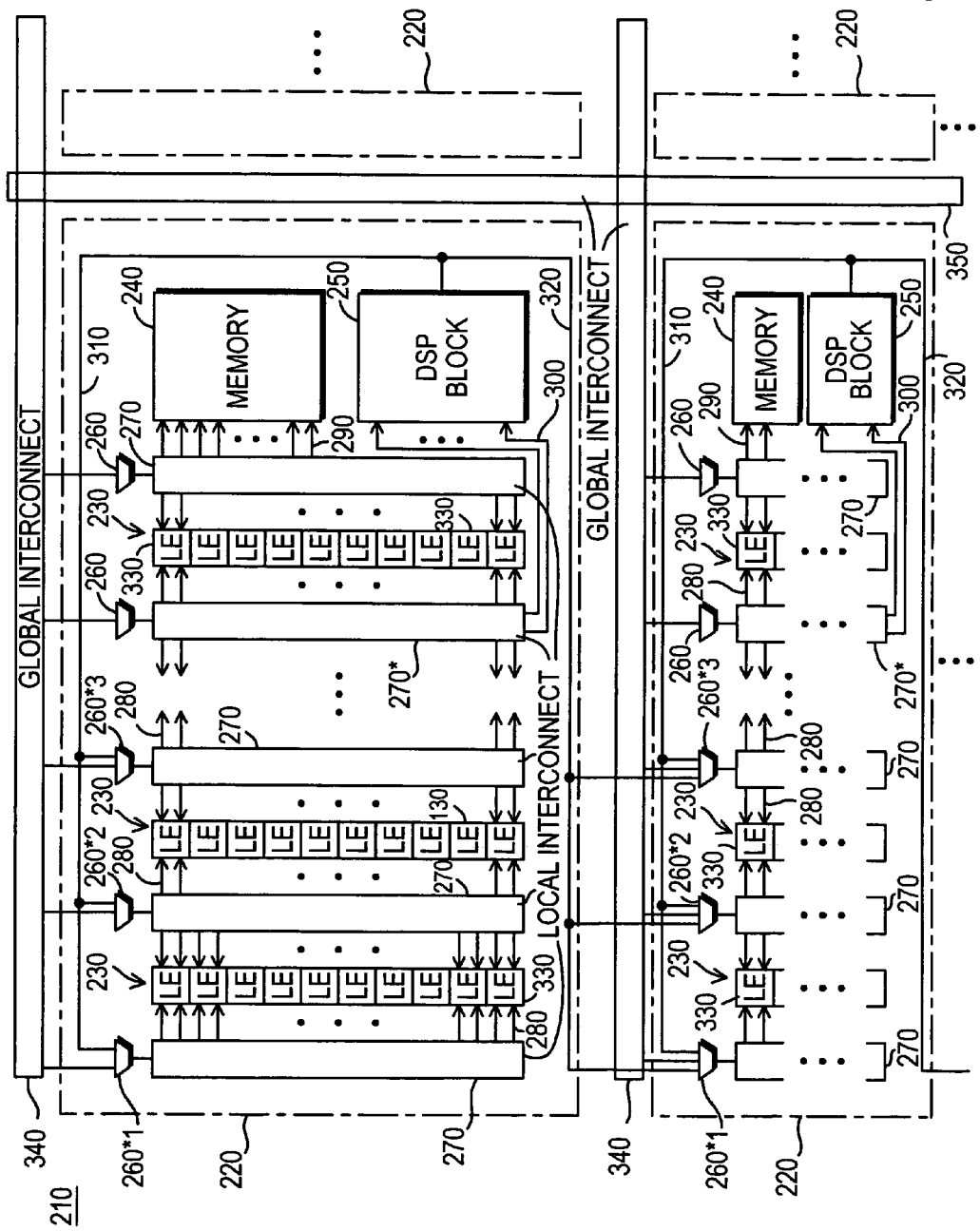
FIG. 3 is a simplified schematic block diagram of representative portions of an illustrative embodiment of a programmable logic device having programmable logic regions and digital signal processing circuitry constructed in accordance with the present invention.

Digital signal processing circuitry 50 of FIG. 1 may be in a "super-region" of a programmable logic device. For example, with reference now to FIG. 3, illustrative programmable logic device ("PLD") 210 includes a two-dimensional array of intersecting rows and columns of "super-regions" 220 of programmable logic and other resources. Each super-region 220 includes a plurality of regions 230 of programmable logic, a region 240 of memory, and digital signal processing block 250. Each super-region 220 also includes some relatively local interconnection resources such as programmable logic connectors ("PLCs") 260, the regions of interconnection conductors and PLCs labeled 270, logic-element-feeding conductors 280, memory-region-feeding conductors 290, and other conductors 300, 310, 320, etc. (Throughout the accompanying drawings many elements that are actually provided in multiple instances are represented by just single lines or other single schematic symbols. Thus, for example, each PLC 260 in FIG. 3 is actually representative of many instances of such PLC circuitry. As another example, each line 310 in FIG. 3 is actually representative of many parallel conductors 310.)

Each region 230 includes a plurality of "logic elements" 330. Each logic element (or "logic module" or "subregion") 230 is an area of programmable logic that is programmable to perform any of several logic tasks on signals applied to the logic element to produce one or more logic element output signals. For example, each logic element 330 may be programmable to perform one place of binary addition on two input bits and a carry-in bit to produce a sum-out bit and a carry-out bit. Each logic element 330 also includes register (flip-flop) circuitry for selectively registering a logic signal within the logic element.

Conductors 280 apply what may be thought of as the primary inputs to each logic element 330 (although logic elements may also have other inputs). The outputs of logic elements 330 are not shown in FIG. 3 to avoid over-crowding the drawing. However, those outputs typically go to local interconnect resources 270 and other more general-purpose interconnection resources such as the global interconnect 340 associated with the row of super-regions 220 from which that logic element output came. There may also be another level of horizontal, general-purpose interconnect associated with each super-region 220 that is not shown in FIG. 3 (again to avoid over-crowding the drawing). This would include conductors that extend across the super-region and that are usable for conveying signals between the regions 230 and 240 in that super-region. The output signals of the logic elements 330 in each super-region 220 are also typically applied to that level of interconnect, and that level of interconnect also typically provides additional inputs to PLCs 260.

PLCs 260 (of which there are many for each local interconnect region 270) are programmable (e.g., by associated function control elements ("FCEs")) to select any of their inputs for output to the associated local interconnect 270. Each local interconnect 270 is programmable (again by FCEs) to route the signals it receives to the adjacent logic elements 330 or memory region 240, or in certain cases to digital signal processing block 250.

Vertical global interconnection resources 350 are provided for making general purpose interconnections between the rows of super-regions 220.

Terms like "super-region", "region", and "logic element" or the like are used herein only as relative terms to indicate that relatively small elements may be grouped together in larger elements or units. These terms are not intended to always refer to circuitry of any absolute or fixed size or capacity. And indeed, if a hierarchy of relative sizes is not relevant in a particular context, these various terms may be used interchangeably or as essentially generic to one another. For example, in the above Background section the term "region" is used in this generic way.

Additional consideration of the term "PLC" is also appropriate at this point. Although thus-far described as being programmably (and therefore statically or relatively statically) controlled (e.g., by FCEs), it will be understood that some or all elements referred to herein as PLCs may be alternatively controlled in other ways. For example, a PLC may be controlled by a more dynamic control signal (e.g., a logic signal on programmable logic device 210 that can have different logic levels at different times during the post-configuration, "normal" logic operation of the programmable logic device). Although such dynamic control of a PLC may mean that the PLC is not, strictly speaking, a "programmable" logic connector, nevertheless the term "PLC" will continue to be used as a generic term for all such generally similar elements, whether statically or dynamically controlled.

To avoid having to dedicate a large amount of interconnection resources to digital signal processing block 250, each digital signal processing block 250 is arranged to get its inputs from one (or more) of the regions of local interconnect 270 that are already provided to supply inputs to adjacent logic regions 230. In the particular example shown in FIG. 3, the local interconnect region 270 that is located one such region 270 away from the region immediately adjacent to digital signal processing block 250 in the same super-region 220 is chosen for this purpose. This local interconnect region (identified as 270*\* for ease of reference) is chosen because it is not used by memory region 240 but is relatively close to digital signal processing block 250. Conductors 300 (e.g., 32 conductors) are provided from local interconnect region 270*\* to the associated digital signal processing block 250. When a digital signal processing block 250 is being used, these conductors 300 supply the inputs to the digital signal processing block 250. Thus when a digital signal processing block 250 is being used, it effectively "steals" some of the local routing provided for logic region input.

The output signals of each digital signal processing block 250 (e.g., a 32 bit output) are conveyed on dedicated conductors 310 to selected PLCs 260 in the same super-region 220 that includes that digital signal processing block 250. For ease of reference these PLCs are identified by reference numbers 260*\*1, 260*\*2, 260*\*3, etc. (generically 260*\*). Thus the outputs of each digital signal processing block 250 are at least initially conveyed on dedicated but relatively local conductors 310. The outputs of digital signal processing block 250 therefore do not (at least initially) consume any of the more general-purpose routing and do not require dedicated drivers. This saves on power and device size. In addition, this (at least initial) dedicated output routing for digital signal processing blocks 250 reduces the potential for congestion in the general purpose routing.

If desired, the output signals of each digital signal processing block 250 are also conveyed on dedicated conductors 320 to those same PLCs 260* in the vertically downwardly adjacent super-region 220. The capabilities of each digital signal processing block 250 may be sufficient to substantially complete a number of digital signal processing operations. In instances where further digital signal processing is desired or the outputs of two digital signal processing blocks 250 are sought to be added, dedicated conductors 320 may be included in programmable logic device 210 to provide connections for completing additional operations.

The outputs of digital signal processing blocks 250 can be applied to logic elements 330 in the same super-region 220 via the associated conductors 310 and PLCs 260* (or in the downwardly adjacent super-region 220 via the associated conductors 320 and the PLCs 260* in that downwardly adjacent super-region). The output drivers of the receiving logic elements 330 can be used to drive the output signals of digital signal processing block 250 out into the general purpose interconnect of programmable logic device 210, with or without intervening registration of those signals by the registers of those logic elements. Again, very little general purpose interconnect is required to support the operations that are internal to digital signal processing blocks 250.

From the foregoing it will be appreciated that the organization of the circuitry shown in FIG. 3 avoids the need to dedicate either output registers or output drivers of super-region 220 to digital signal processing block 250. In applications in which the outputs of a digital signal processing block 250 require registration and/or require to be driven out into the general purpose interconnect of programmable logic device 210, those capabilities can be provided by the registers and/or output drivers of the logic elements to which the outputs of digital signal processing block 250 are locally conveyed.

It will be appreciated that sharing of local interconnect resources 270* between adjacent logic regions 230 and digital signal processing block 250 may at least somewhat sacrifice the usability of those logic regions when programmable logic region 210 is programmed to use digital signal processing block 250. It is believed, however, that this is more than offset by the avoidance of having to provide input routing that is dedicated to digital signal processing block 250. Digital signal processing block 250 could alternatively share input routing with the associated memory region 240, but it is believed preferable to share with logic regions 230 (e.g., because there are generally more logic regions than memory regions). As another possible alternative, each digital signal processing block 250 could get its inputs from more than one nearby region 270 of local interconnect. This might make it possible for use of a digital signal processing block 250 to less significantly impact the usability of the logic regions 230 also served by those regions 270 because less of the resources of each such region 270 would have to be turned over to the digital signal processing block 250. On the other hand, such an approach might mean that even more of the logic of programmable logic device 210 would be impacted by the use of a digital signal processing block, and that might be less desirable than a greater impact on a smaller amount of the logic.

On the output side, the output drivers of logic regions 230 and logic elements 330 of the same and adjacent super-regions 220 may receive the outputs of digital signal processing block 250 and may be used to drive the outputs of digital signal processing blocks 250 (or signals based on those outputs) out into the general-purpose interconnect of programmable logic device 210, which saves having to provide separate output drivers that are dedicated to the outputs of digital signal processing blocks 250. The outputs may be fed to the first few columns of logic elements 230 and 330 through PLC 260* and local interconnect 270. This is a significant saving in an expensive and power-consuming resource (i.e., drivers). On the other hand, it may mean that the usability of other resources of the logic elements that receive the outputs of a digital signal processing block 250 is at least partly sacrificed when that digital signal processing block 250 is being used.

Examples of techniques for operating on outputs of digital signal processing blocks in adjacent super-region are illustratively described in U.S. patent application Ser. No. 09/924,354, entitled Programmable Logic Devices with Function-Specific Blocks, filed on Aug. 7, 2001, which is hereby incorporated herein in its entirety.

It should also be pointed out that deriving the inputs for a digital signal processing block 250 from a region of local interconnect 270* that is already provided for use in routing signals to logic regions 230 gives the digital signal processing block 250 the benefit of flexible input routing because such flexible routing is typically an attribute of local interconnect 270. Also, as has already been at least suggested, deriving inputs for a digital signal processing block 250 from local interconnect 270* that is associated with logic regions 330 rather than with memory region 240 allows independent operation of the digital signal processing block 250 and the memory region in each super-region 220.

A digital signal processing block may sometimes have dimensions that may occupy an area that is approximately the same size as a region of a programmable logic device. For example, with reference now to FIG. 4, programmable logic device 70 may include a column of regions that includes digital signal processing region 78 (e.g., a digital signal processing block) and programmable logic regions 72. Programmable logic regions 72 may each include a plurality of regions 74 of programmable logic and a region 76 of memory. Each region 72 may also include some relatively local interconnection resources such as programmable logic input connectors 80, local interconnection regions 82 (e.g., conductors, PLCs, etc.), logic-element-feeding conductors 84, memory-region-feeding conductors 86, programmable logic output connectors 88, drivers 90, logic-element-output conductors 92, output conductors 94 and input conductors 96. Local interconnect 82, regions 74 of programmable logic, and logic-element-feeding conductors 84 have illustratively been described in connection with FIG. 3.

To avoid having to dedicate a large amount of interconnection resources to digital signal processing region 78, digital signal processing region 78 may be arranged to use interconnect resources from one (or more) of local interconnect regions 82 that supply inputs to adjacent logic regions 74 in an adjacent programmable logic region 72. In the particular example shown in FIG. 4, Some or all of local interconnect regions 82 of the last programmable logic region 72 in the column of programmable logic regions 72 may supply inputs to digital signal processing region 78. Local interconnect region 82 may be used to form some of the interconnect resources of digital signal processing region 78 because of its relatively close proximity to digital signal processing region 78. Conductors 96 are provided from local interconnect regions 82 to digital signal processing region 78. When digital signal processing region 78 is operating, conductors 96 may supply the inputs of digital signal processing region 78. Thus, when digital signal processing region 78 is operating, it effectively "steals" some of the local routing provided for logic region input in adjacent programmable logic region 72. Conductors 84 apply what may be thought of as the primary inputs to each logic element 102 (although logic elements may also have other inputs).

Figure 4:
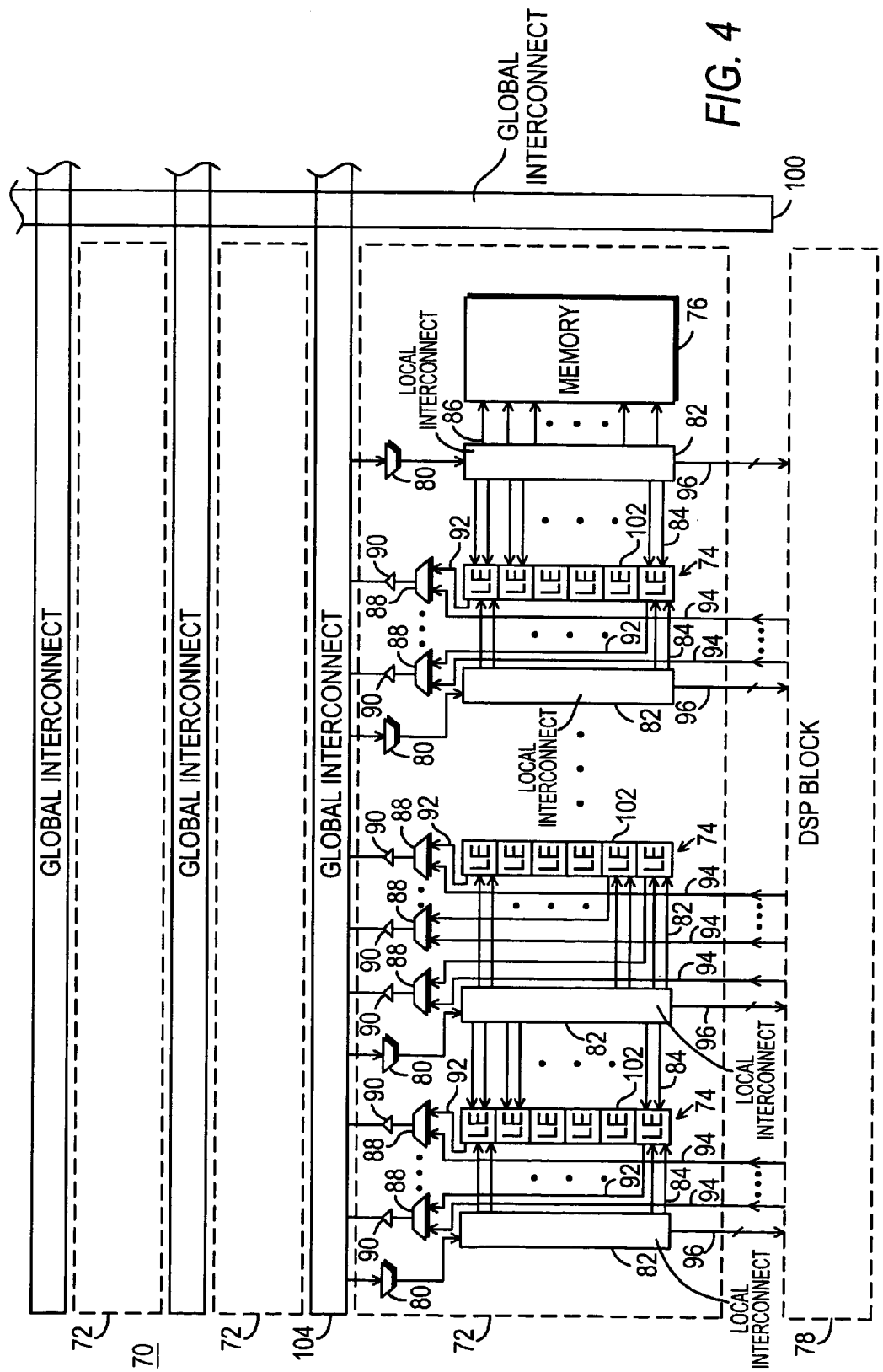
FIG. 4 is a simplified schematic block diagram of representative portions of an illustrative embodiment of a programmable logic device having a column of programmable logic regions that includes one region of digital signal processing circuitry constructed in accordance with the present invention.

The outputs of logic elements 102 are typically applied to local interconnect resources 82 and other more general-purpose interconnection resources such as global interconnect 104 associated with a row of programmable logic regions 72 from which that logic element output came. In FIG. 4, the outputs of logic elements 102 (or signals that are based on the outputs of logic elements 102) may be carried to programmable logic output connectors 88 using conductors 92.

The output of each digital signal processing region 78, which may include approximately as many bits as a programmable logic region 72, may be carried by dedicated conductors 94 to programmable logic output connectors 88. Each programmable logic output connector 88 may be associated with a driver 90 that is connected between that programmable logic output connector 88 and global interconnect 104. Thus, the outputs of digital signal processing region 78 are at least initially conveyed on dedicated but relatively local output conductors 94.

If desired, output conductors 94 may be arranged to supply output signals to local interconnect regions 82. In such arrangements, programmable logic output connecters 88 and drivers 90 may be part of local interconnect regions 82.

The outputs of digital signal processing region 78 therefore do not (at least initially) consume any of the more general-purpose routing and do not require dedicated drivers. This saves on power and device size. In addition, this (at least initial) dedicated output routing for digital signal processing region 78 reduces the potential for congestion in the general purpose routing.

The organization of the circuitry shown in FIG. 4 avoids the need to solely dedicate either output registers or output drivers to digital signal processing region 78. The outputs of digital signal processing region 78 may be driven out into the general purpose interconnect of programmable logic device 70 by drivers 90 to which the outputs of digital signal processing region 78 are conveyed or if desired, by drivers that are internal to local interconnect regions 82 to which the outputs of digital signal processing region 78 may be conveyed.

Vertical global interconnection resources 100 are provided for making general purpose interconnections between the rows of programmable logic super-regions 72. Interconnect circuitry may be provided that connects (e.g., programmably connects) horizontal global interconnection resources 104 with vertical global interconnections 100. Inputs for programmable logic input connectors 80 may be from horizontal interconnect resources 104.

It will be appreciated that the sharing of local interconnect resources between adjacent programmable logic region 72 and digital signal processing region 78 may sacrifice the usability of some of the adjacent programmable logic region 72 when digital signal processing region is being operated. However, the sacrifice in the usability of some or all of the adjacent programmable logic region 72 may be offset by the avoidance of having to provide input routing that is dedicated to digital signal processing region 78. In some instances, the use of local interconnect resources of the adjacent programmable logic region for providing input and output resources for digital signal processing region 78 may result in essentially sacrificing the adjacent programmable logic region 72 for the benefit of digital signal processing region 78. Such a sacrifice may only impair a single programmable logic region 72 in a full column of programmable logic regions 72.

Output drivers 90 or output drivers of local interconnect regions 82 may be used to drive the outputs of digital signal processing region 78 (or signals based on those outputs) out into the general purpose interconnect of programmable logic device 70. The use of output drivers 90 or output drivers of local interconnect regions 82 avoids having to provide separate output drivers that are dedicated to the outputs of digital signal precessing super-region 78.

Programmable logic device 70 may include a plurality of columns of programmable logic regions 72 that may each include one or more digital signal processing regions 78.

Horizontal global interconnect resources 104 and vertical global interconnect resources 100 may be arranged in programmable logic device 70 to extend past a plurality of programmable logic regions without extending to digital signal processing region 78. Horizontal global interconnect resources 104 and vertical global interconnect resources 100 may be configured for connection and support of programmable logic region 72. Digital signal processing region 78 may have (e.g., may only have), access to the global interconnect resources through the local interconnect resources of adjacent programmable logic region 72.

Other arrangements of programmable logic regions, memory regions, and digital signal processing regions may also be used. For example, with reference now to FIG. 5, programmable logic device 106 illustrates a top-level block assignment for a representative portion of a programmable logic device having one or more digital signal processing blocks. For clarity and to avoid over-crowding FIG. 5, the location of some of the circuitry of programmable logic device 106, such as global interconnect resources, are not explicitly specified. As shown, programmable logic device 106 may include logic array blocks 108, digital signal processing block 110, small embedded array blocks 112, medium embedded array blocks 114, memory region 116, filler cells 118, input/output interfaces 120, address register row 122, and data register column 124.

Figure 5:
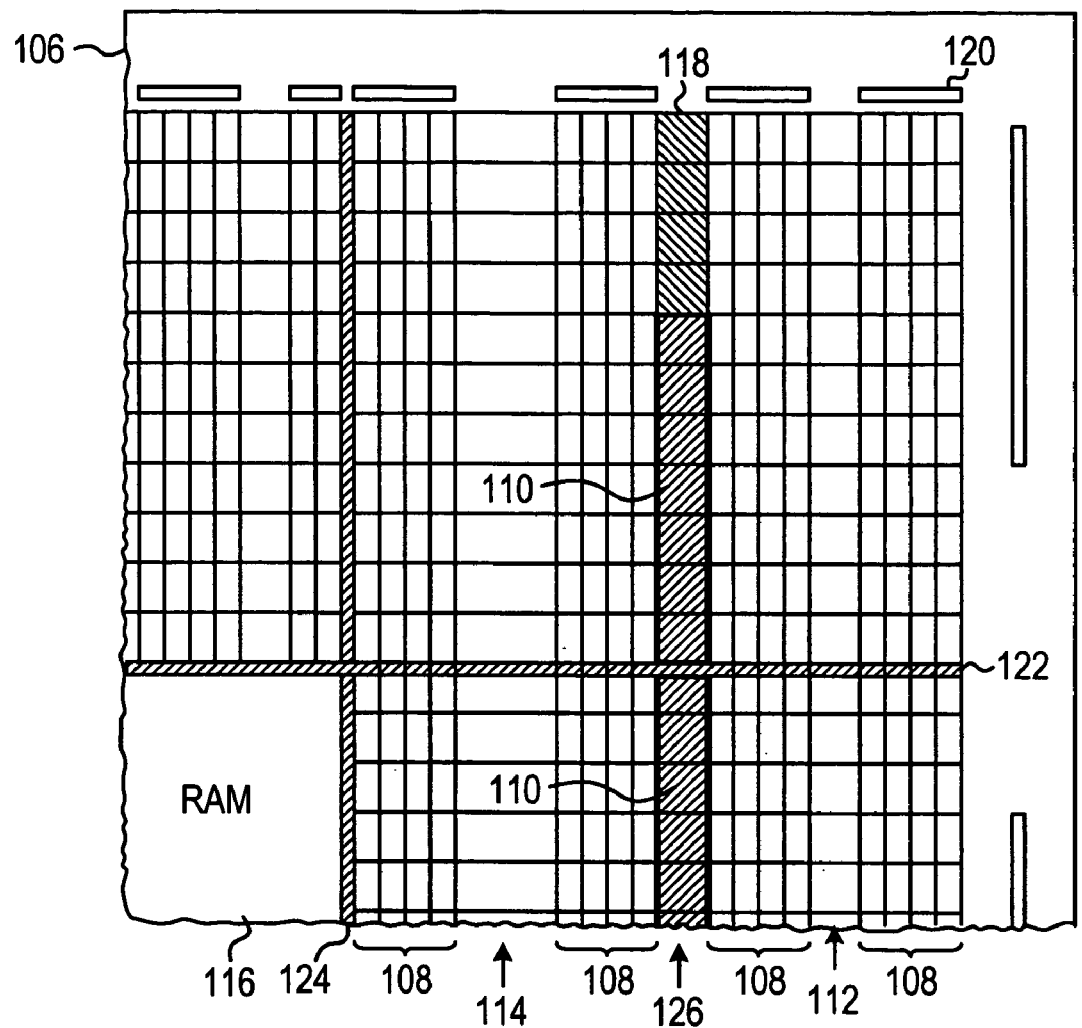
FIG. 5 is a diagram of an illustrative top-level floor plan of one illustrative embodiment of a programmable logic device having columns of digital signal processing circuitry in accordance with the present invention.

An integer number of digital signal processing blocks 110 may be included in column 126 of programmable logic device 106. Filler cells 118 may be used in some of the rows in column 126 to provide an interface for logic array blocks 108 neighboring a row that does not include circuitry for one of digital signal processing blocks 110. Each digital signal processing block 110 may extend across a specific number of rows of logic array blocks 108. For example for illustrative purposes, digital signal processing block 110 is shown to extend across eight rows of logic array blocks 108. Programmable logic device 106 may include a plurality of columns 126 that contain digital signal processing blocks 110 (a single column 126 is shown in FIG. 5 for illustrative purposes). Each column 126 of digital signal processing blocks 110 may include filler cells 118.

Column 126 of digital signal processing blocks 110, which includes areas concentrated with digital signal processing circuitry, may be provided in programmable logic device 106 at the expense of layout space for other programmable logic device resources. For example, column 126 may be provided at the expense of approximately one column of small embedded array blocks 112 or two columns of logic array blocks 108 (logic array blocks 118 in FIG. 5 are grouped in columns of four). The loss in the availability of the layout space of column 126 for implementing other resources may be offset by shifting the substantial processing load involved in digital signal processing operations substantially or entirely to column 126. Digital signal processing intensive operations may involve multistage digital signal processing operations, such as IIR filtering operations, FIR filtering operations, etc. Without such specialized circuitry, programmable logic device 106 may not be capable of suitably implementing programmable logic device applications that include some digital signal processing intensive operations. Programmable logic device applications that involve operations that are digital signal processing intensive that may not be suitably handled by general programmable logic resources may include wireless communications applications, video image processing applications, video communications applications, etc.

Each logic array block 108 may include a programmable logic element and registers to implement simple, single-level logic functions, such as to implement one bit of an adder. Small embedded array blocks 112 and medium embedded array blocks 114 may be used to implement memory or logic functions. Small embedded array blocks 112 and medium embedded array blocks 114 may be programmable logic circuitry that may be used to implement single-stage logic functions that are more complex than logic functions available through individual logic array blocks 108. Small embedded array blocks 112 and medium embedded array blocks 114 may be programmable circuitry that can be configured to operate as memory (e.g., RAM). Small embedded array blocks 112 and medium embedded array blocks 114 may have a greater number of input lines than an individual logic array block 108. Small embedded array blocks 112 and medium embedded array blocks 114 may each have a larger footprint than an individual logic array block 108.

Address register row 122 may include register circuitry that is used to route signals to different addresses in programmable logic device 106. Data register column 124 may include register circuitry that is used to route data or control signals. Memory 116 may be a block of random access memory circuitry. Input/output interfaces 120 may be input/output interface circuitry for communicating with circuitry external to programmable logic device 106.

Figure 6:
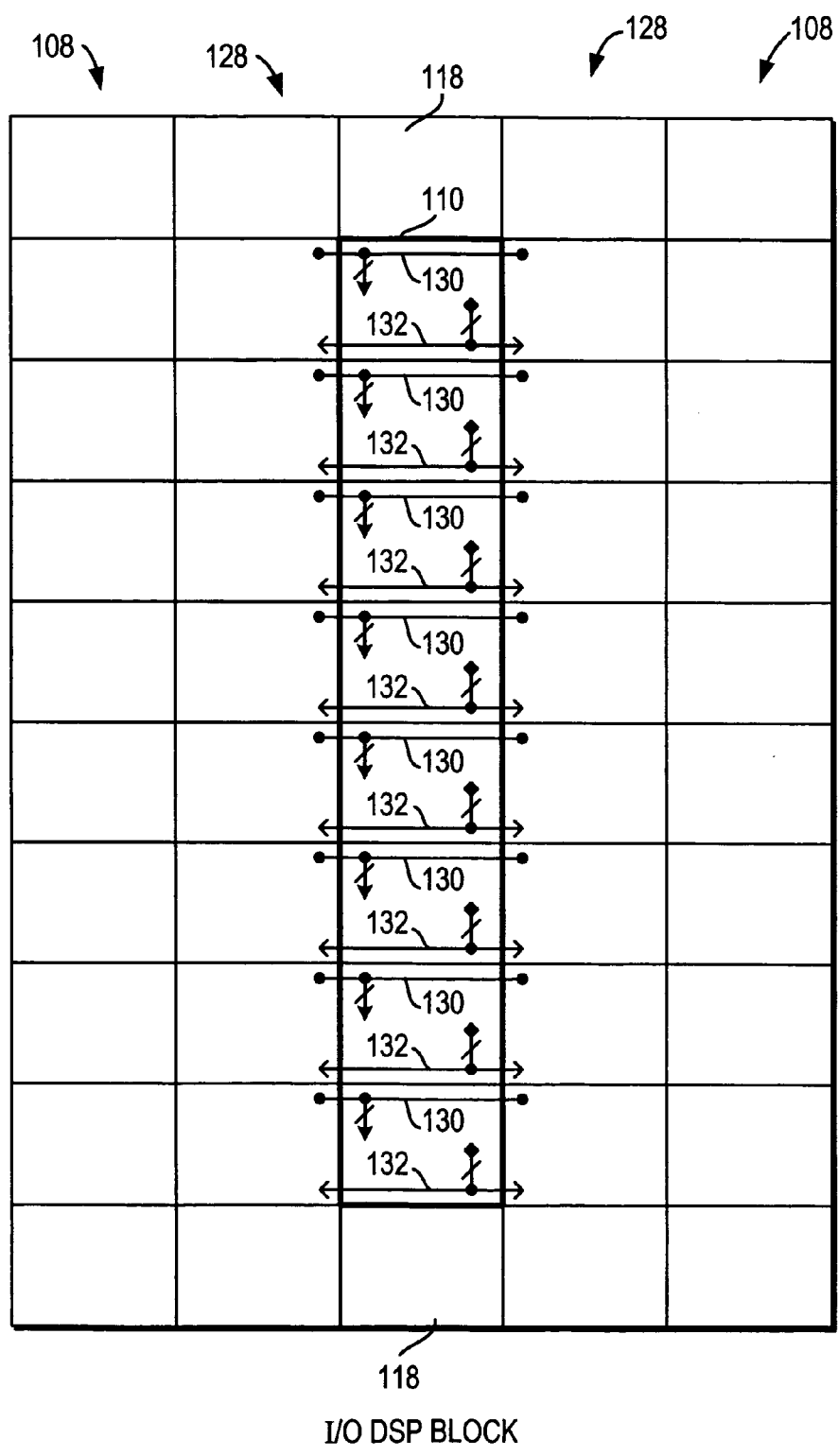
FIG. 6 is a diagram of an illustrative high-level input/output interface organization for a column of digital signal processing circuitry in a representative section of a programmable logic device (e.g., the programmable logic device of FIG. 5) in accordance with the present invention.

A subsection of programmable logic device 106 is illustratively shown in FIG. 6. With reference now to FIG. 6. Digital signal processing block 110 may stretch approximately the length of eight rows of logic array blocks 108. If desired, other lengths may also be used for digital signal processing block 110 (e.g., other lengths that may depend on the architecture, organization, complexity or circuit concentration involved). Input/output interface circuitry 128 for digital signal processing block 110 may be provided on both sides of digital signal processing block. Interface circuitry 128 may be arranged in blocks that are in columns adjacent to logic array blocks 108. Each block of interface circuitry 128 may provide a specific number of inputs that may include data inputs, control inputs, or both. The inputs may be provided to a particular row in digital signal processing block 110 for use by the circuitry in that row of digital signal processing block 110. Each block of interface circuitry 128 may also receive outputs 132 from an adjacent region of digital signal processing block 110. Outputs 132 may be data outputs and may be fewer in bits than inputs 130. For example, inputs from each block of interface circuitry 128 may pass 20 bits of information (e.g., 18 bits of data and 2 bits of control information) to a row of digital signal processing block 110 and may receive 18 bits of output data from that row of digital signal processing block 110.

Filler cell 118 may include circuitry that is used to connect pairs of logic array blocks 108 in a row that does not include circuitry for digital signal processing block 110. Interface circuitry 128 may be used with filler cells 118 to connect such pairs of logic array blocks 108.

Digital signal processing block 110 of a programmable logic device may include multiple digital signal processing stages for providing one or more particular digital signal processing tasks. For example, with reference now to FIG. 7, digital signal processing block 110 may include multiplier circuit 136 add-subtract-accumulate circuit 144, and add-subtract circuit 140. Digital signal processing block 110 is illustrated in FIG. 7 to provide an example of the different stages of digital signal processing block 110 and to generally indicate the direction of signal flow through those stages.

A first stage of digital signal processing block 110 may be multiplier circuit 136. Multiplier circuit 136 may be an n×n multiplier. Multiplier circuit 136 may be substantially dedicated to operating as a multiplier. Multiplier circuit 136 may have an output that is the result of multiplier circuit 136 multiplying two n bit-wide inputs. Multiplier circuit 136 may be configured to operate as one 2n×2n multiplier (e.g., 32×32 multiplier), four n×n multipliers (e.g., four 16×16 multipliers) or eight n/2×n/2 multipliers (e.g., eight 8×8 multipliers). Multiplier circuit 136 may include circuitry that is arranged (e.g., arranged to be dedicated) to perform as a multiplier (e.g., a 2n×2n multiplier, an n×n multiplier, an n/2×n/2 multiplier). Multiplier circuit 136 may include independent parallel multipliers.

The second digital signal processing stage of digital signal processing block may be an add-subtract-accumulator. For example, the second stage may be add-subtract-accumulate circuit 144. Add-subtract-accumulate circuit 144 may be digital signal processing circuitry that is substantially dedicated to operating as an adder, a subtracter, or an accumulator. Add-subtract-accumulate circuit 144 may be controlled to dynamically switch between operating as an adder, a subtracter, or an accumulator. If desired, add-subtract-accumulate circuit 144 may be programmable to select whether add-subtract-accumulate circuit 144 is to operate as an adder, a subtracter, or an accumulator. An accumulator operation may encompass cumulative summing or subtracting of numbers. Add-subtract-accumulate circuit 144 may have input signals that are from multiplier circuit 136. The inputs of add-subtract-accumulate circuit 144 may be dedicated to receiving outputs from multiplier circuits 136. Add-subtract-accumulate circuit 144 may include circuitry that is arranged (e.g., arranged to be dedicated) to perform an add operation, a subtraction operation, and/or an accumulation operation.

A third stage of digital signal processing block 110 may be add-subtract circuit 140. Add-subtract circuit may be substantially dedicated to operating as an adder or subtracter. The state of add-subtract circuit 140 may be programmable or be dynamically switched between adder and subtracter states. Add-subtract circuit 140 may have input signals that are from add-subtract-accumulate circuit 144. Add-subtract circuit 140 may have inputs that are dedicated to receiving outputs of add-subtract-accumulate circuit 144. Add-subtract circuit 140 may include circuitry that is arranged (e.g., arranged to be dedicated) to perform addition operations or subtraction operations.

The direction of signal flow may be from multiplier circuit 136 through add-subtract-accumulate circuit 144 and add-subtract circuit 140 and out to the rest of the programmable logic device of digital signal processing block 110. Control signals 148 may be applied to digital signal processing block 110 to provide timing and other programming and/or data controls for digital signal processing block 110. Digital signal processing stages 140 and 144 may be included in digital signal processing block 110 to complement the multiplier stage 136 in implementing typically used digital signal processing tasks. Localizing digital signal processing circuitry and interconnect resources to support multiplier circuit 136 in an area near multiplier circuit 136 and/or dedicating the supporting digital signal processing circuitry and interconnect resources exclusively to operating with multiplier circuits 136 may avoid processing delays and may avoid placing a substantial processing burden on programmable logic regions and interconnect resources that may occur when programmable logic array blocks (or regions), small embedded array blocks, medium embedded array blocks, and/or global interconnect resources are used to implement digital signal processing intensive operations.

If desired, digital signal processing block 110 may include pipeline registers. For example, with reference now to FIG. 8, digital signal processing block 110 may include pipeline register circuit 150. Pipeline register circuit 150 may have input signals that are from multiplier circuit 136. Pipeline register circuit 150 may feed the inputs of add-subtract-accumulate circuit 144. As mentioned above, pipeline techniques may be applied internal to different stages in digital signal processing block 110 by for example including pipeline registers within a digital signal processing stage. Pipeline register circuit 150 may include bypass circuitry for bypassing the pipeline registers in pipeline register circuit 150 when routing input signals to add-subtract-accumulate block 144.

If desired, digital signal processing block 110 may include output selection circuit 152. Output selection circuit 152 may have input signals that are from add-subtract circuit 140. Output selection circuit 152 may have n bits of input and may select which subset of the n bit input will be the output of digital signal processing block 110. The selection of which subset may vary based on which one of a plurality of available multistage digital signal processing operations is being currently performed by digital signal processing block 110. A plurality of conductors may apply signals to output selection circuit 152. Output selection circuit 152 may selectively pass desired signals that are from some or all of the conductors. If desired, the inputs of output selection circuit 152 may be received from multiplier circuit 136 without the input signals passing through add-subtract-accumulate circuit 144 and without passing through add-subtract circuit 140. If desired, the inputs of output selection circuit 136 may be received from add-subtract-accumulate circuit 144 without the input signals passing through add-subtract circuit 140. Also if desired, the inputs of output selection circuit 136 may be received from add-subtract circuit 140. Output selection circuit 152 is further discussed below.

If desired, digital signal processing block 110 may include output register circuit 154. Output register circuit 154 may include registers that register the output signals of digital signal processing block 110 and are interconnected with the interconnection resources of the programmable logic device in which digital signal processing block 110 is operating. If desired, output selection circuit 152 may feed the inputs of output register circuit 154. Output selection circuit 152 may be used to feed the inputs of output register circuit 154 when (e.g., whenever) digital signal processing block 110 supports more than one mode of operation.

In some embodiments, add-subtract circuit 140 may feed the inputs of output register circuit 154 (e.g., add-subtract circuit 140 may feed the inputs when digital signal processing block 110 does not include output selection circuit 152.)

Figure 9:
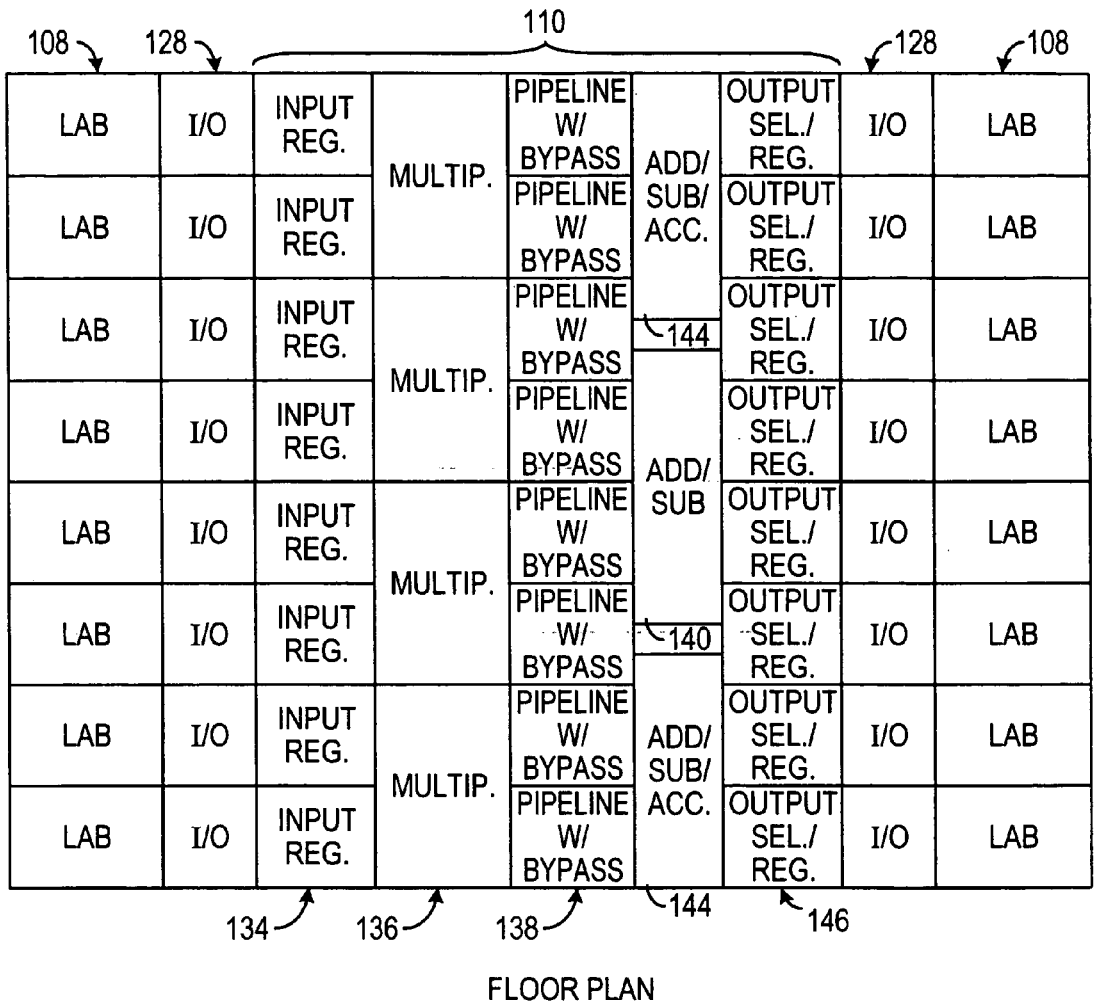
FIG. 9 is a diagram of an illustrative floor plan for a representative portion of a programmable logic device (e.g., the programmable logic device of FIG. 5) in accordance with the present invention.

Digital signal process block 110 may include multistage circuitry such as multistage circuitry of FIGS. 7 and 8 that is arranged to be concentrated in a particular area of a programmable logic device. For example, with reference now to FIG. 9, digital signal processing block 110 may include input register circuits 134, multiplier circuits 136, pipeline register circuits 138, add-subtract-accumulate circuits 144, add-subtract circuit 140, and output select/register circuits 146. Digital signal processing block 110 may span across approximately eight rows of logic array blocks 108 and may have a width that is approximately equal to two columns of logic array blocks 108. Other dimensions may also be used if desired. FIG. 9 illustrates one exemplary embodiment of digital signal processing block 110.

Input register circuits 134 may be arranged to be in a column. One input register circuit 134 in each row may register input signals from adjacent interface circuitry 128 in the same row. If desired, each input register circuit 134 may include circuitry for a scan chain. Examples of techniques for use of scan chains in supporting filtering are illustratively described in U.S. patent application Ser. No. 09/955,647, filed Sep. 18, 2001, which is hereby incorporated by reference in its entirety. If desired, input register circuits 134 may be programmed to pass input signals to multiplier circuits 136 without registering the input signals.

If desired, in some embodiments of digital signal processing block 110, digital signal processing block 110 may be implemented without including input register circuits 134. In such embodiments, sufficient local interconnect resources, such as conductors and programmable logic connectors, may be arranged to suitably receive input signals.

In digital signal processing block 110, multiplier circuits 136 (e.g., four 18×18 multipliers) are stacked vertically across the height of digital signal processing block 110. In some embodiments, the vertical dimension of the digital signal processing block 110 may be defined by the physical size of the multiplier circuits 136. Input register circuits 134 are constructed to the left of multiplier circuits 136. Input register circuits may feed the inputs of the multiplier circuits 136.

A plurality of pipeline register circuits 138 may be arranged in a column to the right of multiplier circuits 136. Multiplier circuits 136 may feed the inputs of pipeline register circuits 138. Pipeline register circuits 138 may include bypass circuitry that selectively bypass the registering of the digital processing signals through pipeline register circuits 138. If desired, pipeline techniques may be applied internal to multiplier circuits 136, internal to add-subtract-accumulate circuits 144, and/or internal to add-subtract circuit 140. Applying pipeline techniques to digital signal processing operations typically increases the operating speed of digital signal processing circuitry at the expense of higher latency. In a multistage digital signal processing operation (e.g., a filter), pipeline techniques are implemented to simultaneously feed signals to different stages of a digital signal processing block, rather than waiting until the operation of the entire block has been completed to feed signals to the digital signal processing block. In other words, pipeline registers are used to isolate the operation of a current stage from the operation of subsequent stages.

In digital signal processing block 110, add-subtract-accumulate circuits 144 and add-subtract circuits 140 are vertically stacked to the right of pipeline register circuits 138 and multiplier circuits 136. Pipeline register circuits 138 may feed the inputs of add-subtract-accumulate circuits 144. As mentioned above, in some embodiments, digital signal processing block 110 may be without pipeline register circuits 136. In such embodiments, multiplier circuits 136 may feed the inputs of add-subtract accumulate circuits 144. Add-subtract-accumulate circuits 144 may feed the inputs of add-subtract circuit 140. Sufficient interconnect resources may be provided to allow for add-subtract-accumulate circuits 144 to feed the inputs of add-subtract circuit 140. Add-subtract circuit 140 and add-subtract-accumulate circuits 144 may be arranged in other ways in digital signal processing block 110.

Output select/register circuit 146 may be placed vertically in a column to the right of add-subtract-accumulate circuits 144 and to the right of add-subtract circuit 140. Add-subtract circuit 140 may feed the inputs of output select/register circuits 146. Output select/register circuit 146 may be arranged one to a row, to feed the inputs of interface circuitry 128 in that same row. Output select/register circuits 146 may have capabilities, such as programmable output selection, registration of output signals or a combination thereof. Output select/register circuit 146 may be a combination of output selection circuit 152 and output register circuit 154 of FIG. 8. Within digital signal processing block 110 signals flow from the multiplier circuits 136 to output select/register circuit 146. In some embodiments, output select/register circuit 146 may simply be used to control when the output of digital signal processing block 110 is available for use within the rest (e.g., some parts) of a programmable logic device having digital signal processing block 110.

The arrangement shown in FIG. 9 is an illustrative arrangement. Other arrangements may also be used to implement digital signal processing block 110.

A digital signal processing block having dedicated multipliers in conjunction with supporting circuitry (e.g., add-subtract-accumulate circuits, registers, etc.) such as the multistage circuitry of FIGS. 7 and 8 may allow for the quick implementation of commonly used digital signal processing functions. The functions may be implemented using either an individual digital signal processing block or a group of digital signal processing blocks with high speed performance guaranteed by the dedicated hardware. The operation speed for such functions will not be impacted or limited for up to two stages by operations that are implemented in general programmable logic elements of programmable logic array blocks that are external to the digital signal processing block.

If desired, additional circuitry and routing (e.g., additional circuitry and/or routing that is dedicated to supporting a number of digital signal processing blocks) may be implemented to move data from one digital signal processing block to another digital signal processing block in the same programmable logic device. Such additional circuitry and routing allows higher performance digital signal processing functions to be supported and avoids the need to use general logic and/or general routing to support these functions.

Figure 10:
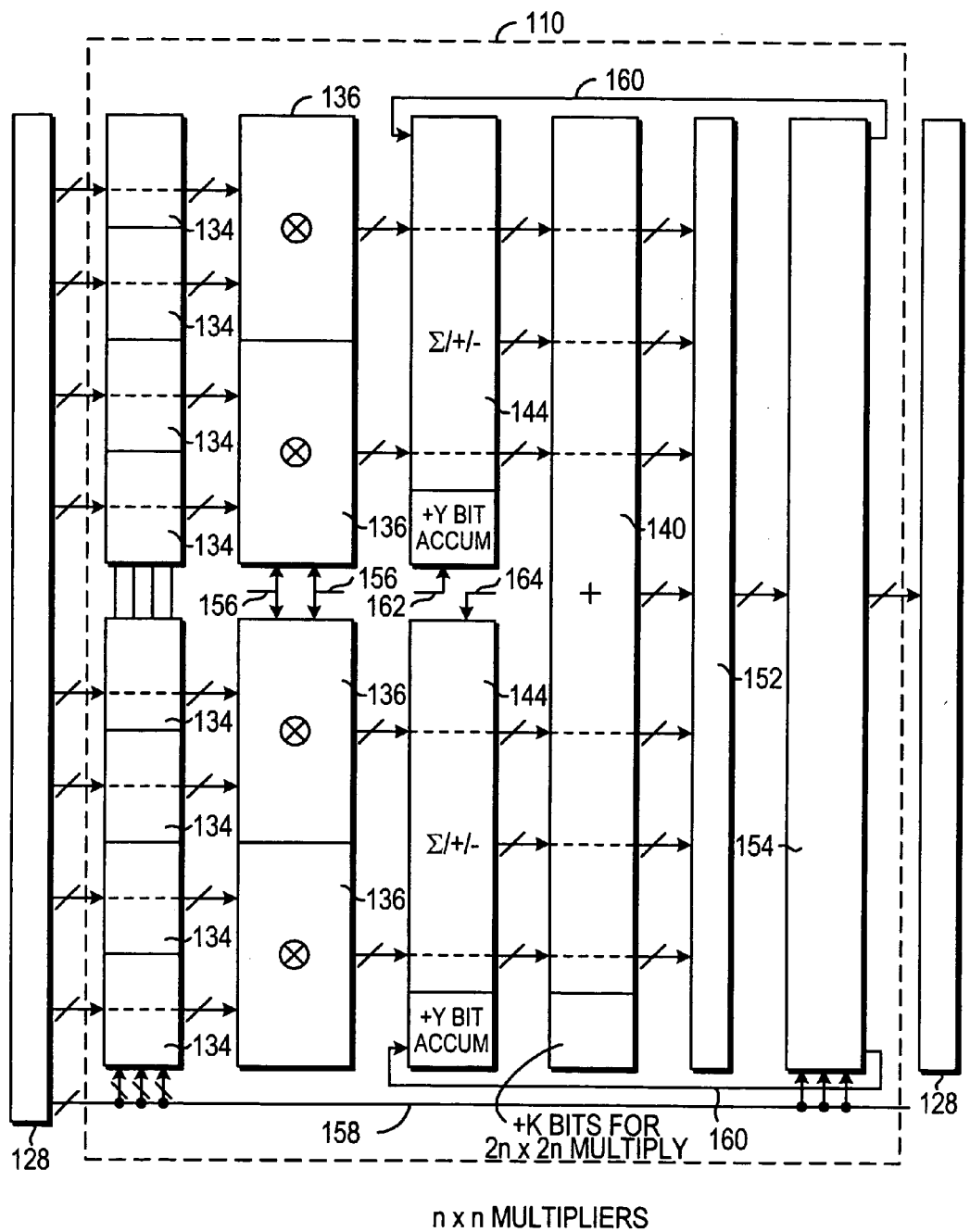
FIG. 10 is a functional block diagram of an illustrative digital signal processing region of a programmable logic device having, among other things, four parallel multipliers in accordance with the present invention.

Circuitry in digital signal processing blocks may be configurable to implement one of a limited number of multiplier based digital signal processing functions. In FIG. 10, a four-multiplier-based organization of a digital signal processing block (e.g., digital signal processing block 110 of FIG. 5) is shown. With reference now to FIG. 10, four multiplier circuits 136 may be stacked vertically to potentially operate in parallel. Each multiplier circuit 136 may include an n×n multiplier (e.g., 18 bit×18 bit multiplier) to provide an n×n multiplication product. The inputs of each multiplier circuit may be fed up to n bits of information for the multiplicand and for the multiplier for the multiplier operation. Each multiplier circuit 136 may have an output that may be 2n-bits wide. Each multiplier circuit 136 may feed an output downstream that is the resultant of a multiplication operation. Each n×n bit multiplier circuit 136 may support two's complement signed or unsigned multiplication. Dynamic signed/unsigned control inputs 156 may receive input signals that control the sign of the multipliers and the multiplicands for the multiplier operations of multiplier circuits 136.

Digital signal processing block 110 may include three sets of register circuits. Digital signal processing block 110 may include input register circuits 134, pipeline register circuits (e.g., pipeline register circuit 150 of FIG. 8), and output register circuit 154. If desired, additional pipeline register circuits may be included inside multiplier circuits 136, inside add-subtract-accumulate circuits 144, and/or inside add-subtract circuits 140 to increase speed. Output register circuit 154 may include approximately the same number of registers that are in input register circuits 134. The number of registers that are included in output register circuit 154 may be sufficient to register the output of digital signal processing block 110 (e.g., register the output of digital signal processing block 110 for all of the modes that are supported by digital signal processing block 110). The number of output registers may less than, equal to, or greater than the number of the input registers depending on what implementation or architecture is being used for digital signal processing block 110 or depending on the range of functionality that is being provided by digital signal processing block 110.

For clarity and brevity, pipeline register circuits are not shown in FIG. 10 and are not shown in some of the other FIGS. that are shown herein. As mentioned above, input register circuits 134, pipeline register circuit, or output register circuit 154 may be included in digital signal processing block 110 if desired. Independent sets of clock and clear signals 158 may be provided for input register circuits 134, the pipeline register circuit, or output register circuit 154. Two sets of clock and clear signals 158 may be provided for the input register circuits 134 and the pipeline register circuits, and two sets may be provided for output register circuit 154. As mentioned above, input register circuits 134 may include scan chains and may include additional circuitry to be used with the scan chains to allow the scan chains to be used as logic in some digital signal processing functions such as in providing FIR filters. Input register circuits 134 may include 8n registers (e.g., 144 registers) for 8n data inputs and q registers (e.g., 4 registers) for signed/unsigned control of multiplier circuits 136 and for add-subtract control of add-subtract-accumulate circuits 144. Each register may have programmable inversion capability to provide logic inversion, when desired, or to invert unused bits of register inputs when an input for a multiplier has less than n bits.

Output register circuit 154 may have feedback paths 160 to add-subtract-accumulate circuits 144 for accumulation operations. Any one of the three sets of registers, input register circuit 134, the pipeline register circuit, and output register circuit 154 may be bypassed using PLCs in those circuits that may be controlled by random access memory control. The pipeline register circuit may include approximately the same number of registers as input register circuits 134.

Interface circuitry 128 shown to the left of digital signal processing block 110 may feed the inputs of digital signal processing block 110, which may be the inputs of input register circuits 134. Input register circuits 134 may include eight input registers that each have n bit inputs and that feed the inputs of the four n×n bit multiplier circuits 136.

Add-subtract-accumulate circuits 144 may have connections for receiving inputs from multiplier circuits 136 and from return paths 160. If desired, add-subtract-accumulate circuits 144 may be configured to pass the outputs from multiplier circuits 136 to adder circuit 140. The outputs of multiplier circuits 136 may be routed to output selection circuit 152 or output register circuit 154 without being routed through add-subtract-accumulate circuits 144 and/or add-subtract circuit 140. For the purposes of clarity and brevity, add-subtract circuit 140 of FIG. 8 is described herein primarily in the context of only being an adder circuit. Add-subtract-accumulate circuits 144 may each be configured to perform a two's complement addition of two 2n bit inputs to produce a 2n+1 bit output. Add-subtract-accumulate circuits 144 may each be configured to perform a two's complement subtraction of two 2n bit inputs to produce a 2n+1 bit output. Add-subtract-accumulate circuits 144 may each be configured to perform an accumulation of one 2n bit input with an n+y bit output. Dynamic add/subtract control inputs 162 and 164 may be inputs to add-subtract-circuits 144 that are used to switch between addition and subtraction operations and to handle complex multiplications. Dynamic add/subtract inputs 162 and 164 may be needed for complex multiplications, which involves multiplications involving complex numbers. Complex multiplication of two complex numbers may sometimes involve both an addition operation and a subtraction operation.

The outputs of add-subtract-accumulate circuits 144 may be routed to output selection circuit 152 or output register 154 without being routed through adder circuit 140. If desired, adder circuit 140 may be configured to pass inputs from add-subtract-accumulate circuits 144 (e.g., n+1 bit output of two's complement addition, n+y bit output of accumulation, etc.). Adder circuit 140 may have an output that is the resultant of the addition of the outputs from add-subtract-accumulate circuits 144. Output selection circuit 152 may have inputs that are from adder circuit 140. Output selection circuit 152 may select which ones of the inputs of output selection circuits 152 are passed to output register circuit 154. Output register circuit 154 may feed the inputs of interface circuitry 128 shown to the right of digital signal processing block 110. The percent of local interconnect resources that is allocated for connecting the circuits in digital signal processing block 110 increases as the complexity and the variations in digital signal processing functionality increases from left to right in digital signal processing block 110.

Figure 11:
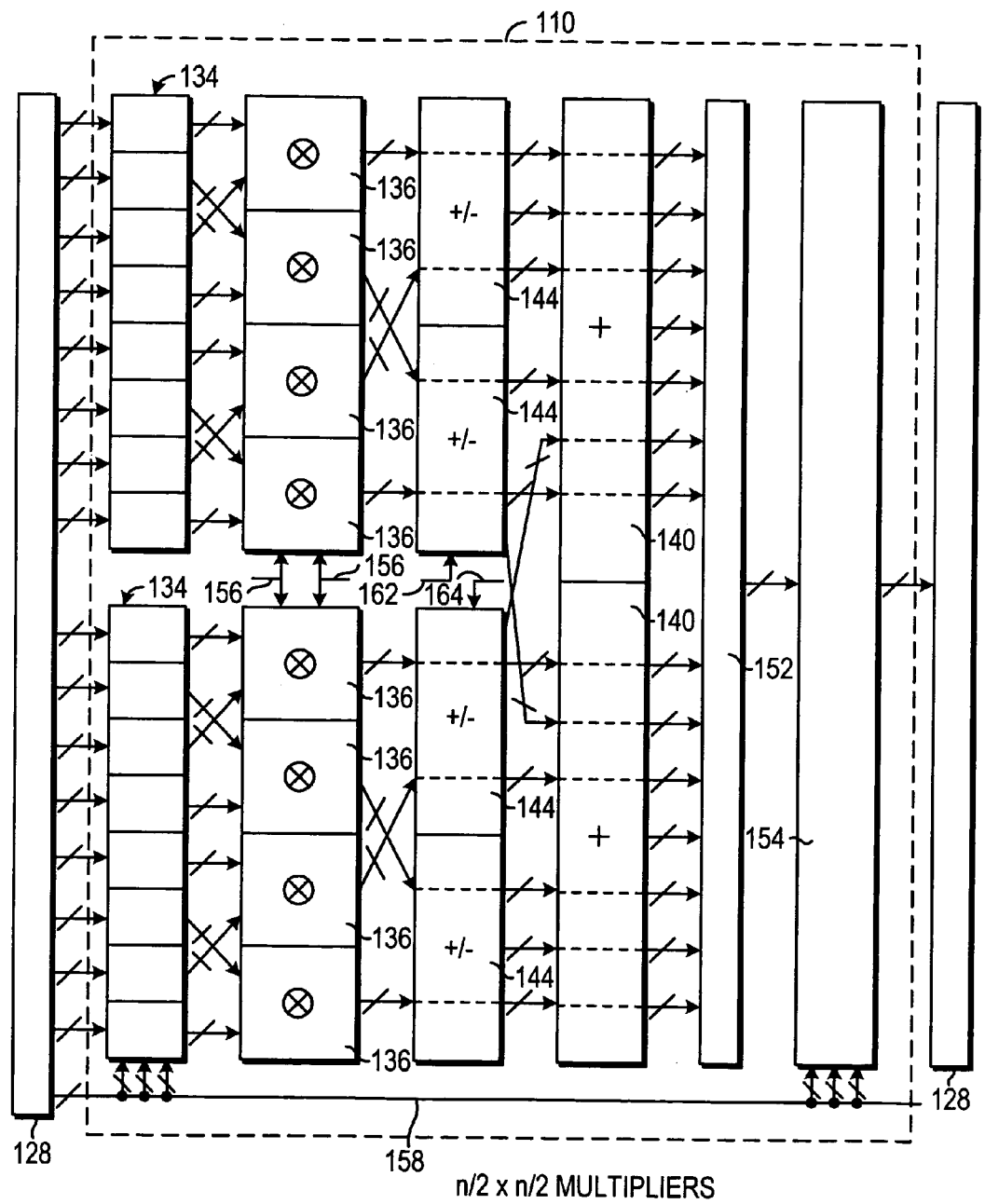
FIG. 11 is a functional block diagram of an illustrative digital signal processing region of a programmable logic device having, among other things, eight parallel multipliers in accordance with the present invention.

Digital signal processing block 110 may be configured to have an n/2×n/2 multiplier based organization. For example, with reference now to FIG. 11, digital signal processing block 110 may include multiplier circuits 136 that are configured to include eight n/2×n/2 multipliers. The eight n/2×n/2 multipliers may be configured from the four n×n multipliers of multiplier circuits 136 of FIG. 10.

If desired, digital signal processing block 110 may be implemented to be able to be configured to have a p×p multiplier based organization and to have one or more p/m×p/m multiplier based organizations where p, m, and p/m are integers. As mentioned above, this architecture is at least partially based on the limitations of the local interconnect resources. The different organizations may be selectable and block 110 may be capable of being configured into some or all of the p/m×p/m multiplier based organizations.

Digital signal processing block 110 may include add-subtract-accumulate circuits 144 configured to provide four add or subtract units. Each add or subtract unit may perform an addition-based operation on two n bit inputs and have an n+1 bit output. If desired, add-subtract-accumulate circuits 144 may be configured to pass the outputs of the n/2×n/2 multiplier operation. The outputs of multiplier circuits 136 may be routed to output selection circuit 152 or output register circuit 154 without being routed through add-subtract-accumulate circuits 144 or adder circuit 140. Add-subtract-accumulate circuits 144 may produce the resultant of the addition (or subtraction) of particular output pairs of the n/2×n/2 multiplier operation.

Digital signal processing block 110 may include adder circuit 140 configured to provide two adders. If desired, adder circuit 140 may pass the inputs that are fed to adder circuit 140 from add-subtract-accumulate circuits 144. The outputs of add-subtract-accumulate circuits 144 may be routed to output selection circuit 152 or output register circuits 154 without being routed through adder circuit 140. Adder circuit 140 may produce two outputs that are the resultants of the addition of particular pairs of outputs from add-subtract-accumulate circuits 144.

The local interconnect resources of digital signal processing block 110 may be configurable to implement the n/2×n/2 multiplier based organization with the same input/output interface circuitry 128 and supporting circuitry (e.g., multiplier circuits 136, adder circuit 140, etc.) as the n×n multiplier based organization. The local interconnect resources of digital signal processing block 110 may be configured to include some butterfly cross connection patterns for forming appropriate interconnections in the n/2×n/2 multiplier based organization.

The butterfly cross connection patterns are implemented for select interconnections between input register circuits 134 and multiplier circuits 136. The butterfly cross connection patterns may be used to have the n/2 higher order bits of pairs of n bit inputs multiplied together and to have the n/2 lower order bits of pairs of n bit inputs multiplied together. The butterfly cross connection patterns are implemented for select interconnections between multiplier circuits 136 and add-subtract-accumulate circuits 144. As mentioned above, add-subtract-accumulate circuits 144 may be configured to include four add (or subtract) units. Each add (or subtract) unit may have two n bit inputs from multiplier circuits 136. The butterfly cross connection patterns may be used to have the two inputs of each add (or subtract) unit be either the resultant of the multiplication of the higher order bits by the multipliers of multiplier circuits 136 or the resultant of the multiplication of the lower order bits by the multipliers of multiplier circuits 136. The butterfly cross connection patterns may also be used in the interconnect between add-subtract-accumulate circuits 144 and adder circuit 140. Adder circuit 140 may be split into two adders (e.g., two independent adders). The butterfly cross connection pattern may be used to feed the resultant of operations on higher order bits to a top half of adder circuit 140 and to feed the resultant of operations on lower order bits to a bottom half of adder circuit 140. In the n/2×n/2 multiplier based organization, accumulator functionality may not be available. Accumulator functionality may not be available because the resources of digital signal processing block 110 may be substantially consumed in allowing for the implementation of the n/2×n/2 multiplier based organization.

Figure 17:
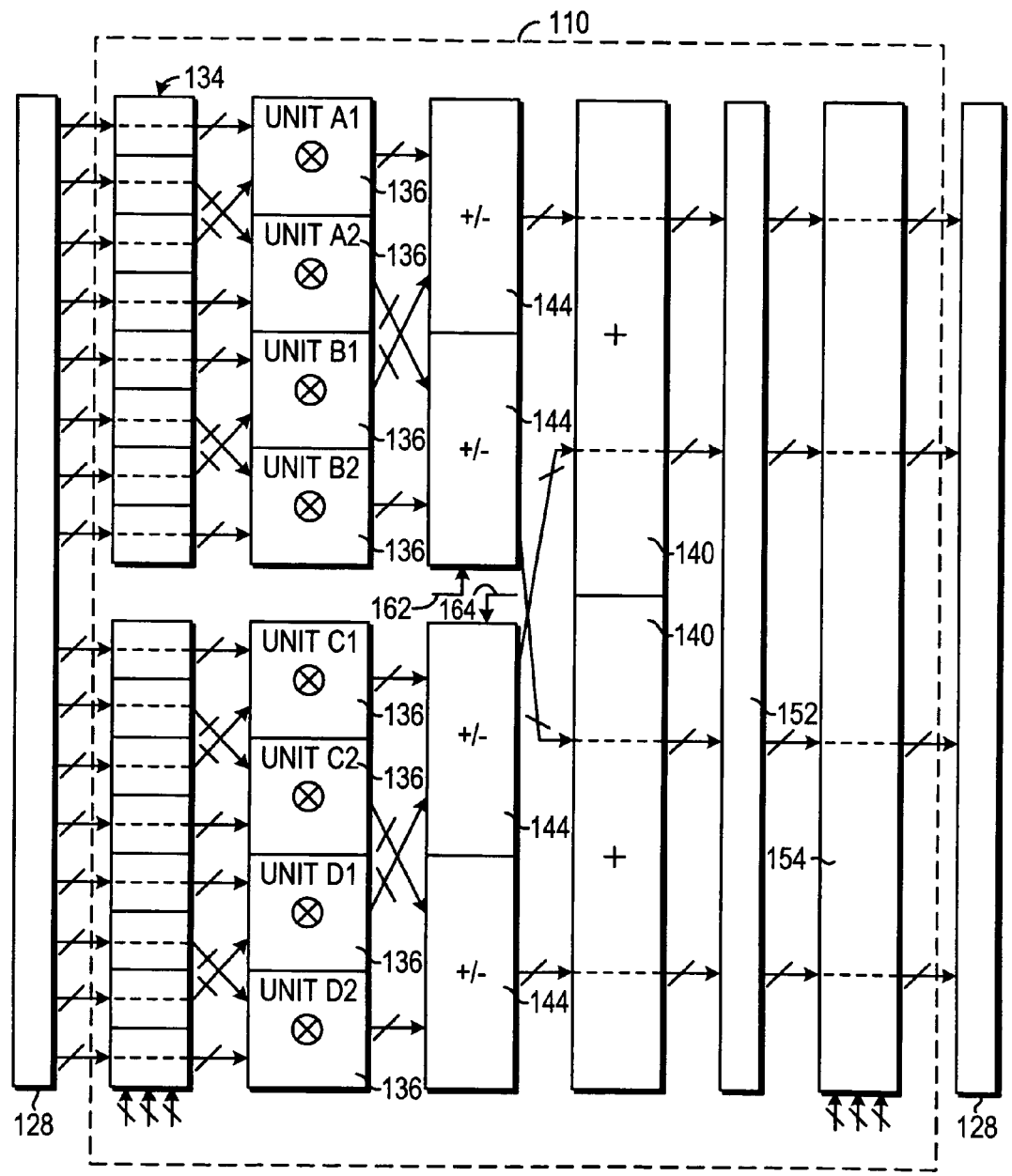
FIG. 17 is a functional block diagram of an illustrative digital signal processing region of a programmable logic device (e.g., the digital signal processing region of FIG. 10) in a sixth configurable mode in accordance with the present invention.

The butterfly cross connection patterns are exemplary of techniques for decomposing a single multiplier circuit into multiple smaller multiplier circuits, exemplary of techniques for managing data so that the outputs of the multiple smaller multiplier circuits are appropriately added together (e.g., adding lower order bits to lower order bits), or exemplary of techniques for managing data to compensate for limitations in the resources of a digital signal processing block (e.g., see the digital signal processing operations discussed in connection with FIG. 17). Such cross connect patterns may be used to handle connections because of the way that circuitry for a digital signal processing block was laid down or because of the arrangement that was selected for the circuitry. The butterfly cross connection patterns are provided as an illustrative example. Other techniques may also be used. For example, the n×n multipliers may be decomposed in a different way that eliminates the need for the butterfly cross connection patterns or decomposed in a way that may require different types of cross connect patterns. Accordingly, other cross connection or connection patterns may be used to implement digital signal processing block 110.

The flexibility and configurability of digital signal processing block 110 may support the configuration of a set of digital signal processing modes. If desired, digital signal processing block 110 of FIG. 10 and digital signal processing block 110 of FIG. 11 may each be a separate embodiment of a digital signal processing block with each having its own set of digital signal processing modes. In some embodiments, digital signal processing block 110 may be configurable between having an n×n multiplier based organization or an n/2×n/2 multiplier based organization and having digital signal processing modes that are associated with each. The modes of digital signal processing block 110 may be configured with memory bits to make the modes available to users.

Figure 12:
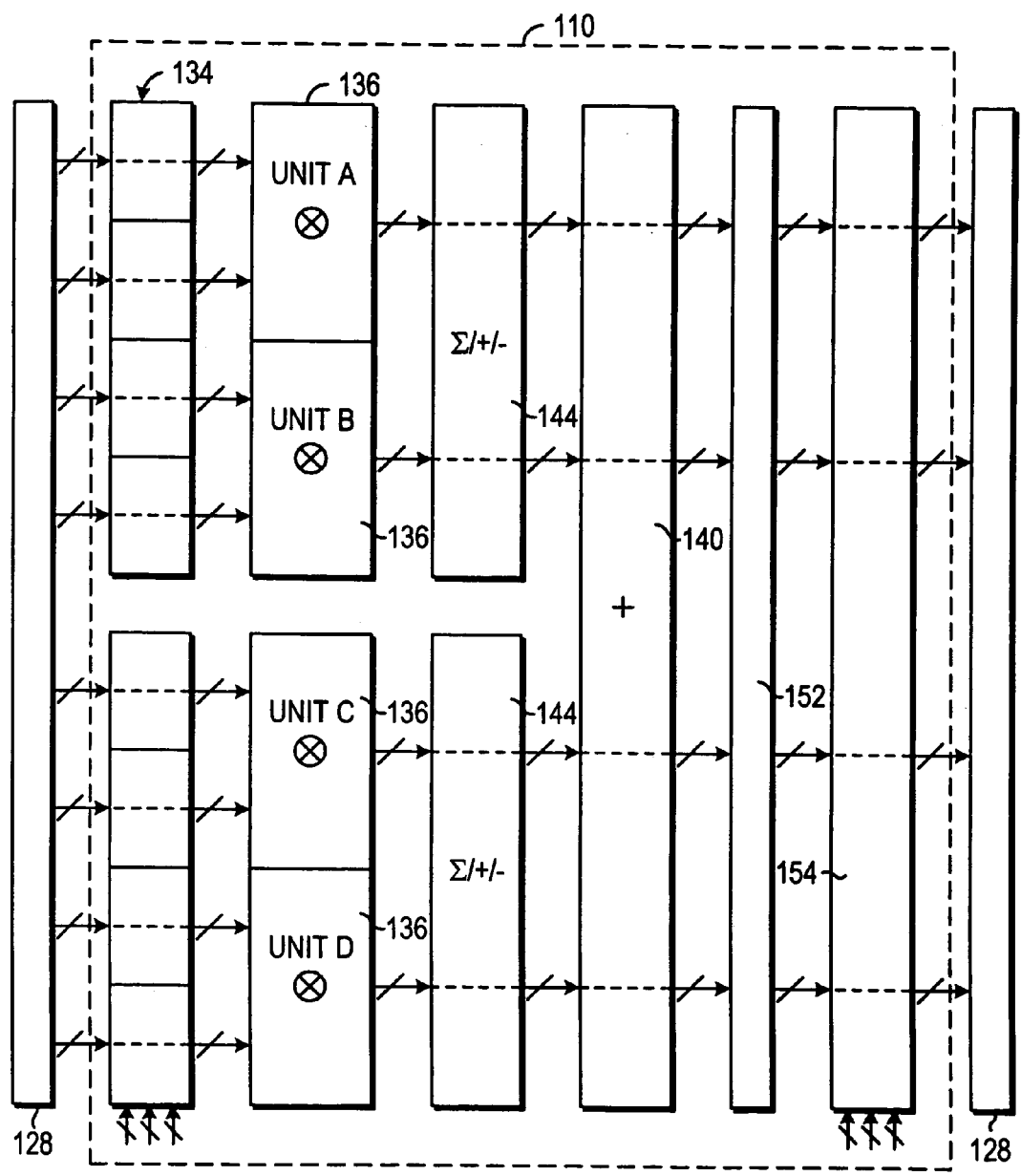
FIG. 12 is a functional block diagram of an illustrative digital signal processing region of a programmable logic device (e.g., the digital signal processing region of FIG. 10) in a first configurable mode in accordance with the present invention.

A first mode of digital signal processing block 110 may provide the resultants of four n×n multipliers (A, B, C, and D). For example, with reference now to FIG. 12, digital signal processing block 110 may have an n×n multiplier based organization. The outputs of the first mode of digital signal processing block 110 is the resultant of four n×n multiplier circuits, multiplier circuits A, B, C, D 136. Each n×n multiplier circuit 136 may support two's complement n bit signed or n bit unsigned multiplication. Two dynamic signed/unsigned control signals may be supplied to support any combination of signed/unsigned multiplier operations. Memory bits may be used to control signed/unsigned multiplier operation if dynamic control is not desired. Each of n×n multipliers A, B, C, and D 136 may have a 2n bit-wide output. All four 2n bit outputs are routed out by digital signal processing block 110. Local interconnect resources may be included in digital signal processing block 110 to route the outputs of multiplier circuits A, B, C, and D 136 out of digital signal processing block 110 (e.g., through output register circuits 152) without using circuitry internal to add-subtract-accumulate circuits 144 or internal adder circuit 140. The outputs of multiplier circuits A, B, C, and D 136 may be fed through add-subtract-accumulate circuits 144 and through adder circuit 140 in routing out the outputs. The output of digital signal processing block 110 may be four 2n bit-wide outputs that are routed to the global interconnect resources of the programmable logic device.

A second configurable mode of digital signal processing block 110 may provide multiply-and-accumulate operations. For example, with reference now to FIG. 13, two independent multiply-and-accumulate operations may be implemented using the 2n bit outputs of n×n multiplier circuits B and D 136 (accumulate +/− the output of B, accumulate +/− the output of D). An accumulator operation may be implemented with add-subtract-accumulate circuits 144 and output register circuit 154 feeding appropriate output signals from output register circuit 154 back to add-subtract-accumulate circuits 144 via feedback paths 160. Digital signal processing block 110 may have an n×n multiplier based organization. Four of input register circuits 134 may support operations in this mode. The four input register circuits may each have n bit inputs and n bit outputs. Multiplier circuits B and D 136 may each feed their 2n bit output to the input of one of add-subtract-accumulate circuits 144. Each of the top and bottom add-subtract-accumulate circuits 144 may have an n+y bit accumulate output that is the resultant of adding the output of a corresponding one of multiplier circuits 136 with an n+y bit feedback output from output register circuit 154. The output of each add-subtract-accumulate circuit 144 may include an overflow flag bit, which would make the overall number of output bits of each add-subtract-accumulate circuit 144 to be n+y+1 bits.

Figure 13:
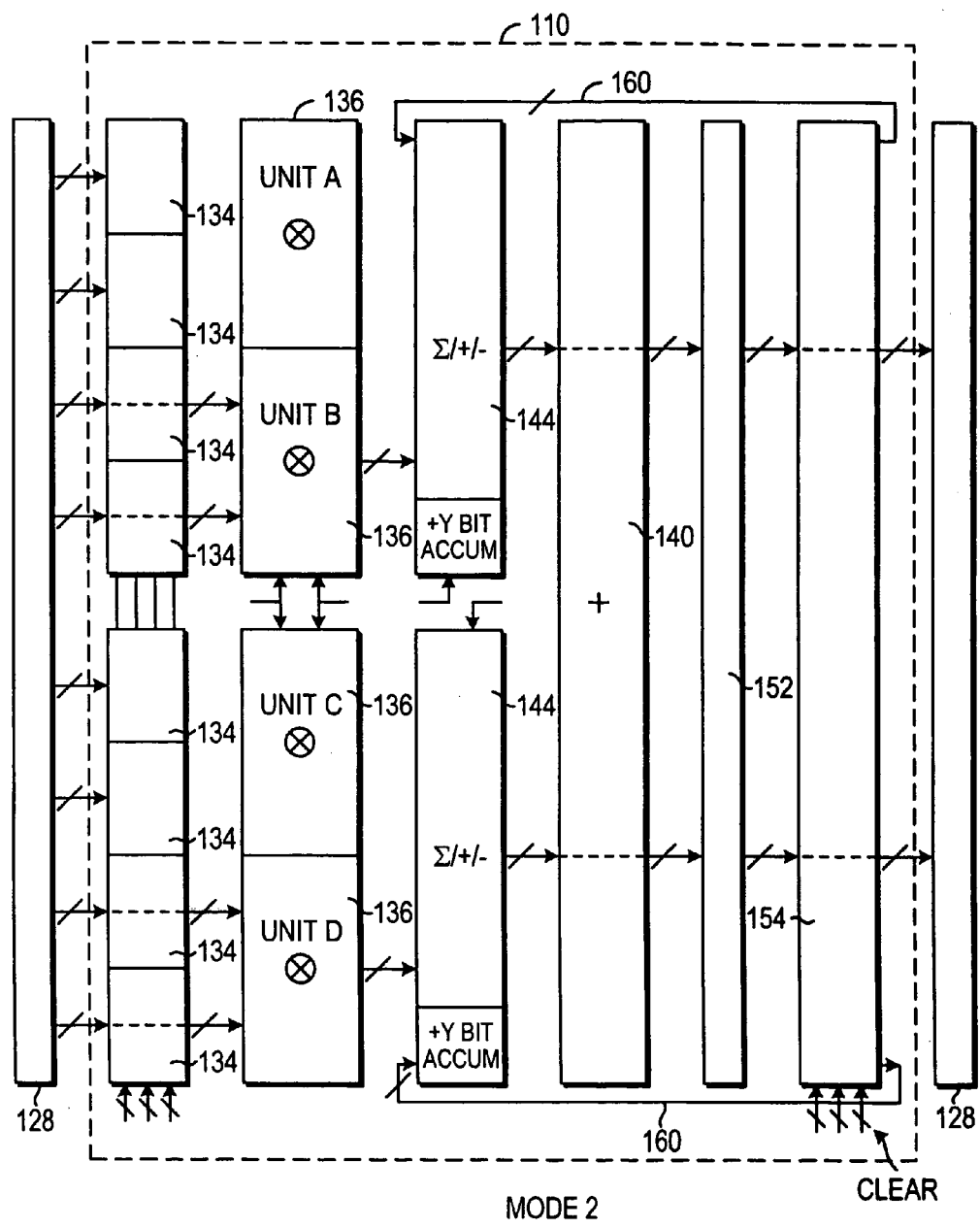
FIG. 13 is a functional block diagram of an illustrative digital signal processing region of a programmable logic device (e.g., the digital signal processing region of FIG. 10) in a second configurable mode in accordance with the present invention.

The outputs of add-subtract-accumulate circuit 144 may be routed to output selection circuit 152 (e.g., may be routed to output selection circuit 152 without passing through adder circuit 152). Output selection circuit 152 may route the outputs of add-subtract accumulate circuits 144 to output register circuit 154. Output register circuit 154 may route out the 2(n+y+1) output bits and may feed the output bits back to add-subtract-accumulate circuits 144. Output register circuit 154 may have a control input "CLEAR." The CLEAR control input may be used to prevent the accumulated value(s) that is stored in output register circuit 154 from being added to the current multiplier output being fed to add-subtract-accumulate circuits 144. The control input may include multiple input bits for independently controlling the zeroing of the accumulation operation of the two-independent multiply-and-accumulate operations. As shown in FIG. 13, half of input register circuits 134, multiplier circuits A and C 136, and adder circuit 140 are not needed to support the multiply-and-accumulate operation. However, adder circuit 140 may support the routing of the output signals in digital signal processing block 110, if desired.

Figure 14:
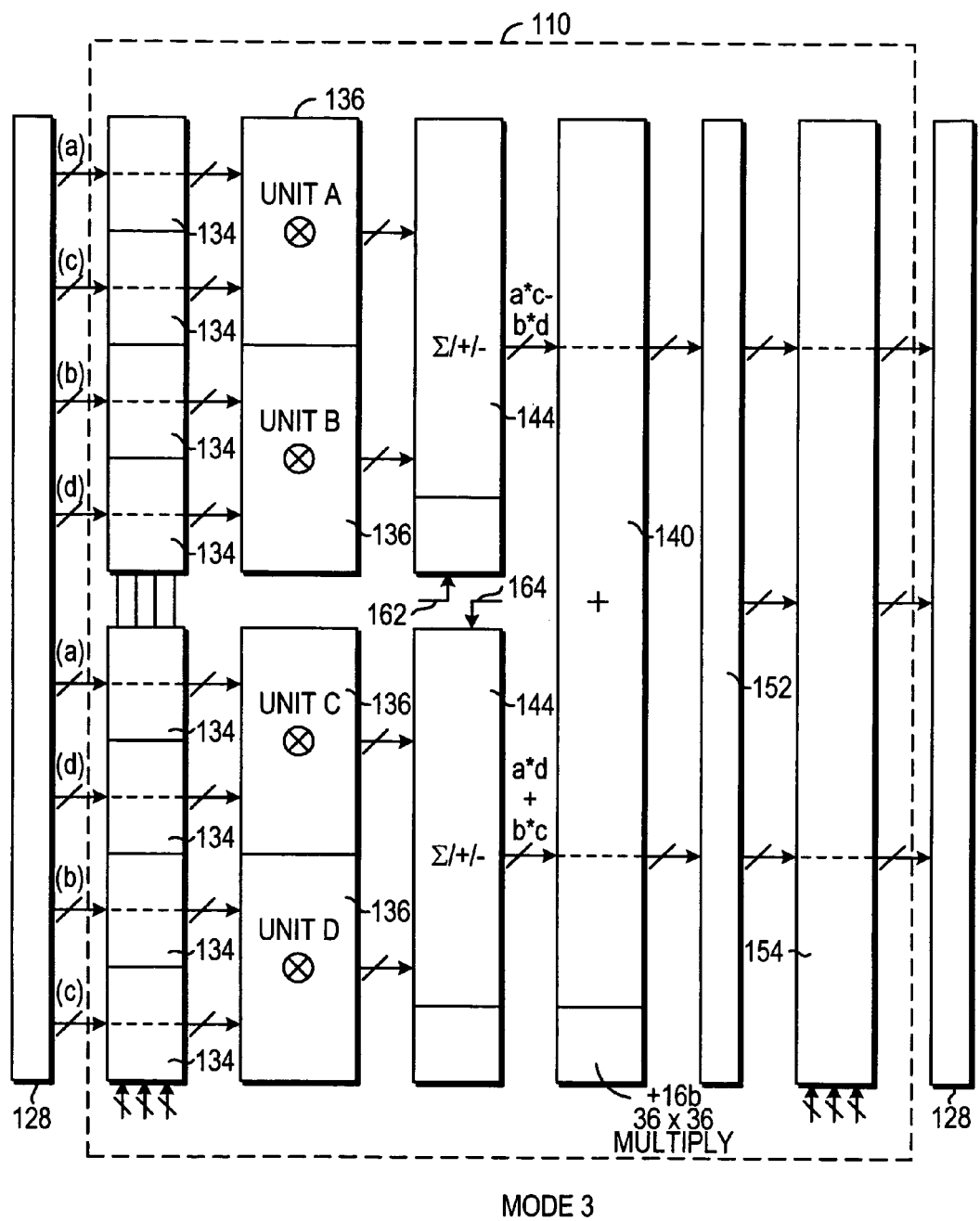
FIG. 14 is a functional block diagram of an illustrative digital signal processing region of a programmable logic device (e.g., the digital signal processing region of FIG. 10) in a third configurable mode in accordance with the present invention.

A third configurable mode of digital signal processing block 110 may support a complex multiply operation. For example, with reference now to FIG. 14, digital signal processing block 110, which may have an n×n multiplier based organization, may be configured to support a complex multiply operation such as (a+jb)*(c+jd), where j denotes the imaginary number equal to the square-root of −1.

The n×n bit complex multiply (a+jb)*(c+jd) may be implemented with two independent 2n bit add/subtract operations: (a+jb)*(c−jd)=(a*c−b*d)+j*(a*d+b*c). Interface circuitry 128 may feed inputs a, b, c, and d to digital signal processing block 110. In a complex multiply, each of the operands (a, b, c, and d) needs to be applied to two multipliers in multiplier circuits 136. Accordingly, circuitry external to digital signal processing block 110 may route each of the a, b, c, and d data inputs to the appropriate two of the eight n bit inputs of digital signal processing block 110. The external circuitry may route inputs a, b, c, and d to multiplier circuits 136 in a pattern that produces 2n bit resultant outputs of the following operations: a*c, b*d, a*d, and b*c. Each add-subtract-accumulate circuit 144 may operate on two of the four 2n bit multiplier outputs to produce a 2n+1 bit output. The additional bit is a carry bit from the operation. Digital signal processing block 110 may be configured to have the add-subtract-accumulate circuit 144, shown at the top of digital signal processing block 110, subtract the resultant output of the b*d multiplication from the resultant output of the a*c multiplication. The subtraction results in producing the real part of the complex multiply. Digital signal processing block 110 may be further configured to have the add-subtract-accumulate circuit 144, shown at the bottom of digital signal processing block 110, apply an addition operation to the resultant output of the a*d multiplication and the resultant output of the b*c multiplication. The addition produces the imaginary part of the complex multiply. The two 2n+1 outputs of add-subtract-accumulate circuits 144 can be routed out of digital signal processing block 110. If desired, the outputs of add-subtract-accumulate circuits 144 may be routed out of digital signal processing block 110 without routing the outputs through adder circuit 140. The outputs of add-subtract-accumulate circuits 144 may be routed out of digital signal processing block 110 through output selection circuits 152 and/or output register circuits 154.

Dynamic add/subtract control input 162 controls the selection of add or subtract operations for add-subtract-accumulate circuit 144 shown at the top of block 110. Dynamic add/subtract control input 164 controls the selection of add or subtract operations for add-subtract-accumulate circuit 144 shown at the bottom of block 110. Control inputs 162 and 164 may be applied dynamically or may be programmable using on-board programmable logic device memory. The third configurable mode may also be represented to provide A+/−B and C+/−D where A, B, C, and D reflect the outputs of multipliers A, B, C, and D.

Figure 15:
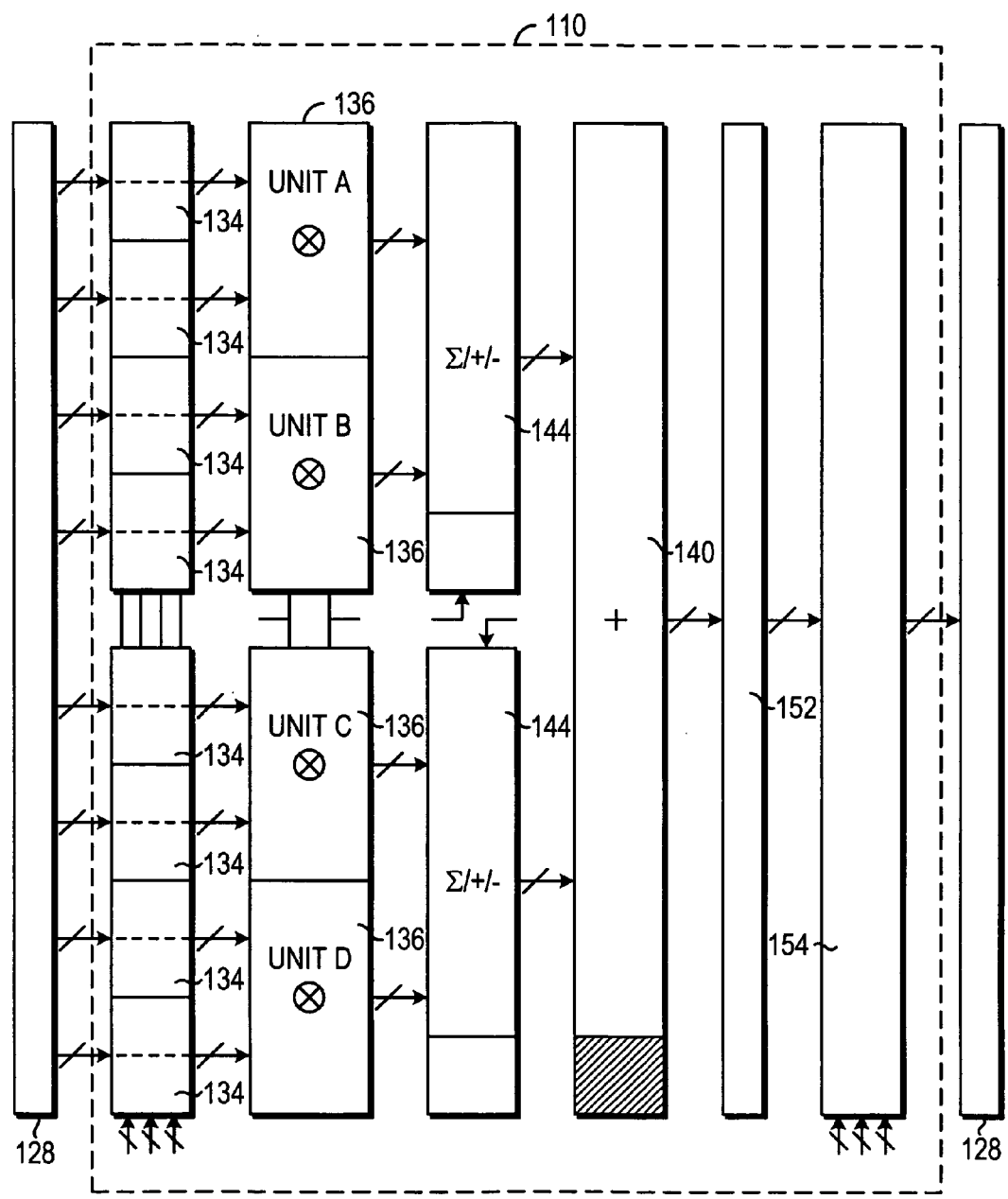
FIG. 15 is a functional block diagram of an illustrative digital signal processing region of a programmable logic device (e.g., the digital signal processing region of FIG. 10) in a fourth configurable mode in accordance with the present invention.

A fourth configurable mode of digital signal processing block 110 may support the summing of the outputs of four individual n×n multipliers (A+B+C+D). For example, with reference now to FIG. 15, digital signal processing block 110, which may have an n×n multiplier based organization, may be configured to have an output that is the sum of the outputs of four independent n×n multipliers. Each of the multipliers in multiplier circuits 136 may have a 2n bit output that is the resultant of two n bit inputs of that multiplier. The outputs of multiplier circuits 136 may feed the inputs of the two add-subtract-accumulate circuits 144. Each add-subtract-accumulate circuit 144 may sum two of the outputs of multiplier circuits 136 to produce a 2n+1 bit resultant output. Add-subtract-accumulate circuit 144 shown at the top of block 110 may sum the outputs from the multiplier circuits 136 shown at the top of block 110 and add-subtract-accumulate circuit 144 shown at the bottom of block 110 may sum the outputs from multiplier circuits 136 shown at the bottom of block 110. Adder circuit 140 may sum the outputs of add-subtract-accumulate circuits 144 to produce a 2n+2 bit resultant output. All of the output bits of the 2n+2 bit output can be routed out of digital signal processing block 110.

Figure 16:
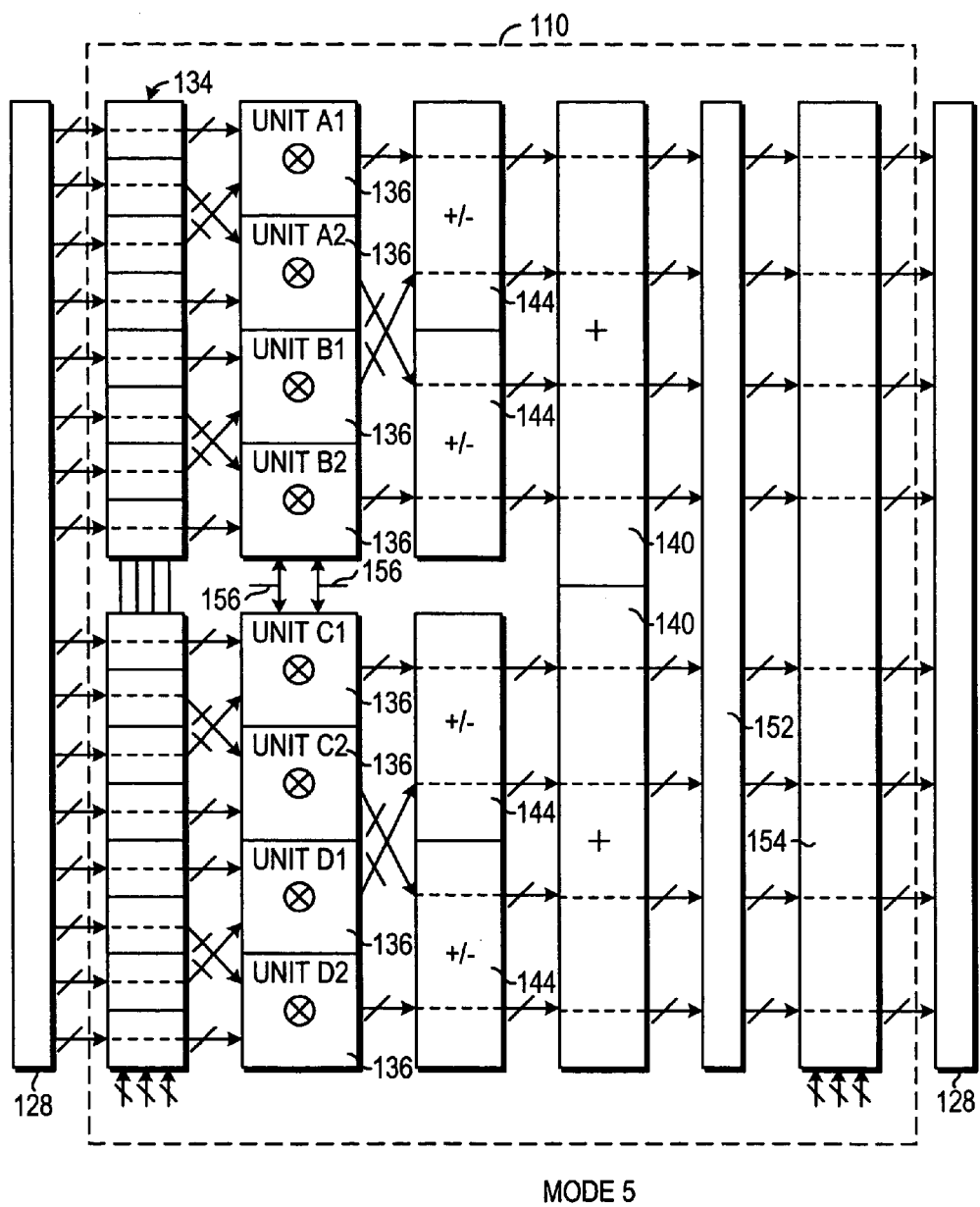
FIG. 16 is a functional block diagram of an illustrative digital signal processing region of a programmable logic device (e.g., the digital signal processing region of FIG. 10) in a fifth configurable mode in accordance with the present invention.

A fifth configurable mode of digital signal processing block 110 may involve eight independent n/2×n/2 multipliers. For example, with reference now to FIG. 16, digital signal processing block 110, which may have an n/2×n/2 multiplier based organization, may be configured to have an output that routes out the resultant of eight n/2×n/2 multipliers of multiplier circuits 136 (A1, A2, B1, B2, C1, C2, D1, and D2). As mentioned above in connection with FIG. 11, butterfly cross connection patterns may be configured in the local interconnect resources of digital signal processing block 110 between some of the input register circuits 134 and multiplier circuits 136 and between multiplier circuits 136 and add-subtract-accumulate circuits 144. The butterfly cross connection patterns may be configured to re-use already-existing circuitry and routing resources from the n×n multiplier based organization of digital signal processing block 110. In this mode, the butterfly cross interconnect pattern is not applied in forming connections between add-subtract-accumulate circuits 144 and adder circuits 140. If desired, digital signal processing block 110 may receive sixteen n/2 bit inputs. Multiplier circuits 136 may have eight n bit outputs that are routed out of digital signal processing block 110. If desired, routing out the outputs of multiplier circuits 136 may involve routing out the outputs directly from multiplier circuits 136 without passing the outputs through add-subtract-accumulate circuits 144 or through adder circuits 140.

The sixteen n/2 bit inputs of digital signal processing block 110 may be received by input register circuits 134 as eight n bit-wide inputs with each n bit-wide input having n/2 higher order bits and n/2 lower order bits. If desired, this fifth mode may be a first configurable mode for embodiments of digital signal processing block 110 that have an n/2×n/2 multiplier based organization and that are not configurable into an n×n multiplier based organization. Dynamic signed/unsigned control inputs 156 may be digital signal processing block wide inputs that may dynamically control the multiplication operations to produce signed—signed, signed-unsigned, unsigned-signed, and unsigned—unsigned multiply operations for each individual multiplier of multiplier circuits 136. On-board programmable logic device memory may be used to control inputs 156 when dynamic control is not desired.

A sixth configurable mode of digital signal processing block 110 may support two complex n/2×n/2 multiply operations. For example, with reference now to FIG. 17, digital signal processing block 110, which may have an n/2×n/2 multiplier organization, may be configured to have outputs that are the resultant of two independent n/2×n/2 complex multiply operations. As in the third configurable mode, each n/2 input operand is applied to two appropriate n/2×n/2 multipliers through the use of routing resources external to digital signal processing block 110. Add-subtract-accumulate circuits 144 are configured to have four n+1 outputs that are the resultant of an addition operation or a subtraction operation applied to two n bit inputs received from two n/2×n/2 multipliers of multiplier circuits 136.

The external routing for digital signal processing block 110 may direct the appropriate input signals to particular registers of input register circuits 134 to cause the appropriate operands to be multiplied to produce two independent complex multiply operations. The external routing may also direct the inputs to particular registers of input register circuits 134 to cause the addition or subtraction operation of add-subtract-accumulate circuits 144 to be performed on appropriate ones of the multiplier outputs for completing the two independent complex multipliers. Each of add-subtract-accumulate circuits 144 may be capable of only performing either an addition operation or a subtraction operation. Thus, the external routing may also have to compensate for each of add-subtract-accumulate circuits 144 only being operable to either perform an addition or a subtraction. Dynamic add/subtract control inputs 162 and 164 may control whether each add-subtract-accumulate circuit 144 is performing an addition or subtraction operation.

If desired, additional circuitry may be included in digital signal processing block 110 to configure each add-subtract-accumulate circuit 144 to be capable of performing independent addition and subtraction operations in each addsubtract-accumulate circuit 144. Each add-subtract-accumulate circuit 144 may have two n+1 outputs.

If each of add-subtract-accumulate circuits 144 can only perform either independent addition operations or independent subtraction operations, the real parts of the two complex multiply operations are produced by one of add-subtract-accumulate circuits 144 configured for subtraction operations and the imaginary parts of the two complex multiply operations are produced by the other one of add-subtract-accumulate circuits configured for addition operations. A butterfly cross connection pattern may be used to route together the real and imaginary parts for each complex multiply operation. All of the two n+1 bit outputs of the two independent complex multipliers can be routed out of digital signal processing block 110 (e.g., routed out through output selection circuit 152, routed out through output register circuits 154, etc.). The complex multiply output signals may be routed through adder circuit 140 if desired. If desired, the sixth configurable mode may be a second configurable mode for an embodiment of digital signal processing block 110 that has an n/2×n/2 multiplier organization and that is not configurable into an n×n multiplier based organization. The sixth configurable mode may also be represented to provide the A1+/−B1, A2+/−B2, C1+/−D1, and C2+/−D2 where A1, A2, B1, B2, C1, C2, D1, and D2 reflect the outputs of multipliers A1, A2, B1, B2, C1, C2, D1, and D2 which have been configured from multipliers A, B, C, and D.

Figure 18:
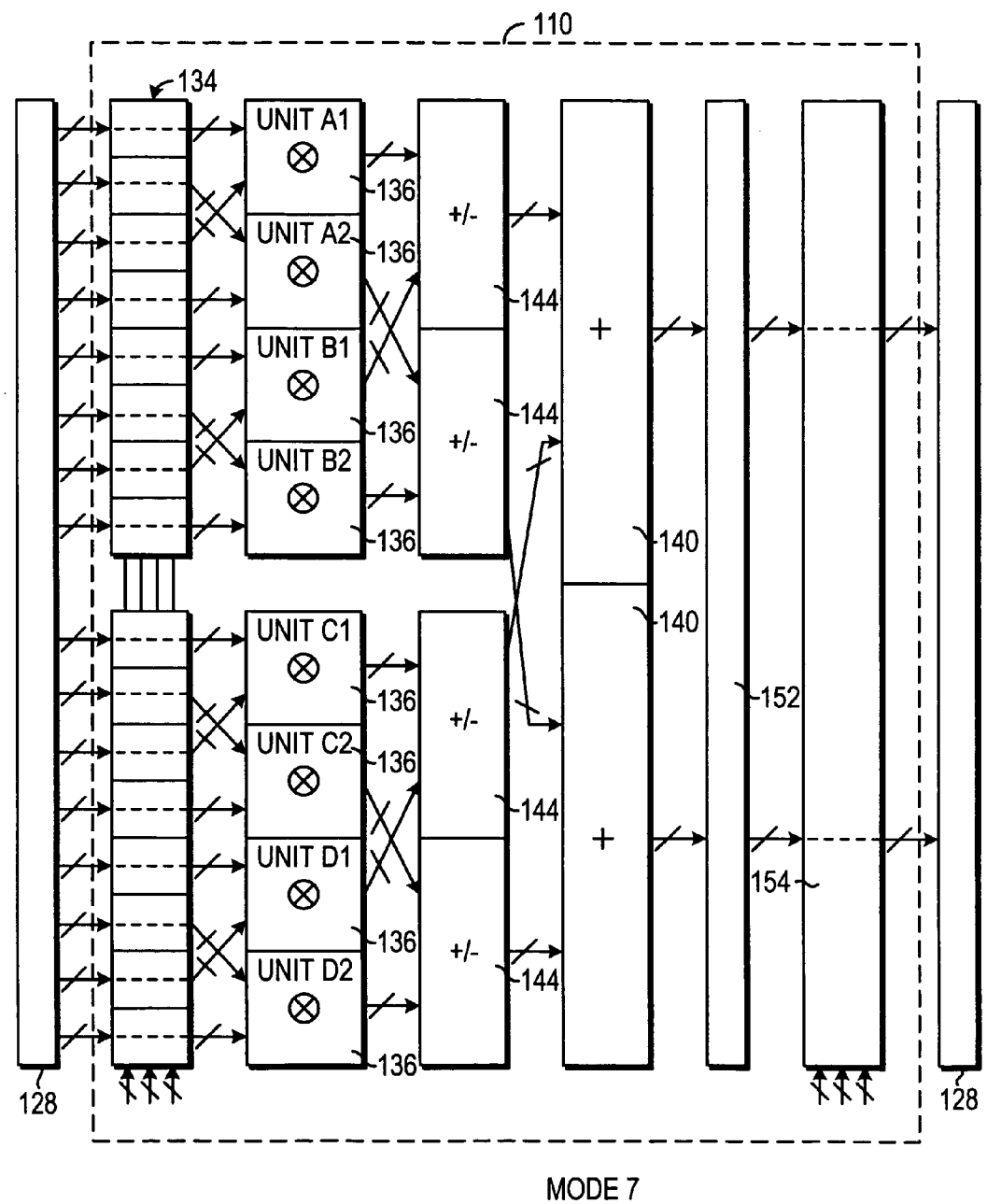
FIG. 18 is a functional block diagram of an illustrative digital signal processing region of a programmable logic device (e.g., the digital signal processing region of FIG. 10) in a seventh configurable mode in accordance with the present invention.

A seventh configurable mode of digital signal processing block 110 may implement two sums that are each the sum of four n/2×n/2 multiplier outputs. For example, with reference now to FIG. 18, digital signal processing block 110, which may have an n/2×n/2 multiplier based organization, may have two independent outputs that are each the sum of the resultant of four n/2×n/2 multiplier operations of multiplier circuits 136 (A1+B1+C1+D1 and A2+B2+C2+D2). The multiplier operations may each have different inputs. The multiplier circuits 136 may feed eight n bit inputs to add-subtract-accumulate circuits 144. Four of the eight n bit inputs are routed to the top half of add-subtract-accumulate circuit 144 and the other four inputs are routed to the bottom half of add-subtract-accumulate circuit 144. Each half of add-subtract-accumulate circuit 144 has two n+1 bit outputs that add-subtract-accumulate circuits 144 feed to adder circuit 140. Adder circuit 140 may be configured to operate as two individual adder units with each adder unit summing two of the n+1 bit outputs from add-subtract-accumulate circuits 144. Adder circuit 140 may have two n+2 outputs that are each from one of the adder units.

The butterfly cross interconnect pattern may be used between input register circuits 134 and multiplier circuits 136, between multiplier circuits 136 and add-subtract-accumulate circuits 144, and between add-subtract-accumulate circuits 144 and adder circuit 140. All of the two n+2 outputs of adder circuit 140 can be routed out of digital signal processing block 110 (e.g., routed out through output selection circuit 152, routed out through output register circuits 154). If desired, the seventh configurable mode may be a third configurable mode for an embodiment of digital signal processing block 110 that has an n/2×n/2 multiplier based organization and that is not configurable into an n×n multiplier based organization.

Figure 19:
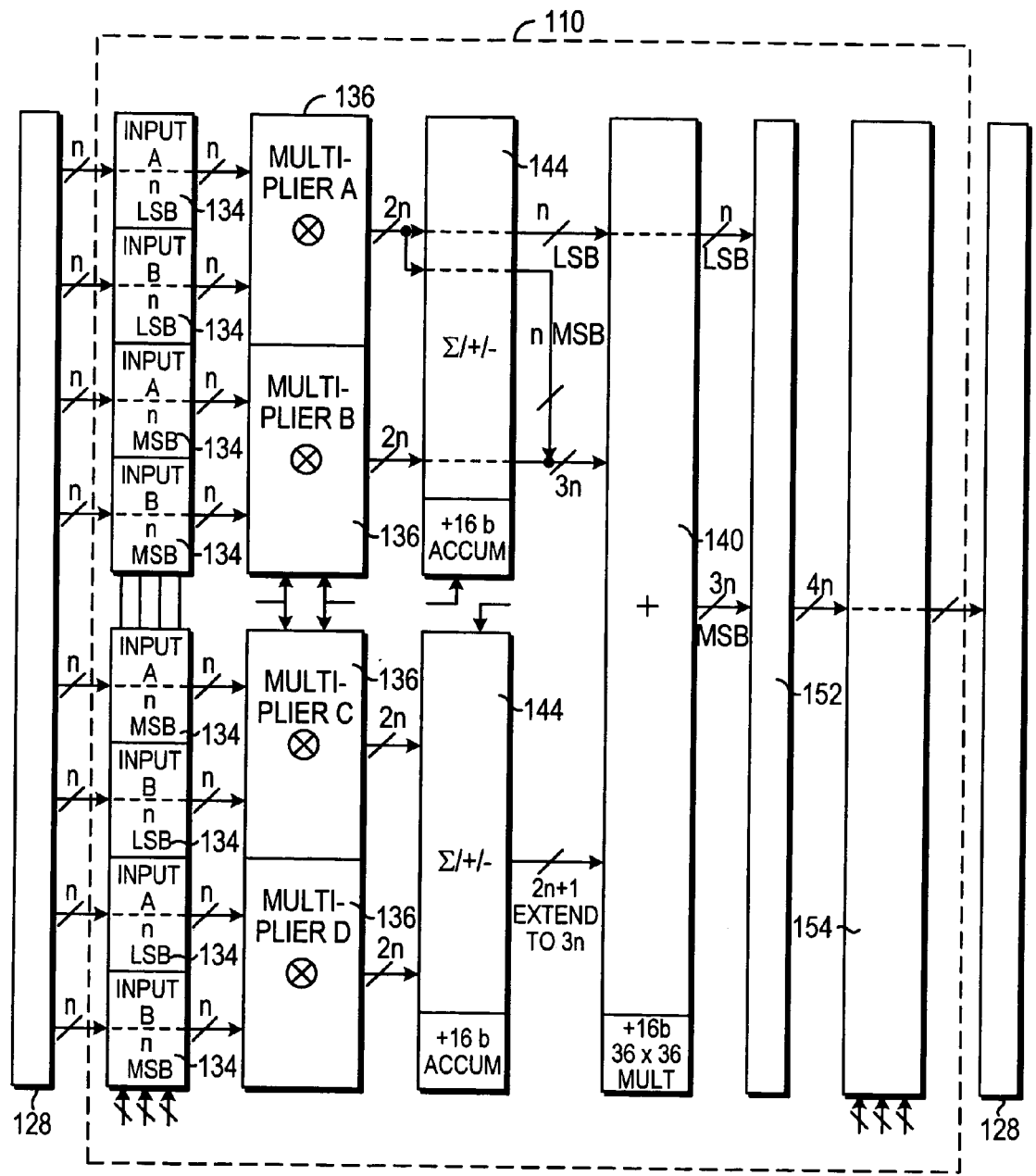
FIG. 19 is a functional block diagram of an illustrative digital signal processing region of a programmable logic device (e.g., the digital signal processing region of FIG. 10) in an eighth configurable mode in accordance with the present invention.

An eighth configurable mode of digital signal processing block 110 may support a 2n×2n multiplication (e.g., a 36 bit×36 bit multiplication). For example, with reference now to FIG. 19, digital signal processing block 110, which may have an n×n multiplier based organization, may have an output that is the resultant of two 2n bit inputs of digital signal processing block 110. Digital signal processing block 110 may be configured to implement a 2n×2n multiply operation by essentially summing the outputs of four n×n multiplier operations. Digital signal processing block 110 may have two 2n bit inputs, inputs A and B. The input bits of inputs A and B may each be divided into two n bit inputs containing the n least significant bits ("LSB") of a 2n bit input and the n most significant bits ("MSB") of the 2n bit input. Multiplier circuits 136 may apply a multiplication operation to the n LSB of input A, the n MSB of input A, the n LSB of input B, and the n MSB of input B. The multiplication operations may produce the resultant of the multiplication of the n LSB of input A and the input B, the resultant of multiplication of the n MSB of input A and input B, the resultant of the multiplication of the n MSB of input A and the n LSB of input B, and the resultant of the multiplication of the n LSB of input A and the n MSB of input B.

To produce such multiplicand-multiplier operations by the four multipliers of multiplier circuits 136, routing circuitry external to digital signal processing block 110 needs to route the n LSB of input A, the n MSB of input A, the n LSB of input B, and the n MSB of input B to appropriate inputs of digital signal processing block 110. Each of the MSB and LSB inputs are fed to two of the n bit inputs of digital signal processing block. External routing may be used because digital signal processing block 110 may not have the internal routing resources to route the different LSB and MSB inputs of the two 2n input to the appropriate inputs of multiplier circuits 136 to perform the n×n multiplication portion of the 2n×2n multiplication operation. Multiplier circuits 136 may include multiplier circuit A 136, multiplier circuit B 136, multiplier circuit C 136, and multiplier circuit D 136. Multiplier circuit A 136 may have a 2n bit output that is the resultant of the multiplication of the n LSB of input A and the n LSB of input B. Multiplier circuit B 136 may have a 2n bit output that is the resultant of the multiplication of the n MSB of input A and the n MSB of input B. Multiplier circuit C 136 may have a 2n output that is the resultant of the multiplication of the n MSB of input A and the n LSB of input B. Multiplier circuit D 136 may have a 2n output that is the resultant of the multiplication of the n LSB of input A and the n MSB of input B.

The n LSB of the output of multiplier circuit A 136 provides the n LSB of the resultant of the 2n×2n multiplication. Digital signal processing block 110 may append the n MSB of the output of multiplier circuit A 136 to the 2n bit output of multiplier circuit B 136 to form a 3n bit input to adder circuit 140. The 2n bit outputs of multiplier circuits C and D 136 may be added by the add-subtract-accumulate circuit 144 shown at that bottom of digital signal processing block 110. That bottom add-subtract-accumulate circuit 144 may have a 2n+1 bit output that digital signal processing block 110 may sign extend to be 3n bits wide. Adder circuit 140 may add the two 3n bit outputs and may have a 3n bit output that is the resultant of the addition. The 3n bit output of adder circuit 140 may be the 3n MSB of the output of the 2n×2n multiplication. The 3n bit output of adder circuit 140 and the n LSB output of multiplier circuit A 136 may together form the output of the 2n×2n multiplication. All of the bits of the output of the 2n×2n multiplication can be routed out by digital signal processing block 110 (e.g., routed out through output selection circuit 152, routed through output register circuit 154, etc.).

If desired, the first, second, third, fourth, and eighth configurable modes may be the first, second, third, fourth, and fifth configurable modes of some embodiments of digital signal processing block 110 that have an n×n multiplier based organization and that are not configurable into an n/2×n/2 multiplier based organization.

Some embodiments of digital signal processing block 110 that have an n×n multiplier based organization and are not configurable to have an n/2×n/2 multiplier based organization may be limited to having only sub-combinations of the modes (any sub-combination of the modes) that use the n×n multiplier based organization. If desired, in some embodiments, digital signal processing block 110 may have only a single mode or single configuration which may be any one of the eight modes described in connection with FIGS. 11–18. In some embodiments, digital signal processing block 110 may be limited to having only sub-combinations of the modes that are described herein. Some embodiments of digital signal processing block 110 that have an n×n multiplier based organization and are not configured to have an n/2×n/2 multiplier based organization may be limited to sub-combinations of the modes that use the n×n multiplier based organization.

If desired, digital signal processing block 110 may be configured to have an n/3×n/3 multiplier based organization, an n/4×n/4 multiplier based organization, an n/5×n/5 multiplier based organization, an n/6×n/6 multiplier based organization, etc. Digital signal processing block 110 may be configured into these different multiplier based organizations only when the ratios involved produce an integer (e.g., n/3 equals an integer). In other words, digital signal processing block 110 may be configured to have a number of (t×n/m)×(t×n/m) multiplier based organizations where (t×n/m) equals an integer. Different modes may be associated with each of these different multiplier based organizations.

A number of different routing arrangements may be included for implementing different embodiments of digital signal processing block 110. For example, with reference now to FIG. 20, digital signal processing block 110, which may have an n×n multiplier based organization, may include routing resources (e.g., conductors, PLCs, etc.) and digital signal processing circuitry that have four configurable modes (e.g., only four configurable modes). Digital signal processing block 110 may include input register circuits 134, multiplier circuits 136, add-subtract-accumulate circuits 144, adder circuit 140, output selection circuits 152, and output register circuits 154. Multiplier circuits 136 may include four multipliers, which have been labeled as A, B, C, and D for convenience. The configurable modes of digital signal processing block 110 may include a first mode in which digital signal processing block 110 has an output comprising four independent 2n bit outputs of multipliers A, B, C, and D of multiplier circuits 136, a second mode in which digital signal processing block 110 has two 2n+1 bit outputs comprising two independent 2n+1 bit outputs of multiply-add/subtract operations (the output of multiplier A±the output of multiplier B, the output of multiplier C±the output of multiplier D), a third mode in which digital signal processing block 110 has a 2n+2 bit output that is the output of a summing operation (the output of multiplier A±the output of multiplier B+the output of multiplier C±the output of multiplier D), and a fourth mode in which digital signal processing block 110 may have independent n+y outputs comprising the n+y output of multiply-and-accumulate operations (e.g., accumulate the output of multiplier A/B, accumulate the output of multiplier C/B). The modes that are described herein for the multiply-and-accumulate operations are illustratively described primarily in the context of two independent accumulators. More than two accumulators may also be used as long as there is sufficient input/output interconnect resources to support the additional accumulators. For example, three or four smaller accumulators may be implemented as long as there is sufficient routing resources for their operation.

Input register circuits 134 and output register circuits 154 include registers and bypass circuitry that can bypass the registers. The bypass circuitry may be controlled from memory on-board a programmable logic device. Output selection circuits 152 may include a plurality of PLCs that control the selection of output signals based on the mode in which digital signal processing block 110 is operating.

Add-subtract-accumulate circuits 144 may include two independent add-subtract-accumulate circuits that each have substantially the same components and arrangements. Each of the two add-subtract-accumulate circuits may include an add/subtract circuit, an accumulator circuit, and a register. Other architectures for implementing add-subtract-accumulate circuits 144 may also be used. For example, add-subtract-accumulate circuits 144 may be implemented to use an external register. The external register may have dual functionality such as to provide a register for add-subtract-accumulate circuits 144 and for providing an output register for a digital signal processing block. The register may have a clock input and may be used for feedback for accumulator operation. The accumulator circuit of each add-subtract-accumulate circuit 144 may have an input that may be used to selectively reset the accumulator operation of that accumulator circuit. If desired, an accumulator circuit for an add-subtract-accumulate circuit may have a dedicated register circuit for registering the output of accumulator circuit and for feeding the output back to the accumulator circuit in performing an accumulator operation.

In digital signal processing block 110, the output selection is delayed until the resultant of the current digital signal processing operations are applied to output selection circuit 152. The selection of the output from a number of possible outputs at output selection circuit 152 provides for flexible routing in digital signal processing block 110. The routing resources are structured to have each of the outputs of multipliers A and C be available to the output selection circuit 152 and be available to one of the add/subtract circuits in add-subtract-accumulate circuit 166 (as shown). The routing resources are further structured to have each of the outputs of multipliers B and D be available to the output selection circuit 152, be available to one of the add/subtract circuits (as shown), and be available to one of the accumulator circuits (as shown). The outputs of each of the add/subtract circuits may be available to output selection circuit 152 and to adder circuit 140. The output of adder circuit 140 may be available to output selection circuit 152. The different inputs of output selection circuit 152 may have a number of different bit lengths. Output selection circuit 152 may feed the output register circuits with data bits that are in an appropriate order for being routed out of digital signal processing block 110. Digital signal processing block 110 may produce an output per clock cycle. An output may be produced per clock cycle even if pipeline register circuits are being used.

A digital signal processing block that has multiple digital signal processing stages and that is illustratively described herein may generally produce an output per clock cycle. Multiple clock cycles are typically required to produce an output of multistage digital signal processing operations using programmable logic regions.

Digital signal processing block 110 may have additional modes that are not explicitly described above. The arrangement and circuitry of digital signal processing block 110 of FIG. 20 may implement the configurable modes that are discussed above in connection with FIGS. 12–15.

Figure 20:
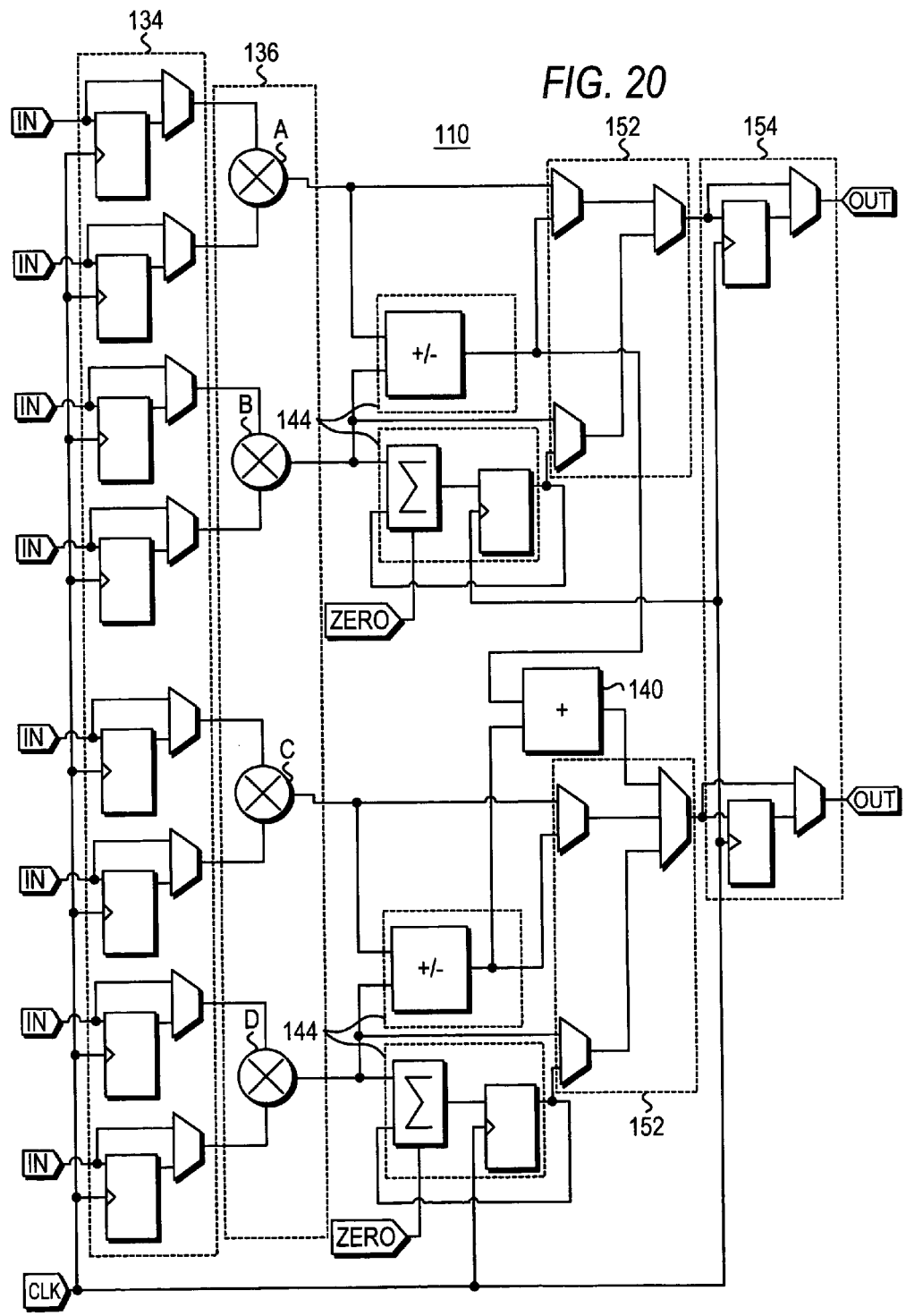
FIG. 20 is a simplified schematic diagram of one illustrative embodiment of an illustrative digital signal processing region of a programmable logic device (e.g., the digital signal processing region of FIG. 10) in accordance with the present invention.

Other arrangements and circuitry may be structured to provide a digital signal processing block in a programmable logic device that has configurable modes including the four configurable modes of digital signal processing block 110 of FIG. 20. For example, with reference now to FIG. 21, digital signal processing block 110 may include input register circuits 134, multiplier circuits 136, add-subtract-accumulate circuits 144, adder circuit 140, output selection circuits 152, and output register circuits 154. Input register circuits 134 and output register circuits 154 may include bypass circuitry. In digital signal processing block 110, some of the routing overhead of output selection circuits 152 is shifted to add-subtract-accumulate circuits 144. Digital signal processing block 110 may have four configurable modes that are the same as the four configurable modes of digital signal processing block 110 of FIG. 20.

Figure 21:
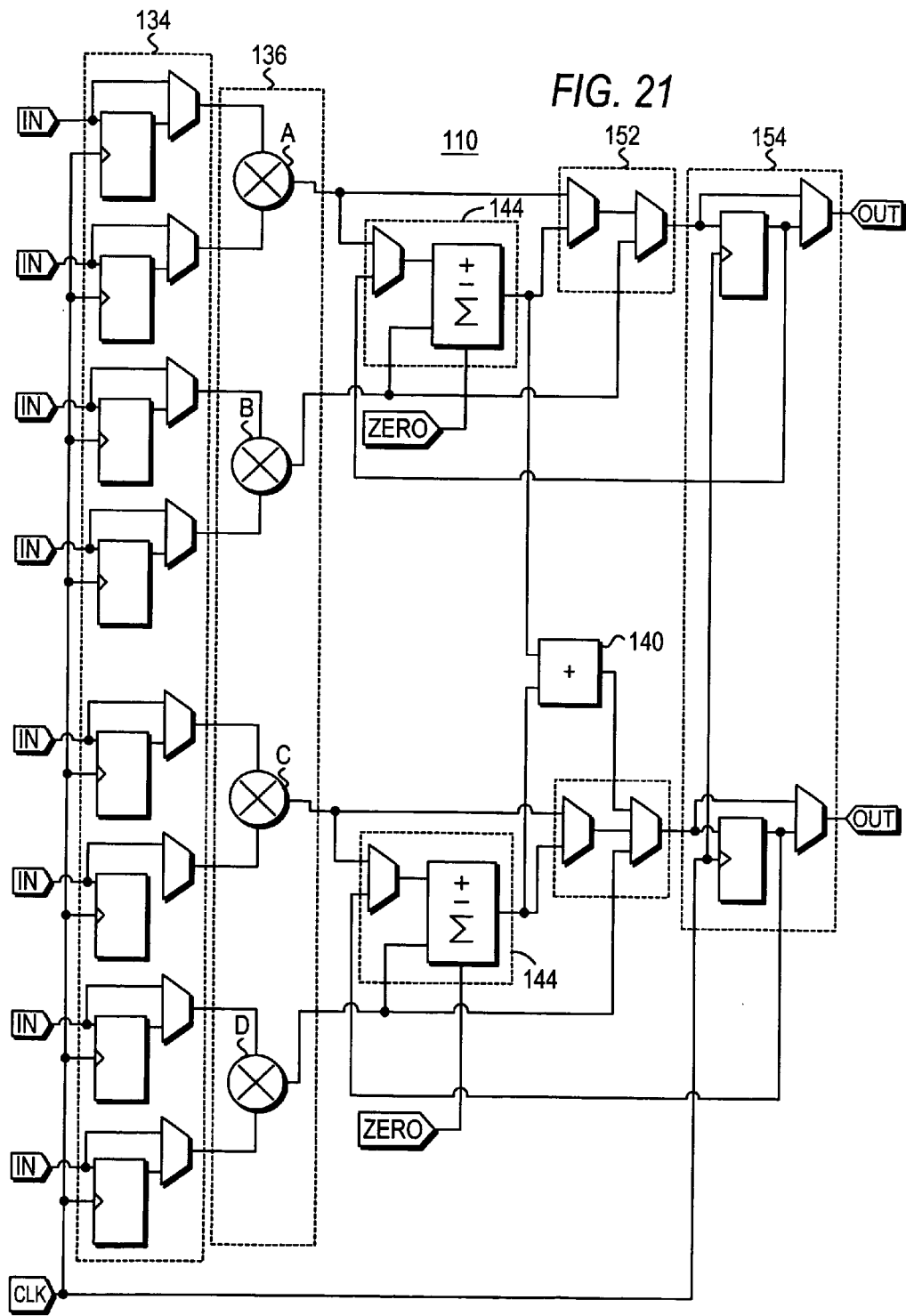
FIG. 21 is a simplified schematic diagram of another illustrative embodiment of an illustrative digital signal processing region of a programmable logic device (e.g., the digital signal processing region of FIG. 10) in accordance with the present invention.

In digital signal processing block 110 of FIG. 21, the local interconnect resources are arranged to have the output of each of the multipliers A, B, C, and D 136 available to output selection circuits 152, to have the outputs of multipliers A and B available to one of add-subtract-accumulate circuits 144, to have the outputs of multipliers C and D available to the other one of add-subtract-accumulate circuits 144, to have the outputs of both add-subtract-accumulate circuits 144 available to adder circuit 140 and available to output selection circuits 152, and to have the output of adder circuit available to output selection circuit 152. The output of output selection circuit 152 may be available to the input of add-subtract-accumulate circuits 144. Digital signal processing block 110 may have an n×n multiplier based organization. The multipliers of multiplier circuits 136 may each have two n bit inputs and a single 2n bit output. Each of add-subtract-accumulate circuits 144 may have 2n bit-wide inputs and have a 2n+1 bit-wide output (for add/subtract operations) or a k bit output (for accumulate operations) where k>2n+1. Adder circuit 140 may have 2n+1 bit inputs and may have a 2n+2 bit output. Output selection circuits 152 and output register circuits 154 may, depending on the mode, have a total of 8n, 2k, 2(2n+1), or 2n+2 bit inputs and outputs. Each add-subtract-accumulate circuit 144 may include a PLC that is controlled to select one of the two inputs for the addition, subtraction, or accumulation operation of that add-subtract-accumulate circuit 144. Each add-subtract-accumulate circuit 144 may have three inputs that include the outputs of two multipliers and a feedback output from output register circuit 154. The feedback output may be selected to be an input of the accumulation operation when an accumulator operation is selected to be performed.

As in practically every multimode example that is discussed herein, additional modes may exist for digital signal processing block 110 that are not explicitly identified herein. And as mentioned above, digital signal processing block 110 may be structured to only have one of the above-identified modes or to only have sub-combinations of those modes.

If desired, in modes in which the same n bit inputs need to be applied to more than one multiplier, input register circuits 134 may include routing that directs the input of one register circuit in input register circuits 134 to another input register circuit in input register circuit 134 (e.g., directs the input to the input of a bypass PLC of another input register circuit). This routing, for example, may be used for four different inputs of input register circuits to route each one of the four inputs to the PLC of a different one of the remaining input registers. If desired, the routing may be accomplished by routing signals from an input of a bypass PLC to the input of another PLC of another register to apply the same input to more than one multiplier.

Figure 22:
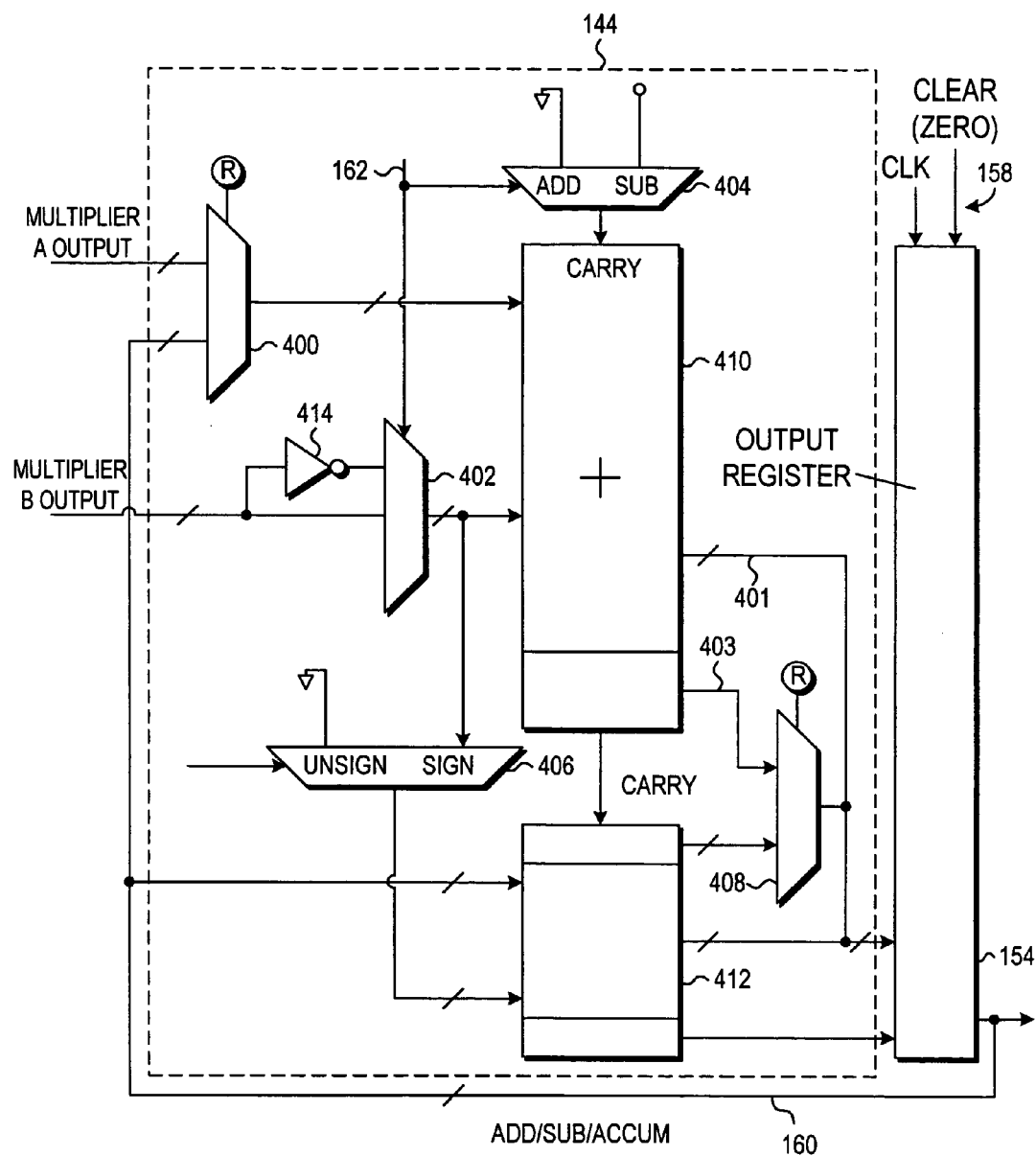
FIG. 22 is a simplified schematic diagram of an illustrative add-subtract-accumulate circuit of a digital signal processing region of a programmable logic device in accordance with the present invention.

An illustrative embodiment of an add-subtract-accumulate circuit (e.g., one of the add-subtract-accumulate circuits 144 of FIG. 21) is shown in FIG. 22. With reference now to FIG. 22, add-subtract-accumulate circuit 144 may include programmable logic connectors 400, 402, 404, 406, and 408, 2n bit adder circuit 410, n bit adder circuit 412, and inverter 414. A 2n bit adder circuit generally refers to an adder circuit having two 2n bit inputs and a 2n+1 bit output. This technique for indicating the potential input and output bit size of an adder is further used below.

In an addition or subtraction mode of add-subtract-accumulate circuit 144, the output of multiplier A (e.g., a multiplier in multiplier circuits 136 of FIG. 21) may be routed to 2n bit adder circuit 410. The output of multiplier B (e.g., another multiplier in multiplier circuit 130 of FIG. 21) may be routed to programmable logic connector 402 and also inverted by inverter 414 and routed to programmable logic connector 402. Dynamic add/subtract control input 162 may control programmable logic connector 402 to route the output of multiplier B or the inverted output of multiplier B to 2n bit adder circuit 410. Inverted output of inverter 414 may be used when a subtraction operation is being implemented using the adder. To implement a subtraction-operation when using two's complement numbering, the inverted output from inverter 414 is routed to one of the inputs of 2n bit adder circuit 410 and a carry bit (e.g., a "1" input) is fed to 2n bit adder circuit 410 by programmable logic connector 404. For addition operations, the outputs of multipliers A and B are routed to the inputs of 2n bit adder circuit 410 and the carry bit is set to zero. Dynamic add/subtract control signal 162 may control programmable logic connector 404. The outputs of the multipliers A and B may be two 2n bit-wide outputs. The output of adder circuit 410 may be a 2n+1 bit output. Conductors 401 may be used to route out 2n bits of the 2n+1 bit output. The most significant bit of the 2n+1 bit output may be routed out via conductor 403 to programmable logic connector 408. Programmable logic connector 408 may have an output that is dependent on the mode of add-subtract-accumulate circuit 144. The output of programmable logic connector 408 is the MSB from the addition operation, which will also be the MSB of the output of add-subtract-accumulate circuit 144, when add-subtract-accumulate circuit 144 is in an addition/subtraction mode. The most significant bit may be routed out of programmable logic connector 408 and combined with the 2n bit output on conductor 401. The 2n+1 bit combined output is routed out of add-subtract-accumulate circuit 144 as the output of add-subtract-accumulate circuit 144 when operating in an addition/subtraction mode.

When providing an accumulator operation, the output of output register 154 may be fed to programmable logic connector 400 and to n bit adder circuit 412. The output of output register 154 may be a 3n bit output. The 2n LSB of the 3n bit output may be routed to programmable logic connector 400 and the n MSB of the 3n bit output may be routed to n bit adder circuit 412. Programmable logic connector 400 may have the output of multiplier A and the 2n LSB of the feedback from output register circuit 154 as inputs. Programmable logic connector 400 may route the 2n LSB feedback output to adder circuit 410 when add-subtract-accumulate circuit 144 is in an accumulator mode. Programmable logic connector 402 may route the output of multiplier B (or the inverted output of multiplier B) to adder circuit 410. Local interconnect may route the MSB of the output of programmable logic connector 402 to programmable logic connector 406. Adder circuits 410 may add the 2n bit feedback output and the output of multiplier B (or the inverted output of multiplier B and/or a carry bit). The 2n LSB of the resultant may be routed out via conductors 401. The MSB of the resultant may be a carry bit input to n bit adder circuit 412.

Programmable logic connector 406 may be controlled based on whether signed or unsigned numbering is being used. If signed numbering is being used, programmable logic connector 406 may be used to sign extend the MSB of the output of programmable logic connector 402. Programmable logic connector 406 may be used to route an n bit input into n bit adder circuit 412 with all n bits of the input being set to the sign of the output of multiplier B (or the sign of the inverted output of multiplier B) when signed numbering is being used. For example, the input may be set to all zeros or all ones depending on the sign of the output of multiplier B. When signed numbering is not being used, programmable logic connector 406 forces the input into adder circuit 412 to be zero (e.g., set to be all zeros). The output of programmable logic connector 406, the n MSB of the feedback output, and the carry input from 2n bit adder circuit 410 may be added by n bit adder circuit 412. The LSB of the output of n bit adder circuit 412 is routed to programmable logic connector 408 and combined with the output of 2n bit adder circuit 410 when add-subtract-accumulate circuit 149 is providing an accumulation operation. The remaining n-1 LSB of the output of n bit adder circuit 412 are routed out and combined with the output of the output of 2n bit adder circuit 410 and the LSB of n bit adder circuit 412. The MSB of the output of n bit adder circuit 412 may be an overflow bit and may be routed separately.

Two clock cycles may be necessary to clear the sum of the accumulator operation. Clear input 158 of output register circuit 158 may be used to clear the value stored in output register circuit 154. The next clock cycle may feed the zero bits of output register circuit 159 to the input of add-subtract-accumulate circuit 144. The data that is fed to add-subtract-accumulate circuit 144 in multiplier B output may be controlled to be set to zero for that same clock pulse. In the next clock cycle, the zeros are added by add-subtract-accumulate circuit 144 and the zero sum of the addition may be routed to output register circuit 154.

Figure 23:
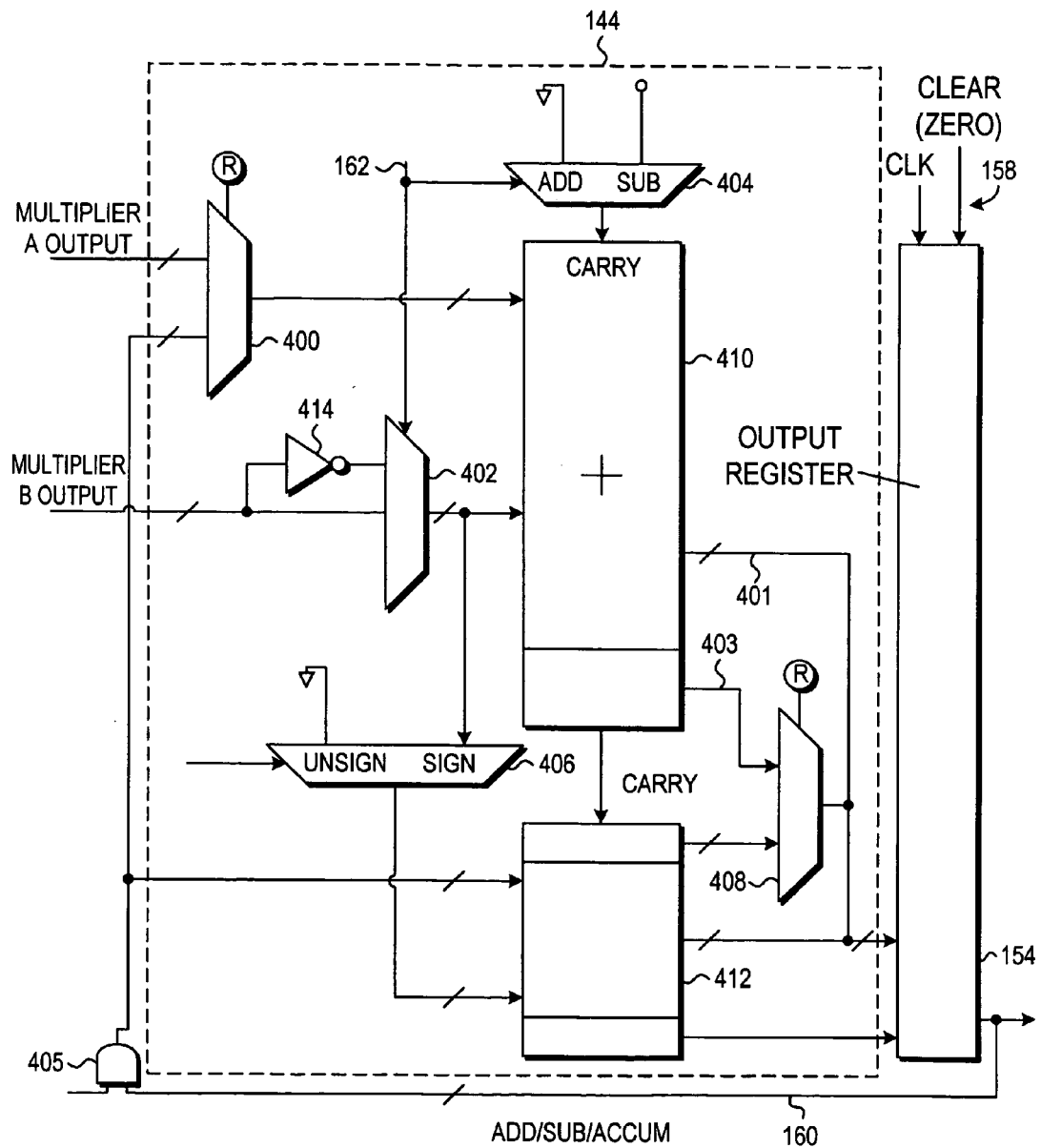
FIG. 23 is a simplified schematic diagram of an illustrative add-subtract-accumulate circuit having a reset feature for an accumulate feature of a digital signal processing region of a programmable logic device in accordance with the present invention.

With reference now to FIG. 23, the accumulator output of add-subtract-accumulate circuit 144 may be set to zero in one clock cycle if desired. A digital signal processing block may include zeroing circuit 405 in the feedback output path that may set the feedback input of add-subtract-accumulate circuit 144 to zero for the same clock cycle. As mentioned above, the output of multiplier B may be controlled to be set to zero for the same clock cycle. In the next clock cycle, the two zero inputs are summed and a zero output is fed to output register circuit 154.

As mentioned above, in some embodiments, the CLEAR input into output register circuit 154 may be used to prevent the accumulated value stored in output register circuit 154 from being fed to add-subtract-accumulate circuit 144 when a new output of multiplier B is being fed to add-subtract-accumulate circuit 144. Those skilled in the art will appreciate that this may be one technique for zeroing input to an accumulator.

Figure 24:
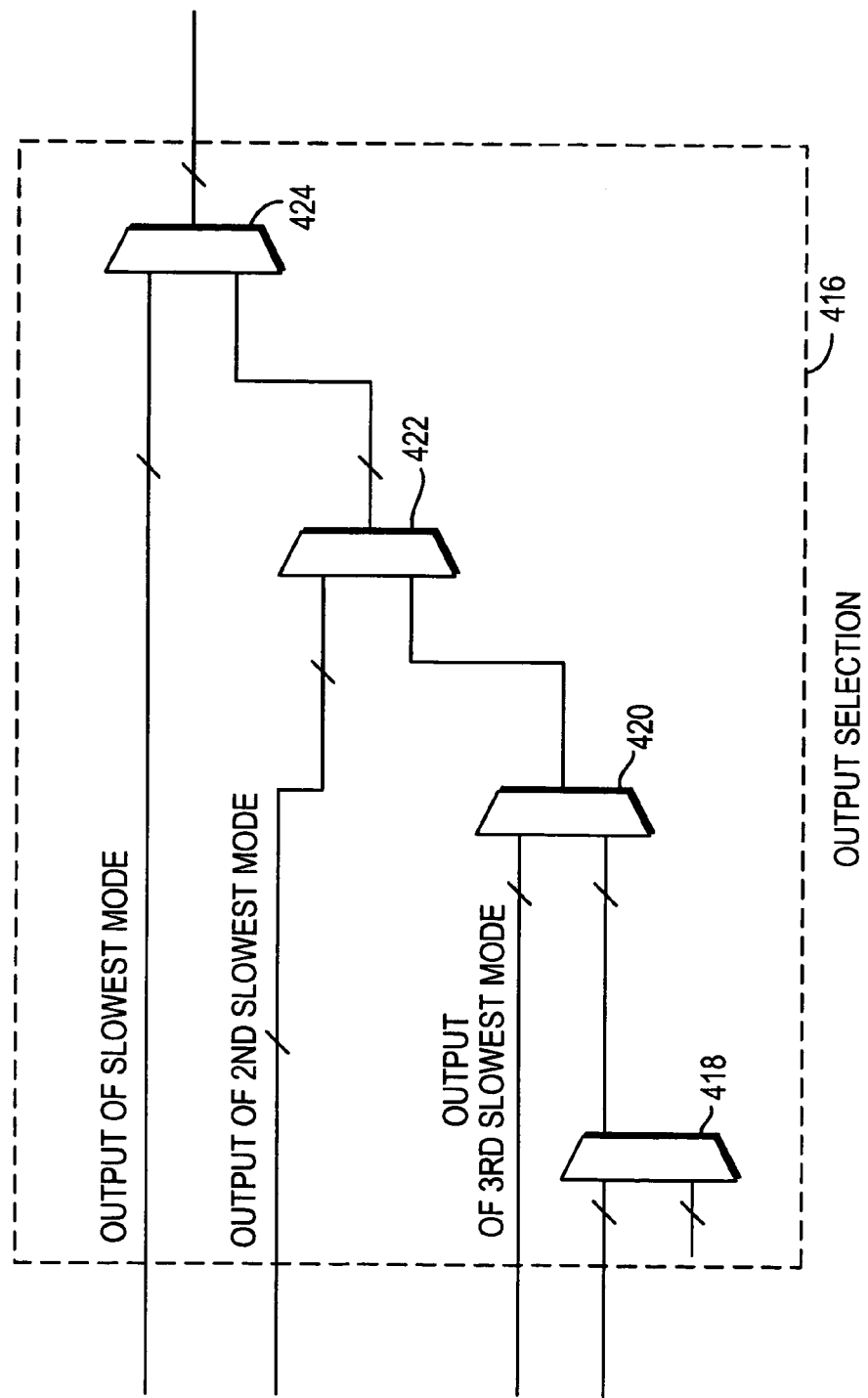
FIG. 24 is a simplified schematic diagram of an illustrative output selection circuit in a digital signal processing region of a programmable logic device in accordance with the present invention.

The different configurable modes that are described herein may have speeds of operation that may be inherently different. An output selection circuit (e.g., output selection circuit 152 of FIGS. 12–19) may be structured to approximately balance out the different speeds of operation of the different configurable modes. For example, with reference now to FIG. 24, output selection circuit 416 may include a plurality of programmable logic connectors 418, 420, 422, and 424. Programmable logic connectors 418, 420, 422, and 424 and local interconnect resources may be arranged based on the speed of operation of the modes. The output of the slowest mode may be routed out through programmable logic connector 424 (e.g., routed out only through programmable logic connector 424). The output of the second slowest mode may be routed out through programmable basic connector 422 and 424. The output of the third slowest mode may be routed through programmable logic connectors 420, 422, and 424. Similar arrangements may be made for the outputs of the remaining modes (if any). The outputs of programmable logic connectors 418, 420, 422 and 424 may be selected based on the current mode of a digital signal processing block containing output selection circuit 416.

Output selection circuit 416 illustrates an embodiment having staggered connection circuits that may be used to balance the different operating speeds of a digital signal processing block of a programmable logic device that has a number of configurable modes. Other types of circuitry and other circuit arrangements may also be used to provide an output selection circuit 416 (e.g., one connector that manages the output of all of the modes).

Figure 25:
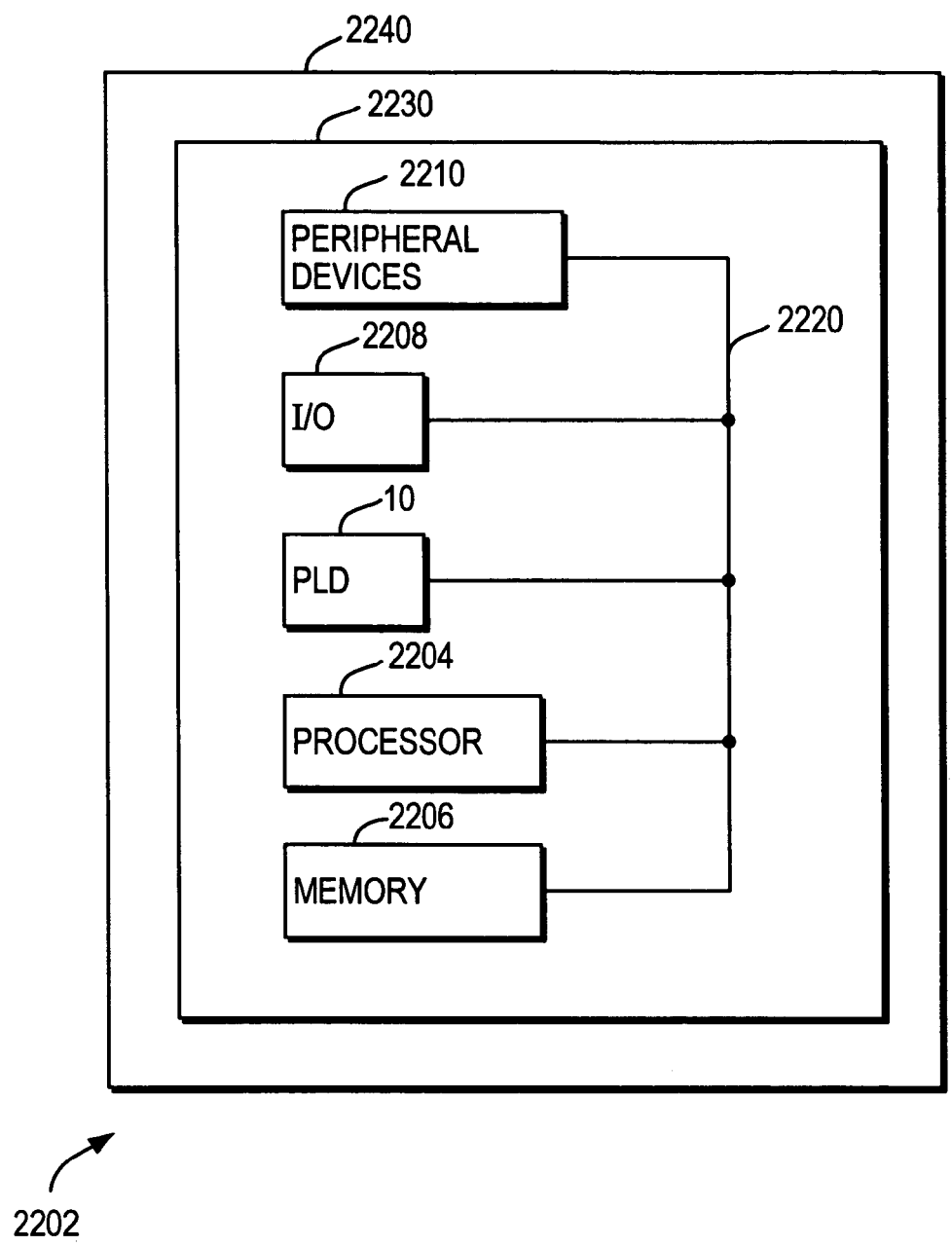
FIG. 25 is a simplified schematic block diagram of an illustrative system employing a programmable logic device in accordance with the present invention.

FIG. 25 illustrates a programmable logic device 10 of this invention in a data processing system 2202. Data processing system 2202 may include one or more of the following components: a processor 2204; memory 2206; I/O circuitry 2208; and peripheral devices 2210. These components are coupled together by a system bus 2220 and are populated on a circuit board 2230 which is contained in an end-user system 2240.

System 2202 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 2204. Programmable logic device 10 may also be used as an arbiter for arbitrating access to a shared resource in system 2202. In yet another example, programmable logic device 10 can be configured as an interface between processor 2204 and one of the other components in system 2202. It should be noted that system 2202 is only exemplary, and that the true scope and spirit of the invention should be indicated by the following claims.

Various technologies can be used to implement programmable logic devices 10 in accordance with this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

For clarity and brevity, the words input and output have been used in different context to represent various input and/or output related features. For example, input or output may refer to an input or output that comprises a plurality of bits (e.g., an 8 bit input, an 8 bit output, etc.). Further by way of example, depending on the context, input and/or output may refer to electrical signals, conductors (e.g., terminals, conductors lines, etc.), or combinations thereof.

Multipliers for the multiplier circuits described herein may be implemented based on a Booth re-code (e.g., a Booth radix-4 re-code) using partial products generation, intermediate partial products additional stages, and final-stage partial products additions. An even number of Booth re-code logic blocks may be used to make the partial product generation symmetrical so that the partial product can be split into two groups for n/2×n/2 multiplier implementation with n×n multiplier hardware. Parallel carry save adder hardware is provided in forming the Booth re-code logic blocks. The carry save adders may provide reductions such as three-to-two reduction, four-to two reduction, etc.

Multiplier circuits, register circuits, adder circuits, add-subtract-accumulate circuits and other circuitry described herein are described primarily in connection with the primary functions of those circuits. Such circuitry may include additional circuitry or functionality that may be provided or needed, for example, in providing related features or capabilities.

The butterfly cross connect patterns that are illustratively described herein are examples of techniques in which the inputs and outputs of successive stages of a digital signal processing block may be connected to provide greater flexibility in the flow of data through the stages. Inputs and outputs of successive stages may be directly connected (e.g., an output of a first stage is connected to an input of the next stage that is closest to that output) and cross connected (e.g., two adjacent outputs of a first stage are cross connected with two adjacent inputs of the next stage). If desired, a selection may be made between the different connections based on the current mode of the digital signal processing block.

The variables (e.g., n, p, etc.) that are mentioned above are variables that are primarily integers. In the above discussion, the variable n is primarily used to indicate bit length or precision.

Techniques for constructing the circuitry and structures that are mentioned herein are known to those skilled in the art or are described herein.

It will be understood that the foregoing is only illustrative of the principles of the invention, and that various modifications can be made by those skilled in the art without departing from the scope and spirit of the invention. For example, the various elements of this invention can be provided on a PLD in any desired numbers and arrangements.

What is claimed is:

1. A programmable logic device comprising:
   a plurality of programmable logic regions;
   a digital signal processing region having a plurality of configurable modes of operation, the digital signal processing region comprising:
   a plurality of multiplier circuits that each have a multiplier output, and
   a digital signal processing circuit dedicated to receiving one or more of the multiplier outputs and comprising circuitry that applies a particular digital signal processing operation to the received multiplier outputs depending on a selected mode of operation; and
   interconnect resources that interconnect the digital signal processing region to at least some of the programmable logic regions.

2. The programmable logic device of claim 1 wherein the digital processing circuit comprises:
   at least one add-subtract-accumulate circuit that is operative to receive the multiplier outputs; and
   at least one add-subtract circuit that is operative to receive an output from the add-subtract-accumulate circuit.

3. The programmable logic device of claim 1 wherein the digital processing circuit comprises:
   at least one first add-subtract circuit that is operative to receive the multiplier outputs;
   at least one accumulate circuit that is operative to receive the multiplier outputs; and
   at least one second add-subtract circuit that is operative to receive an output from the first add-subtract circuit.

4. The programmable logic device of claim 2 wherein the add-subtract-accumulate circuit is operative to perform a selected computation based on the multiplier outputs and that depends on the selected mode of operation, the computation comprising one of addition, subtraction, and accumulation.

5. The programmable logic device of claim 2 wherein the add-subtract-accumulate circuit is operative to output the multiplier outputs without performing an operation on the multiplier outputs.

6. The programmable logic device of claim 2 wherein the add-subtract circuit is operative to perform a selected computation based on outputs from at least two of the add-subtract-accumulate circuits and that depends on the selected mode of operation, the computation comprising one of addition and subtraction.

7. The programmable logic device of claim 2 wherein the add-subtract circuit is operative to perform two selected computations based on outputs from at least two of the add-subtract-accumulate circuits and that depends on the selected mode of operation, the two selected computations consisting of addition and subtraction.

8. The programmable logic device of claim 2 wherein the add-subtract circuit is operative to output the output from the add-subtract-accumulate circuit without performing an operation on the add-subtract-accumulate circuit output.

9. The programmable logic device of claim 1 wherein the digital signal processing region further comprises input register circuits that feed the plurality of multiplier circuits.

10. The programmable logic device of claim 9 wherein the input register circuits are arranged as a scan chain.

11. The programmable logic device of claim 10 wherein the scan chain is used to perform FIR filtering.

12. The programmable logic device of claim 9 further comprising means for dynamically or statically programming inputs to at least one of the input registers to be logically inverted.

13. The programmable logic device of claim 9 further comprising means for dynamically or statically programming a subset of input bits to at least one of the input registers to be logically inverted, wherein the subset of input bits corresponds to unused bits by the multiplier circuits.

14. The programmable logic device of claim 2 further comprising:
 a pipeline register that is operative to receive an output from the add-subtract-accumulate circuit or the add-subtract circuit, wherein the pipeline register is internal or external to the digital signal processing region.

15. The programmable logic device of claim 2 wherein the add-subtract-accumulate circuit comprises:
 at least one adder circuit; and
 at least one programmable logic connector coupled to the adder circuit, wherein the programmable logic connector is statically or dynamically programmed to configure the adder circuit to perform the selected computation.

16. The programmable logic device of claim 15 wherein the add-subtract-accumulate circuit comprises two adder circuits, wherein the first adder circuit is operative to perform an accumulation operation on lower order input bits of a selected multiplier output, and the second adder circuit is operative to perform the accumulation operation on higher order bits of the selected multiplier output.

17. The programmable logic device of claim 16 wherein the add-subtract-accumulate circuit generates an overflow bit for the accumulation operation.

18. The programmable logic device of claim 16 wherein the add-subtract-accumulate circuit further comprises a zeroing circuit coupled to the first adder circuit and to the second adder circuit for resetting the add-subtract-accumulate circuit when the selected computation is an accumulation operation.

19. The programmable logic device of claim 18 wherein the zeroing circuit consists of an AND gate.

20. The programmable logic device of claim 18 wherein resetting the add-subtract-accumulate circuit using the zeroing circuit consumes one clock cycle of a clock signal that is input to the digital signal processing region.

21. The programmable logic device of claim 16 wherein an output register that receives the output of the add-subtract-accumulate circuit and that generates an output that is coupled to the first adder circuit and the second adder circuit is operative to receive a clear signal for resetting the add-subtract-accumulate circuit when the selected computation is an accumulation operation.

22. The programmable logic device of claim 20 wherein resetting the add-subtract-accumulate circuit using the zeroing circuit consumes two clock cycles of a clock signal that is input to the digital signal processing region.

23. The programmable logic device of claim 2 wherein the add-subtract-accumulate circuit further comprises means for generating a signed or unsigned output.

24. The programmable logic device of claim 2 wherein the add-subtract-accumulate circuit is configurable to sign extend the received multiplier outputs.

25. The programmable logic device of claim 2 wherein at least two outputs from input registers to the digital signal processing circuit are cross connected with at least two inputs to the multiplier circuits, or wherein at least two outputs of the multiplier circuits are cross connected with at least two inputs to the add-subtract-accumulate circuits.

26. The programmable logic device of claim 1 wherein the multiplier circuits are configurable to form any number of (t×n/m)-bit×(t×n/m)-bit individual multipliers depending on the selected mode of operation, wherein an input to the digital signal processing region has n bits and (t×n/m) is an integer.

27. The programmable logic device of claim 2 wherein the digital signal processing region is operative to generate a region output once every clock cycle of a clock signal that is input to the digital processing region.

28. The programmable logic device of claim 1 wherein at least one of the multiplier circuits in the digital signal processing region comprises a plurality of smaller dedicated multiplier circuits that are configured to generate the multiplier output.

29. The programmable logic device of claim 1 wherein register circuits that are used by the digital signal processing circuit are controlled by a plurality of independent sets of clear and clock signals for further control of portions of data that are registered by the register circuits and processed by the digital signal processing circuit.

30. The programmable logic device of claim 1 further comprising means for dynamically or statically programming inputs to at least one of the multiplier circuits to be logically inverted.

31. The programmable logic device of claim 2 wherein the digital signal processing region is configurable to perform 2n-bit×n-bit multiplication that is partly based on the addition performed by the add-subtract-accumulate circuit of two n-bit×n-bit multiplications performed by the multiplier circuits.

32. A programmable logic device comprising: a multiplier circuit operative to multiply two inputs to the multiplier circuit, wherein at least one of the two inputs to the multiplier circuit is statically and dynamically programmable to be signed or unsigned; and
 at least one memory bit coupled to the multiplier circuit for statically controlling at least one of the two inputs to the multiplier circuit to be signed or unsigned.

33. The programmable logic device of claim 32 wherein the at least one memory bit is stored in a memory device implemented on the programmable logic device.

34. A programmable logic device comprising: a multiplier circuit operative to multiply two inputs to the multiplier circuit, wherein at least one of the two inputs to the multiplier circuit is statically and dynamically programmable to be signed or unsigned; and
 at least one dynamic signed/unsigned control input coupled to the multiplier circuit, wherein the at least one dynamic signed/unsigned control input recieves at least one corresponding control input signal for dynamically controlling at least one of the two inputs to the multiplier circuit to signed or unsigned.

35. A programmable logic device of comprising: a multiplier circuit operative to multiply two inputs to the multiplier circuit, wherein at least one of the two inputs to the multiplier circuit is statically and dynamically programmable to be signed or unsigned; and
 at least one dynamic signed/unsigned control input coupled to the multiplier circuit, wherein the at least one register circuit for statically or dynamically controlling at least one of the two inputs to the multiplier circuit to be signed or unsigned.

* * * * *